(12) United States Patent
Nakayoshi et al.

(10) Patent No.: US 7,655,510 B2
(45) Date of Patent: Feb. 2, 2010

(54) MANUFACTURING METHOD OF DISPLAY DEVICE AND EXPOSURE SYSTEM FOR THAT

(75) Inventors: Yoshiaki Nakayoshi, Oamishirasato (JP); Takahiro Miyazaki, Mobara (JP); Jun Ooida, Mobara (JP); Ken Ohara, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 272 days.

(21) Appl. No.: 11/878,397

(22) Filed: Jul. 24, 2007

(65) Prior Publication Data

US 2008/0036987 A1 Feb. 14, 2008

(30) Foreign Application Priority Data

Aug. 10, 2006 (JP) .............................. 2006-218541

(51) Int. Cl.
*H01L 21/00* (2006.01)
*H01L 21/84* (2006.01)

(52) U.S. Cl. ........................... 438/149; 257/59; 257/72; 257/E33.001; 349/129

(58) Field of Classification Search ............. 257/59–72, 257/184, 187, 203, 221, 257, 290, 292, 293, 257/433, 461, 462, 929, E33.001; 438/149, 438/479

See application file for complete search history.

(56) References Cited

U.S. PATENT DOCUMENTS

2006/0220024 A1* 10/2006 Ohara et al. .................. 257/72

* cited by examiner

*Primary Examiner*—A. Sefer
*Assistant Examiner*—Ermias Woldegeorgis
(74) *Attorney, Agent, or Firm*—Stites & Harbison PLLC; Juan Carlos A. Marquez, Esq.

(57) ABSTRACT

A display panel manufacturing method in which forming a thin film on a substrate and etching the thin film are repeated a plurality of times to form on the substrate a plurality of scanning signal lines, a plurality of video signal lines that three-dimensionally intersects the plurality of scanning signal lines with an insulating layer between them, and TFT elements and pixel electrodes each disposed in a pixel area enclosed with two adjacent scanning signal lines and two adjacent video signal lines. The method also includes: exposing a resist film using exposure dimensions numerically expressed based on design patterns prepared in advance; etching the thin film using etching resists formed by developing the exposed resist film so as to form thin-film patterns; and correcting the design patterns according to the complete dimensions of the formed thin-film patterns.

22 Claims, 36 Drawing Sheets

MANUFACTURING METHOD OF DISPLAY DEVICE AND EXPOSURE SYSTEM FOR THAT

CLAIM OF PRIORITY

The present application claims priority from Japanese Application JP 2006-218541 filed on Aug. 10, 2006, the content of which is hereby incorporated by reference into this application.

BACKGROUND OF THE INVENTION (1) Field of the Invention

The present invention related to a display panel manufacturing method and an exposure system employed in the method. More particularly, the present invention is concerned with a technology that will prove effective when adapted to a method of manufacturing a thin-film transistor (TFT substrate to be included in a liquid crystal display panel.

(2) Description of the Related Art

In the past, liquid crystal display devices have been widely used as displays for televisions or personal computers or displays for portable cellular phones or handheld terminals (personal digital assistants).

The liquid crystal display device is a display device including a liquid crystal display panel that has a liquid crystal material sandwiched between a pair of substrates. Formed on one of the pair of substrates (hereinafter, referred to as a TFT substrate) are, for example, multiple scanning signal lines, multiple video signal lines that three-dimensionally intersect the multiple scanning signal lines with an insulating layer between them, and TFT elements and pixel electrodes each of which is disposed in a pixel area enclosed with two adjacent scanning signal lines and two adjacent video signal lines.

Assuming that the liquid crystal display panel adopts, for example, a vertical electric field driving method such as a twisted nematic (TN) method or a vertical alignment (VA) method, opposite electrodes (which may be referred to as common electrodes) opposed to pixel electrodes are formed on one substrate opposed to a TFT substrate. Moreover, when the liquid crystal display panel adopts, for example, a horizontal electric field driving method such as an in-plane switching (IPS) method, the opposite electrodes opposed to the pixel electrodes are formed on the TFT substrate.

For manufacture of the TFT substrate of the liquid crystal display panel, for example, a step of forming a thin film on a glass substrate and a step of etching the thin film are repeated multiple times in order to sequentially form patterns of scanning signal lines and others.

At the step of etching the thin film, first, a photosensitive resist film is formed on the thin film, and exposed to light according to predetermined design patterns. Thereafter, the exposed resist film is developed in order to produce etching masks. The etching masks are used to etch the thin film in order to produce thin-film patterns on which the design patterns are reflected.

In a conventional TFT substrate manufacturing process, when the resist film is exposed to light, a photo mask is generally employed. The photo mask is a mask having exposure patterns, which reflect the design patterns, formed on a glass substrate using a metal film made of, for example, chromium (Cr).

One of important points in manufacturing the liquid crystal display device is to homogenize image quality in a display field on a liquid crystal display panel. Namely, when the image qualities in areas within a display field on a liquid crystal display panel, for example, the image qualities in the center part of the display field and a corner thereof, the image qualities at the left end of the display field and the right end thereof, or the image qualities on the upper end of the display field and the lower end thereof are compared with each other, they have to be visually homogeneous.

However, among the conventional liquid crystal display devices, in large-size liquid crystal display devices, for example, liquid crystal televisions and liquid crystal displays for personal computers, it is hard to homogenize the image quality in the display field of a liquid crystal display panel. This poses a problem in that inhomogeneity in image quality occurs.

One of causes of the inhomogeneity in image quality in the display field of a liquid crystal display panel is a phenomenon referred to as source-drain (SD) thinning. The SD thinning is the phenomenon that the planar width of a source electrode of a TFT element formed by actually etching a conductive film or a drain electrode thereof gets smaller than the one designated in an associated design pattern.

When the width of an actually formed source electrode or drain electrode gets smaller than the one designated in an associated design pattern, for example, the channel width of a TFT element diminishes. A current value to be written in the TFT element gets smaller. This brings about insufficient writing of gray-level data. Consequently, for example, when a pixel at which the width of an actually formed source electrode or drain electrode is nearly identical to the one designated in an associated design pattern adjoins a pixel at which the SD thinning has occurred, inhomogeneity in luminance occurs near the border between the pixels.

Assuming that a source electrode of a TFT element or a drain electrode (video signal line) thereof is formed using an etching resist produced by performing exposure according to a conventional exposure method that employs a photo mask, when the phenomenon referred to the SD thinning occurs, an exposure pattern for a portion that has undergone the SD thinning has to be corrected in order to produce a new photo mask.

However, since the photo mask has to have exposure patterns thereof formed highly precisely, production of the photo mask requires much time and costs a lot. Moreover, the SD thinning does not always occur at the same location, but the location of the SD thinning varies depending on a condition for formation of a source electrode or drain electrode (video signal line). Consequently, the method of correcting any of the exposure patterns of the photo mask for the purpose of preventing the SD thinning is unfeasible.

Moreover, inhomogeneity in image quality occurring in a display field of a liquid crystal display panel is known to relate to a variance of the width of each scanning signal line formed on a TFT substrate or a variance of the width in one area of a scanning signal line, that is, variances of the dimensions of a pattern actually formed in each pixel area on a TFT substrate. Moreover, the variances of the dimensions of a pattern actually formed in each pixel area are known to relate to, for example, a variance in a film thickness in each area on the glass substrate occurring at the time of forming a thin film such as a conductive film or an insulating film on a glass substrate, or a variance in a magnitude of etching in each area on the glass substrate occurring at the time of etching the thin film. The variance in the thickness of the thin film or the variance in the magnitude of etching gets more obvious along with an increase in the size of the glass substrate, an increase in an area over which a film is formed at a time, or an increase in an area to be etched.

When it comes to the conventional exposure method using a photo mask, exposure patterns of multiple scanning signal lines formed in the photo mask reflect respective design patterns, and are produced so that the width of each scanning signal line and the space between two adjoining scanning signal lines will remain constant. Therefore, etching resists are formed so that, for example, even when a variance in the thickness of a thin film has occurred, all the scanning signal lines will have the same width. Consequently, a variance in a magnitude of etching occurs, for example, between a position at which the thickness of the thin film is small and a position at which the thickness thereof is large. This brings about a variance in the width of each scanning signal line. Namely, at the position at which the thickness of the thin film is small, the width of the scanning signal line gets smaller than that at the position at which the thickness of the thin film is large.

However, as mentioned above, formation of a photo mask requires much time and costs a lot. Moreover, a variance in the thickness of a thin film has the tendency that the thin film thickness gets larger near the center of a glass substrate but gets smaller toward the end thereof. The distribution of thicknesses has a variance. Moreover, for manufacture of a TFT substrate, for example, a method that uses a substrate having a large area and being referred to as a mother glass and is called a multi-plane production method is adopted. Therefore, even a TFT substrate has thin-film patterns formed using the same photo mask, the distribution of thicknesses of a thin film varies depending on to which of fields on the mother glass a position on the thin film belongs. Consequently, for example, even the method of correcting an exposure pattern on the photo mask for the purpose of coping with a variance in the thickness of the thin film or a variance in a magnitude of etching is unfeasible.

As mentioned above, as far as the conventional liquid crystal display panel is concerned, a resist film is exposed to light according to a conventional exposure method that uses a photo mask. Therefore, it is hard to control a variance of the width of each scanning signal line or each video signal line or a variance lf a current to be written in a TFT element which is derived from a variance in the thickness of a thin film or a variance in a magnitude of etching. This poses a problem in that it is hard to minimize inhomogeneity in image quality.

SUMMARY OF THE INVENTION

An object of the present invention is to provide a display panel manufacturing method and an exposure system capable of readily minimizing inhomogeneity in image quality occurring in a display field of a liquid crystal display panel.

The above and other objects of the present invention and the novel constituent features thereof will be apparent from the description of the present specification and the appended drawings.

Among the aspects of the invention to be disclosed in the present specification, typical ones will be briefed below.

(1) A display panel manufacturing method in which a step of forming a thin film on a substrate and a step of etching the thin film are repeated multiple times in order to form on the substrate multiple scanning signal lines, multiple video signal lines that three-dimensionally intersect the multiple scanning signal lines with an insulating layer between them, and thin-film transistor (TFT) elements and pixel electrodes each of which is disposed in a pixel area enclosed with two adjacent scanning signal lines and two adjacent video signal lines, includes: a first step of forming a photosensitive resist film on the thin film formed on the substrate; a second step of exposing the resist film according to exposure dimensions numerically expressed based on design patterns prepared in advance; a third step of forming etching resists by developing the resist film exposed at the second step; a fourth step of etching the thin film using the etching resists formed at the third step so as to form thin-film patterns that reflect the respective design patterns; a fifth step of measuring the complete dimensions of the thin-film patterns formed at the fourth step; and a sixth step of correcting the design patterns on the basis of the complete dimensions of the thin-film patterns measured at the fifth step. After the design patterns are corrected at the sixth step, the exposure dimensions numerically expressed based on the corrected design patterns are used to expose the resist film at the second step.

(2) In the display panel manufacturing method set forth in (1), at the second step, the entire area of the resist film is divided into multiple microscopic areas, and the multiple microscopic areas are classified into microscopic areas to be exposed and microscopic areas not to be exposed according to the exposure dimensions. Among the multiple microscopic areas, only the microscopic areas to be exposed are sequentially or comprehensively exposed.

(3) In the display panel manufacturing method set forth in (1) or (2), the exposure dimensions employed at the second step refer to the dimensions and position of one graphic or each of multiple graphics, which specify an area on the resist film to be exposed, on the assumption that the area on the resist film to be exposed is expressed with one graphic or a combination of multiple graphics.

(4) In the display panel manufacturing method set forth in any of (1) to (3), the complete dimensions of thin-film patterns measured at the fifth step refer to the planar complete dimensions of the thin-film patterns formed at multiple measurement points on the substrate. At the sixth step, the planar dimensions designated in a design pattern seen are corrected so that the differences between the planar complete dimensions of a thin-film pattern at each measurement point and the planar design dimensions designated in the design pattern will be smaller than predetermined values.

(5) In the display panel manufacturing method set forth in any of (1) to (3), the complete dimensions of thin-film patterns measured at the fifth step refer to the planar complete dimensions of thin-film patterns formed at a plurality of measurement points on the substrate. At the sixth step, the planar dimensions designated in a design pattern are corrected so that the variances of the planar complete dimensions of a thin-film pattern measured at each measurement point will be smaller than predetermined values.

(6) In the display panel manufacturing method set forth in (4) or (5), the complete dimensions of thin-film patterns measured at the fifth step and the design patterns corrected at the sixth step refer to the planar dimensions of multiple scanning signal lines.

(7) In the display panel manufacturing method set forth in (4) or (5), the complete dimensions of thin-film patterns measured at the fifth step and the dimensions in the design patterns corrected at the sixth step refer to the planar dimensions of multiple video signal lines.

(8) In the display panel manufacturing method set forth in (4) or (5), the complete dimensions of thin-film patterns measured at the fifth step and the dimensions in the design patterns corrected at the sixth step refer to either or both of the channel widths and channels lengths of the TFT elements.

(9) In the display panel manufacturing method set forth in (4) or (5), the complete dimensions of thin-film patterns measured at the fifth step and the dimensions in the design patterns corrected at the sixth step refer to the planar dimensions of the pixel electrodes.

(10) In the display panel manufacturing method set forth in any of (1) to (3), the complete dimensions of thin-film patterns measured at the fifth step refer to the planar dimensions and film thicknesses of the thin-film patterns formed at multiple measurement points on the substrate. At the sixth step, the planar dimensions of a design pattern are corrected so that the difference between an electric characteristic calculated based on the planar complete dimensions and film thickness of a thin-film pattern at each measurement point and an electric characteristic obtained from the design pattern will be smaller than a predetermined value.

(11) In the display panel manufacturing method set forth in any of (1) to (3), the complete dimensions of thin-film patterns measured at the fifth step refer to the planar complete dimensions and film thicknesses of the thin-film patterns formed at multiple measurement points on the substrate. At the sixth step, the planar dimensions designated in a design pattern are corrected so that a variance of an electric characteristic calculated based on the complete dimensions and film thickness of a thin-film pattern at each measurement point will be smaller than a predetermined value.

(12) In the display panel manufacturing method set forth in (10) or (11), the planar complete dimensions and film thicknesses of thin-film patterns measured at the fifth step refer to the planar complete dimensions and film thicknesses of the scanning signal lines. At the sixth step, the widths of scanning signal lines designated in design patterns relevant to measurement points at which the film thicknesses of scanning signal lines are small are increased, and the widths of scanning signal lines designated in design patterns relevant to measurement points at which the film thicknesses of scanning signal lines are large are decreased.

(13) In the display panel manufacturing method set forth in (10) or (11), the planar complete dimensions and film thicknesses of thin-film patterns measured at the fifth step refer to the thicknesses of a gate insulating film in respective TFT elements, and the widths and lengths of channels between the drain electrodes of the TFT elements and the source electrodes thereof. The sixth step includes a step of calculating a current value to be written in a TFT element formed at each measurement point on the basis of the thickness of the gate insulating film in the TFT element and the width and length of the channel in the TFT element, and a step of correcting either or both of the channel width and length of the TFT element designated in the design pattern on the basis of the calculated current value to be written.

(14) In the display panel manufacturing method set forth in (10) or (11), the planar complete dimensions and film thicknesses of thin-film patterns measured at the fifth step refer to the planar complete dimensions and film thicknesses of the scanning signal lines, the planar complete dimensions of the video signal lines seen on the plane, the film thicknesses of the gate insulating film in the respective TFT elements, and the channel widths and channel lengths of the TFT elements. The sixth step includes a step of calculating a wiring delay time occurring at each measurement point on the basis of the planar complete dimensions and film thickness of a scanning signal line, the planar complete dimensions of a video signal line, the thickness of the gate insulating film in a TFT element, and the channel width and channel length of the TFT element, and a step of correcting either or both of the channel width and channel length of the TFT element designated in the design pattern on the basis of the calculated wiring delay time.

(15) In the display panel manufacturing method set forth in (13) or (14), correction of the channel width and channel length of a TFT element designated in the design pattern is achieved by correcting the dimensions of the drain electrode of the TFT element and the dimensions of the source electrodes thereof.

(16) In the display panel manufacturing method set forth in (10) or (11), the planar complete dimensions and film thicknesses of thin-film patterns measured at the fifth step refer to the dimensions of areas in each of which a scanning signal line or a sustaining capacitance line juxtaposed to the scanning signal line and a pixel electrode overlap on a planar basis, and the thicknesses of the insulating layer each of which is measured between the scanning signal line or sustaining capacitance line and the pixel electrode. The sixth step includes a step of calculating a sustaining capacitance exhibited in each area, in which the scanning signal line or sustaining capacitance line and the pixel electrode overlap on the planar basis, on the basis of the dimensions of the area in which the scanning signal line or the sustaining capacitance line juxtaposed to the scanning signal line and the pixel electrode overlap on the planar basis, and the thickness of the insulating layer measured between the scanning signal line or sustaining capacitance line and the pixel electrode, and a step of correcting the dimensions of the area, in which the scanning signal line or sustaining capacitance line and the pixel electrode overlap on the planar basis, designated in the design pattern on the basis of the calculated sustaining capacitance.

(17) In the display panel manufacturing method set forth in any of (1) to (16), the display panel is a liquid crystal display panel having a liquid crystal material sandwiched between a pair of substrates. The scanning signal lines, video signal lines, TFT elements, and pixel electrodes are formed on one of the pair of substrates by layering the thin-film patterns.

(18) An exposure system for exposing a photosensitive resist film formed on a thin film during in the process of manufacturing a display panel, in which a step of forming a thin film on a substrate and a step of etching the thin film are repeated multiple times in order to form on the substrate multiple scanning signal lines, multiple video signal lines that three-dimensionally intersect the multiple scanning signal lines with an insulating layer between them, and TFT elements and pixel electrodes each of which is disposed in a pixel area enclosed with two adjacent scanning signal lines and two adjacent video signal lines, includes an exposure apparatus that exposes the photosensitive resist film using exposure dimensions that are numerically expressed based on design patterns prepared in advance, a complete dimensions measurement apparatus that measures the complete dimensions of thin-film patterns formed on the substrate, and a design pattern correction apparatus that corrects the numerical values designated in the design patterns, which are used by the exposure apparatus, on the basis of the results of the measurement performed by the complete dimensions measurement apparatus, and transmits the corrected design patterns to the exposure apparatus.

(19) In the exposure system set forth in (18), the exposure apparatus includes a design pattern acquiring means for acquiring the design patterns from an external apparatus or an external recording medium, an exposure dimensions creating means for creating the exposure dimensions using the acquired design patterns, an exposure dimensions holding means for holding the created exposure dimensions, an exposure control means for dividing the entire area on the resist film into multiple microscopic areas, and classifying the multiple microscopic areas into microscopic areas to be exposed and microscopic areas not to be exposed on the basis of the exposure dimensions, and an exposure head that sequentially or comprehensively expose the microscopic areas to be exposed among the multiple microscopic areas.

(20) In the exposure system set forth in (18) or (19), the complete dimensions measurement apparatus is an apparatus that measures the planar complete dimensions of the thin-film patterns formed at multiple measurement points on the substrate.

(21) In the exposure system set forth in (18) or (19), the complete dimensions measurement apparatus includes a means for measuring the planar complete dimension of the thin-film patterns formed at multiple measurement points on the substrate, and a means for measuring the thicknesses of the thin-film patterns at the multiple measurement points on the substrate.

(22) In the exposure system set forth in (18) or (19), the complete dimensions measurement apparatus is integrated into the design pattern correction apparatus.

(23) In the exposure system set forth in any of (18) or (21), the exposure apparatus, complete dimensions measurement apparatus, and design pattern correction apparatus are interconnected over a network.

(24) The exposure system set forth in any of (18) or (21) includes, in addition to the exposure apparatus, complete dimensions measurement apparatus, and design pattern correction apparatus, the design pattern holding apparatus that holds the design patterns prepared in advance. The exposure apparatus, measurement apparatus, design pattern correction apparatus, and design pattern holding apparatus are interconnected over a network.

A display panel manufacturing method in accordance with the present invention is implemented on the assumption that: a step of forming a thin film on a substrate and a step of etching the thin film are repeated multiple times in order to form on the substrate multiple scanning signal lines, multiple video signal lines that three-dimensionally intersect the multiple scanning signal lines with an insulating layer between them, and TFT elements and pixel electrodes each of which is disposed in a pixel area enclosed with two adjacent scanning signal lines and two adjacent video signal lines.

In the display panel manufacturing method of the present invention, the step of etching the thin film includes a first step of forming a photosensitive resist film on the thin film formed on the substrate, a second step of exposing the resist film using exposure dimensions numerically expressed based on the design patterns prepared in advance, a third step of developing the resist film exposed at the second step so as to form etching resists, and a fourth step of etching the thin film using the etching resists formed at the third step so as to form thin-film patterns that reflect the respective design patterns.

Moreover, the display panel manufacturing method of the present invention includes, in addition to the first to fourth steps, a fifth step of measuring the complete dimension of the thin-film patterns formed at the fourth step, and a sixth step of correcting the design patterns on the basis of the complete dimensions of the thin-film patterns measured at the fifth step. When the design patterns are corrected at the sixth step, the resist film is exposed using the exposure dimensions, which are numerically expressed based on the corrected design patterns, at the second step.

In other words, in the display panel manufacturing method of the present invention, when the resist film is exposed, the exposure is performed based on the numerically expressed exposure dimensions. Therefore, when the exposure dimensions are modified, exposure areas (exposure patterns) on the resist film can be easily modified. Consequently, when the dimensions of thin-film patterns having the same capability and being formed at multiple positions on the substrate have variances due to a variance in a magnitude of etching occurring at the time of etching the thin film, the exposure dimensions of a thin-film pattern whose dimensions have large variances can be easily modified. Consequently, the variances of the dimensions of a thin-film pattern can be readily minimized. Eventually, a variance of an electric characteristic exhibited at each pixel in a display field which is derived from the variances of the dimensions of the thin-film pattern can be minimized. Inhomogeneity in image quality in the display field of a liquid crystal display panel can be readily minimized.

Moreover, in the display panel manufacturing method of the present invention, at the second step, an exposure apparatus called direct-drawing exposure equipment is used to divide the entire area on the resist film into multiple microscopic areas. The multiple microscopic areas are classified into microscopic areas to be exposed and microscopic areas not to be exposed on the basis of the exposure dimensions. Among the multiple microscopic areas, the microscopic areas to be exposed are sequentially or comprehensively exposed. At this time, the exposure dimensions refer to the dimensions and position of one graphic or each of multiple graphics, which specify an area on the resist film to be exposed, on the assumption that the area on the resist film to be exposed is expressed with one graphic or a combination of multiple graphics.

Moreover, in the display panel manufacturing method of the present invention, the complete dimension of thin-film patterns measured at the fifth step may be, for example, only the planar complete dimensions of the thin-film patterns or may refer to the planar complete dimensions and film thicknesses of the thin-film patterns. Incidentally, when the planar complete dimensions and film thicknesses of the thin-film patterns are measured, for example, only the planar complete dimensions of thin-film patterns, which share a certain capability, may be measured. As for thin-film patterns that share another capability, the complete dimensions and film thicknesses thereof or only the film thicknesses thereof may be measured.

Assuming that the complete dimensions of thin-film patterns measured at the fifth step are the planar completed dimensions of the thin-film patterns, at the sixth step, the complete dimensions of thin-film patterns measured as multiple measurement points are compared with the planar dimensions of thin-film patterns designated in the design patterns. The planar dimensions designated in a design pattern are corrected so that the differences between the complete dimensions of a thin-film pattern formed at each measurement point and the planar design dimensions designated in the design pattern will be smaller than predetermined values. Consequently, the dimensions of the thin-film patterns formed at numerous points on the substrate while sharing the same capability will be nearly identical to the dimensions designated in the design patterns.

Moreover, normally, the image quality in a display field on a display panel should be visually homogeneous. For example, the dimensions of a TFT element at each pixel need not be identical to the dimensions designated in the design pattern. Therefore, at the sixth step, for example, the planar dimensions designated in the design pattern may be corrected so that the variances of the complete dimensions of a thin-film pattern formed at each measurement point will be smaller than predetermined values.

When a design pattern is corrected in order to minimize the variances of the planar dimensions of a thin-film pattern, for example, the variances of the planar complete dimensions of a scanning signal line from those of the other scanning signal lines or the variances of the planar complete dimensions of a video signal line from those of the other video signal lines can be minimized. Moreover, the variance of the channel width or channel length of a TFT element disposed in each pixel area or the variances of the dimensions of each pixel electrode can be minimized.

Incidentally, at the step of forming a thin film on the substrate, for example, the sputtering method of chemical vapor deposition (CVD) method is often used to form the thin film on the substrate. At this time, when the thicknesses of the thin film at multiple measurement points on the substrate are measured, the film thicknesses have variances. Therefore, when the variances of the planar complete dimensions of a thin-film pattern at each measurement point are simply minimized, the electric characteristic exhibited at the measurement point undergoes a variance due to the effect of the variance of the film thickness at the measurement point. This may bring about inhomogeneity in image quality. On a substrate having a large area and being adapted to a large-screen display panel of a display for televisions or personal computers, the variance in the thickness of a formed thin film increases. The variance of an electric characteristic derived from the variance in the film thickness is likely to increase. Therefore, when thin-film patterns of scanning signal lines on a substrate having a large area are measured, the planar complete dimensions of the thin-film patterns and the film thicknesses thereof should preferably be measured at the fifth step. In this case, at the sixth step, the planar dimensions designated in a design pattern are corrected so that the difference between an electric characteristic calculated based on the planar complete dimensions and film thickness measured at each measurement point and an electric characteristic obtained from the design pattern will be smaller than a predetermined value.

Moreover, normally, the image quality in a display field on a display panel should be visually homogeneous. For example, an electric characteristic of a TFT element at each pixel need not be identical to a characteristic obtained from the design pattern. Therefore, at the sixth step, the planar dimensions designated in the design pattern may be corrected so that the variance of an electric characteristic calculated based on the planar complete dimensions and film thickness of a thin-film pattern formed at each measurement point will be smaller than a predetermined value.

When the film thickness of a thin-film pattern is also measured, a channel width and a channel length can be estimated based on the planar complete dimensions of a drain electrode and a source electrode of a TFT element, and a current value to be written in the TFT element formed at each measurement point can be calculated based on the film thickness of a gate insulating film. Therefore, for example, when a design pattern is corrected so that the channel width of a TFT element in which the gate insulating film is thick will be increased but the channel width of a TFT element in which the gate insulating film is thin will be decreased, a variance of the current to be written in the TFT element at each measurement point can be minimized.

In case the film thickness of a thin-film pattern is also measured, when the channel width and channel length of a TFT element, the film thickness of the gate insulating film, the planar dimensions and film thickness of a scanning signal line, and the planar dimensions of a video signal line are measured, a wiring delay time of the scanning signal line at each measurement point can be calculated or estimated. Consequently, for example, when a design pattern is corrected so that the channel width of a TFT element at a measurement point at which the wiring delay time is long will be increased but the channel width of a TFT element at a measurement point at which the wiring delay time is short will be decreased, a variance of a writing time for the TFT element at each measurement point can be minimized.

Further, when the film thickness of a thin-film pattern is also measured, for example, a sustaining capacitance exhibited in a pixel area at each measurement point can be calculated or estimated based on the dimensions of an area in which a scanning signal line and a pixel electrode overlap on a planar basis, and the film thickness of an insulating film in the area. Consequently, a design pattern is corrected so that the dimensions of an area in which a pixel electrode at a measurement point at which the insulating film is thin overlaps a scanning signal line on a planar basis will be decreased but the dimensions of an area in which a pixel electrode at a measurement point at which the insulating film is thick overlaps a scanning signal line on a planar basis will be increased. Eventually, a variance of a sustaining capacitance exhibited at each measurement point can be minimized.

Depending on the structure of a substrate, for example, when a scanning signal line is formed, a sustaining capacitance line to be juxtaposed to the scanning signal line is also formed so that a sustaining capacitance will be exhibited in an area in which the sustaining capacitance line and a pixel electrode overlap on a planar basis. In this case, the sustaining capacitance in the pixel area at each measurement point is calculated or estimated based on the dimensions of the area in which the sustaining capacitance line and pixel electrode overlap on the planar basis and the film thickness of the insulating film in the area. Even in this case, for example, a design pattern is corrected so that the dimensions of an area where a pixel electrode at a measurement point at which the insulating film is thin overlaps a sustaining capacitance line on the planar basis will be decreased but the dimensions of an area where a pixel electrode at a measurement point at which the insulating film is thick will be increased. Thus, a variance of the sustaining capacitance at each measurement point can be minimized. Moreover, when the sustaining capacitance line is formed, the dimensions of the sustaining capacitance line may be corrected instead of correcting the dimensions of the pixel electrode.

Moreover, a display panel manufacturing method in accordance with the present invention relates to a method of forming scanning signal lines, video signal lines, TFT elements, and pixel electrodes on one substrate. Therefore, the display panel manufacturing method in accordance with the present invention can be adopted as a method of manufacturing any type of display panel as long as the display panel includes a substrate formed as described previously. For example, the display panel manufacturing method in accordance with the present invention can be adapted to a liquid crystal display panel having a liquid crystal material sandwiched between a pair of substrates or a self-luminous display panel employing organic electroluminescence in a pixel electrode.

Moreover, an exposure system that exposes a photosensitive resist film and is used in the process of manufacturing a substrate to be included in a liquid crystal display panel or the like according to a display panel manufacturing method of the present invention should be designed to include an exposure apparatus that exposes the photosensitive resist film using exposure dimensions numerically expressed based on design patterns prepared in advance, a complete dimensions measurement apparatus that measures the complete dimensions of each of thin-film patterns formed on the substrate, and a design pattern correction apparatus that corrects numerical values designated in each of the design patterns, which are used by the exposure apparatus, on the basis of the results of the measurement performed by the complete dimensions measurement apparatus, and transmits the corrected design pattern to the exposure apparatus.

The exposure apparatus may be designed to include, for example, a design pattern acquiring means for acquiring design patterns from an external apparatus or an external recording medium, an exposure dimensions creating means for creating exposure dimensions using the acquired design patterns, an exposure dimensions holding means for holding the created exposure dimensions, an exposure control means for dividing the entire area on a resist film into multiple microscopic areas, classifying the multiple microscopic areas into microscopic areas to be exposed and microscopic areas not to be exposed on the basis of the exposure dimensions, and an exposure head that sequentially or comprehensively exposes the microscopic areas to be exposed among the multiple microscopic areas.

Moreover, the complete dimensions measurement apparatus may be an apparatus that measures the planar complete dimensions of thin-film patterns formed at multiple measurement points on the substrate, or an apparatus including a means for measuring the planar complete dimensions of the thin-film patterns at the multiple measurement points on the substrate, and a means for measuring the film thicknesses of the thin-film patterns at the multiple measurement points on the substrate.

Moreover, the apparatuses included in the exposure system may be stand-alone apparatuses or may be provided as equipment into which pieces of means responsible for actions or pieces of processing assigned to several apparatuses are integrated. Namely, the exposure system has, for example, the complete dimensions measurement apparatus and design pattern correction apparatus integrated into one apparatus that includes a means for measuring complete dimensions and a means for correcting a design pattern.

Moreover, the apparatuses included in the exposure system may not only be allocated to respective production lines but also be interconnected over a network. In this case, for example, one design pattern correction apparatus can be shared by multiple production lines.

Moreover, the design patterns to be acquired by the exposure apparatus may be recorded in a recording medium such as a CD-ROM and then provided. Alternatively, the design pattern holding apparatus that holds the design patterns may be disposed on a network, and may be connected to the exposure apparatus over the network.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE PREFERRED EMBODIMENTS

Figure 1:
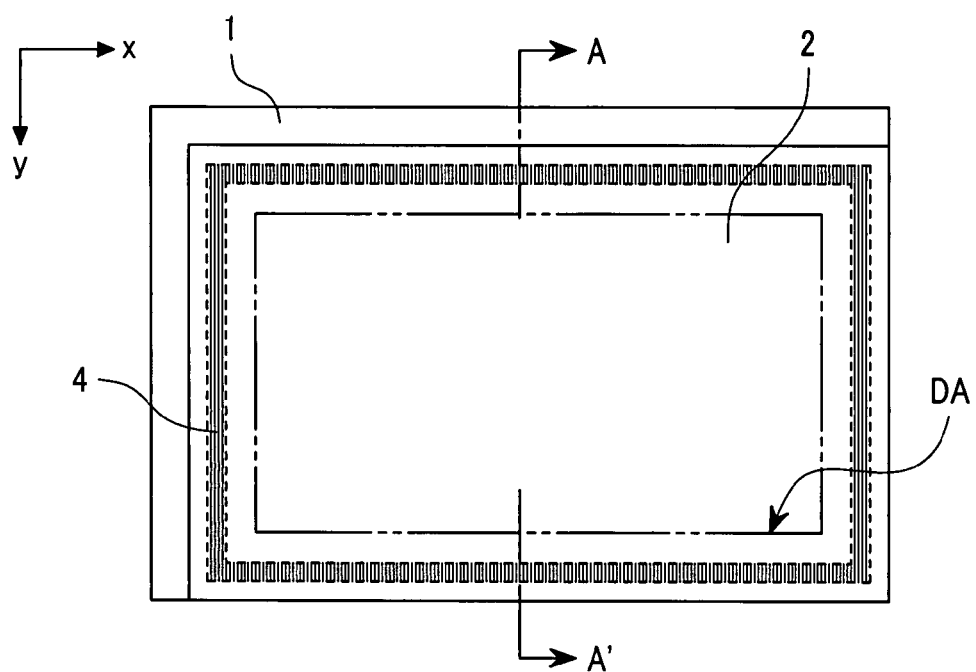
FIG. 1 is an illustrative front view showing the outline structure of a liquid crystal display panel.

Referring to the drawings, the present invention will be described by taking embodiments for instance.

Incidentally, in all the drawings for use in explaining the embodiments, the same reference numerals are assigned to components having the same capabilities. An iterative description will be omitted.

In a display panel manufacturing method of the present invention, for example, when a thin film such as a conductive film formed on a substrate is etched, a photosensitive resist film is exposed using numerically expressed exposure dimensions in order to form etching resists. The complete dimensions of a thin-film pattern actually formed by etching the resist film are measured and compared with dimensions designated in a design pattern and used to determine the exposure dimensions. When the differences between the complete dimensions of the thin-film pattern and the dimensions designated in the design pattern exceed a permissible range, the dimensions in the design pattern are corrected based on the differences between the dimensions.

FIG. 1 to FIG. 6 are illustrative diagrams showing the outline structure of a display panel manufactured according to the present invention.

Figure 2:
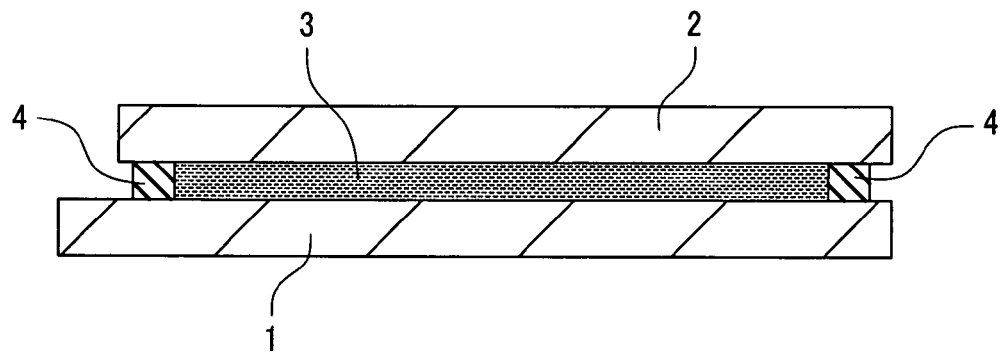
FIG. 2 is an illustrative sectional view of a plane indicated with an A-A' cutting-plane line in FIG. 1.
Figure 3:
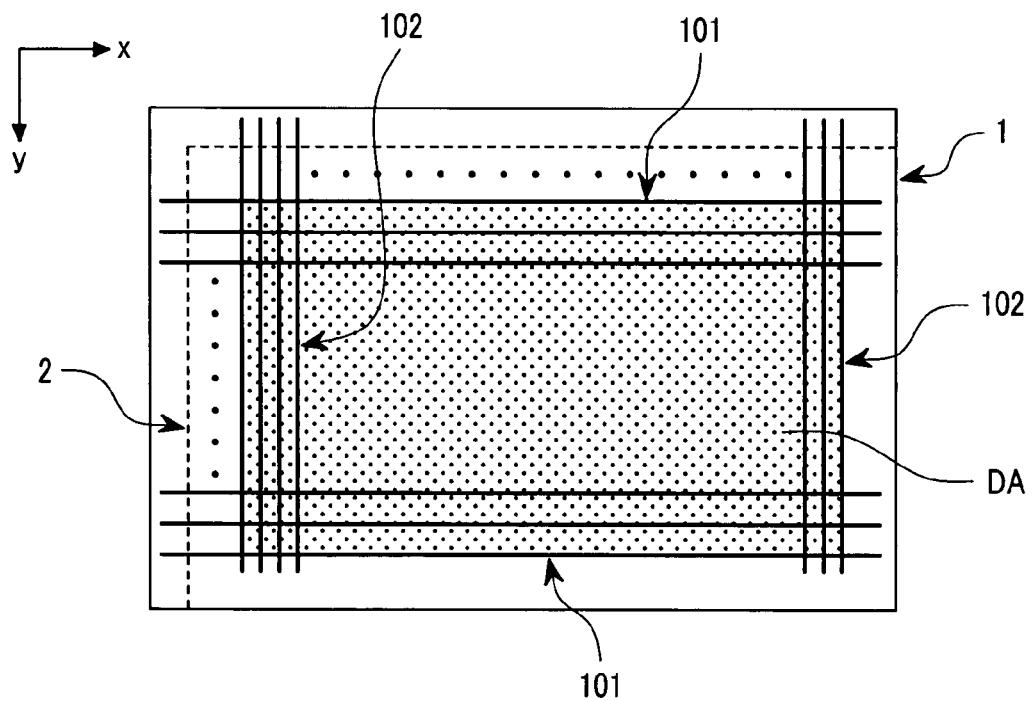
FIG. 3 is an illustrative front view showing the outline structure of a TFT substrate employed in the liquid crystal display panel.
Figure 4:
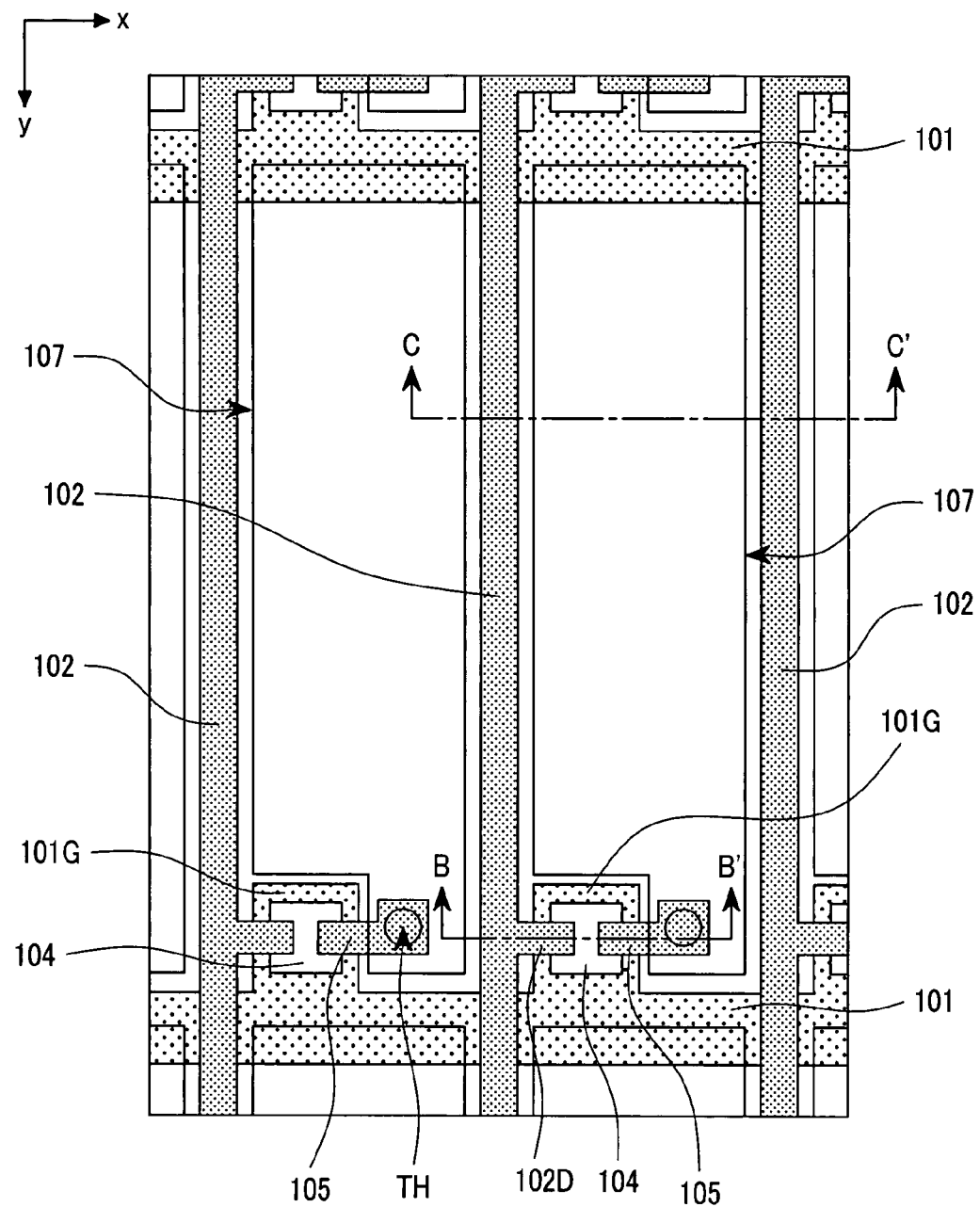
FIG. 4 is an illustrative front view showing an example of the structure of a pixel in the TFT substrate.
Figure 5:
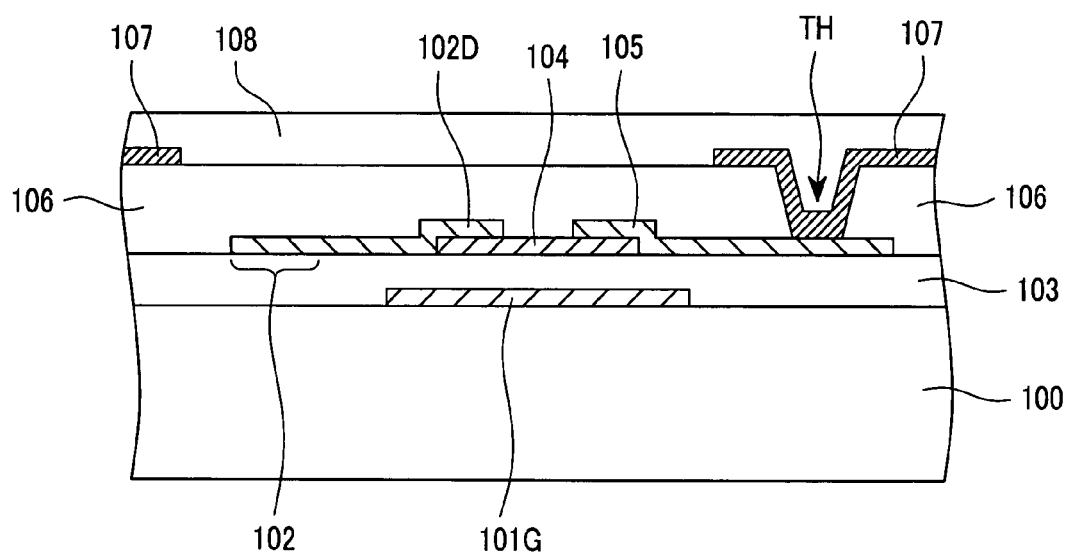
FIG. 5 is an illustrative sectional view of a plane indicated with a B-B' cutting-plane line in FIG. 4.
Figure 6:
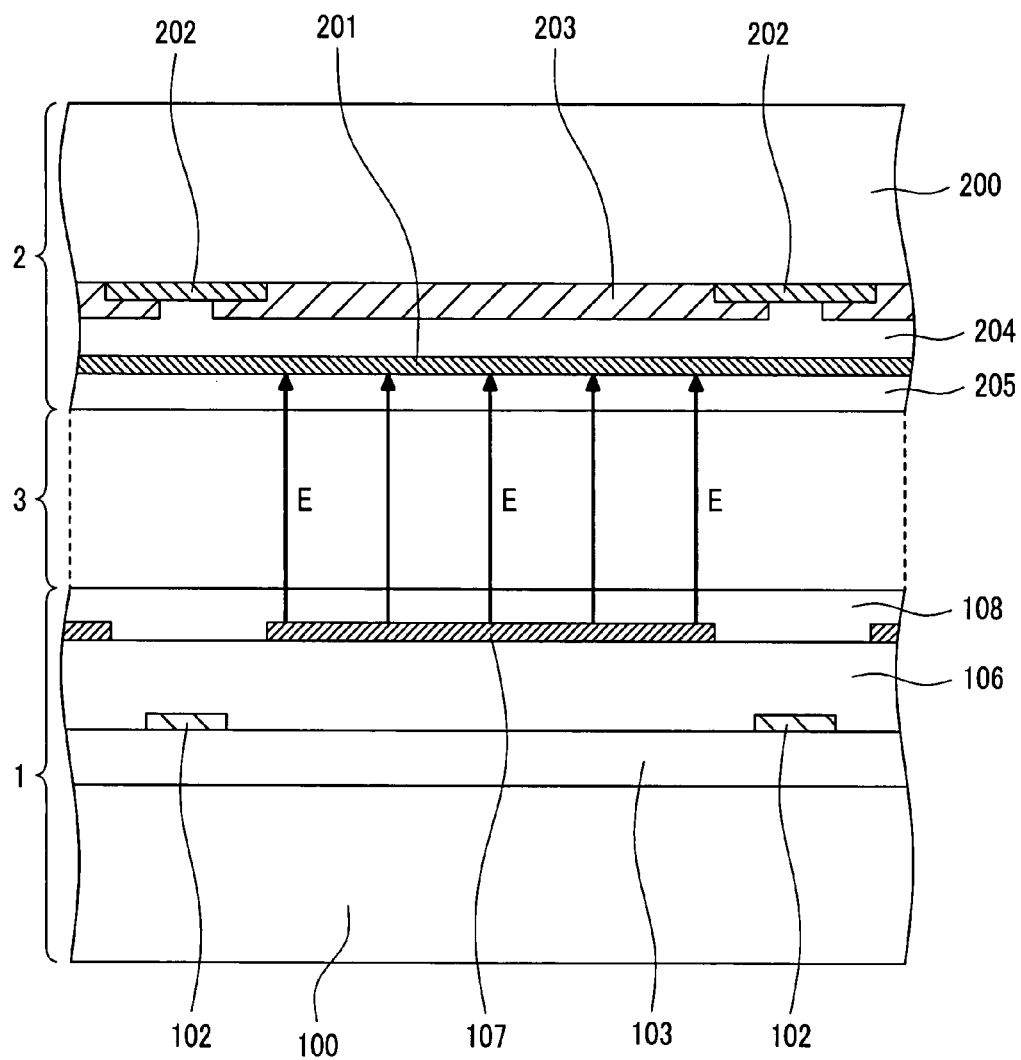
FIG. 6 is an illustrative sectional view of a plane indicated with a C-C' cutting-plane line in FIG. 4.

FIG. 1 is an illustrative front view showing the outline structure of a liquid crystal display panel. FIG. 2 is an illustrative sectional view of a plane indicated with an A-A' cutting-plane line shown in FIG. 1. FIG. 3 is an illustrative front view showing the outline structure of a TFT substrate employed in the liquid crystal display panel. FIG. 4 is an illustrative front view showing an example of the structure of a pixel in the TFT substrate. FIG. 5 is an illustrative sectional view of a plane indicated with a B-B' cutting-plane line shown in FIG. 4. FIG. 6 is an illustrative sectional view of a plane indicated with a C-C' cutting-plane line shown in FIG. 4. FIG. 6 also shows the sectional structure of an opposite substrate opposed to the TFT substrate.

Preferably, a display panel manufacturing method in accordance with the present invention is adopted as a method of manufacturing a liquid crystal display panel, or more particularly, as a method of manufacturing a TFT substrate employed in a liquid crystal display panel.

The liquid crystal display panel is, for example, as shown in FIG. 1 and FIG. 2, a display panel having a liquid crystal material 3 (may be referred to as a liquid crystal layer) sandwiched between a pair of substrates, that is, a TFT substrate 1 and an opposite substrate 2. At this time, the TFT substrate 1 and opposite substrate 2 are attached to each other using a sealing material 4 annularly applied to the outside of a display field DA. The liquid crystal material 3 is poured into a space enclosed with the TFT substrate 1, opposite substrate 2, and sealing material 4.

Moreover, the planar dimensions of the TFT substrate 1 are larger than those of the opposite substrate 2, and the TFT substrate 1 includes, as shown in FIG. 3, multiple scanning signal lines 101 extended in an x direction, and multiple video signal lines 102 extended in a y direction. At this time, the scanning signal lines 101 and video signal lines 102 three-dimensionally intersect with an insulating layer between them. Moreover, an area in the TFT substrate 1 enclosed with two outermost scanning signal lines out of the multiple scanning signal lines 101 and two outermost video signal lines out of the multiple video signal lines 102 is equivalent to the display field DA.

Moreover, an area in the TFT substrate 1 enclosed with two adjacent scanning signal lines 101 and two adjacent video signal lines 102 is equivalent to a pixel area. A TFT element and a pixel electrode are disposed in each pixel area. At this time, the TFT element and pixel electrode may be disposed in each pixel area in various manners. FIG. 4 to FIG. 6 show an example of the dispositions of the TFT element and pixel electrode.

The TFT substrate 1 has, for example, as shown in FIG. 4 to FIG. 6, the multiple scanning signal lines 101 formed on the surface of a glass substrate 100. The scanning signal line 101 has the capability of a gate of a TFT element, and has a gate electrode portion 101G located at a position at which each TFT element is disposed.

Moreover, a first insulating layer 103 is formed on the scanning signal lines 101 and gate electrode portions 101G. Semiconductor beds 104 are formed on the gate electrode portions 101G with the first insulating layer 103 between them.

On the first insulating layer 103, the video signal lines 102 and source electrodes 105 are formed in addition to the semiconductor beds 104. The video signal line 102 has the capability of a drain of a TFT element and has a drain electrode portion 102D located at a position at which each TFT element is disposed. At this time, the distal end of the drain electrode portion 102D is located on the semiconductor bed 104. The source electrode 105 has the capability of a source of a TFT element, and part of the source electrode 105 is located on the semiconductor bed 104.

On the video signal lines 102 and source electrodes 105, pixel electrodes 107 are formed with a second insulating layer 106 between them. The pixel electrode 107 is formed in each pixel area, and electrically connected to the source electrode 105 owing to a through hole TH. Moreover, the pixel electrode 107 overlaps the scanning signal line 101 on a planar basis. The scanning signal line 101, pixel electrode 107, and insulating layers 103 and 106 existing in the area, in which the scanning signal line and pixel electrode overlap, constitute a sustaining capacitor. Incidentally, the scanning signal line 101 which the pixel electrode 107 overlaps on the planar basis is the scanning signal line whose gate electrode portion serving as a gate of a TFT element is connected to a TFT element disposed in a vertically adjacent pixel area.

Moreover, an alignment layer 108 is formed on the pixel electrodes 107.

The TFT substrate 1 shown in FIG. 4 to FIG. 6 is a TFT substrate to be employed in a liquid crystal display panel adopting a vertical electric field driving method such as a twisted nematic (TN) method or a vertical alignment (VA) method. Consequently, when the TFT substrate 1 shown in FIG. 4 to FIG. 6 is used to produce a liquid crystal display panel, the TFT substrate 1 is combined with the opposite substrate 2 with the liquid crystal material 3 between them. The opposite substrate 2 has opposite electrodes (may be referred to as common electrodes) 201, which are opposed to the pixel electrodes 107, formed on a surface of a glass substrate 200 opposed to the TFT substrate 1.

Moreover, when the liquid crystal display panel supports color display, the opposite substrate 2 has a black matrix 202, which separates the pixel areas from one another, and a color filter 203 formed on the surface of the glass substrate 200 thereof opposed to the TFT substrate 1. The opposite electrodes 201 are formed on the color filter 203 with an overcoat layer 204 between them. An alignment layer 205 is formed on the opposite electrodes 201.

In the liquid crystal panel having the foregoing structure, an electric field E induced by a potential difference between the pixel electrode 107 and opposite electrode 201 is perpendicular to the surface of the TFT substrate 1 in which the pixel electrodes 107 are formed. By varying the strength of the electric field E, orientation of liquid crystalline molecules (not shown) of the liquid crystal material 3 is controlled in order to control a gray level (luminance).

Now, a display panel manufacturing method in accordance with the present invention will be described below by taking for instance the TFT substrate 1 in which each pixel area has the structure shown in FIG. 4 to FIG. 6.

EMBODIMENT 1

Figure 7:
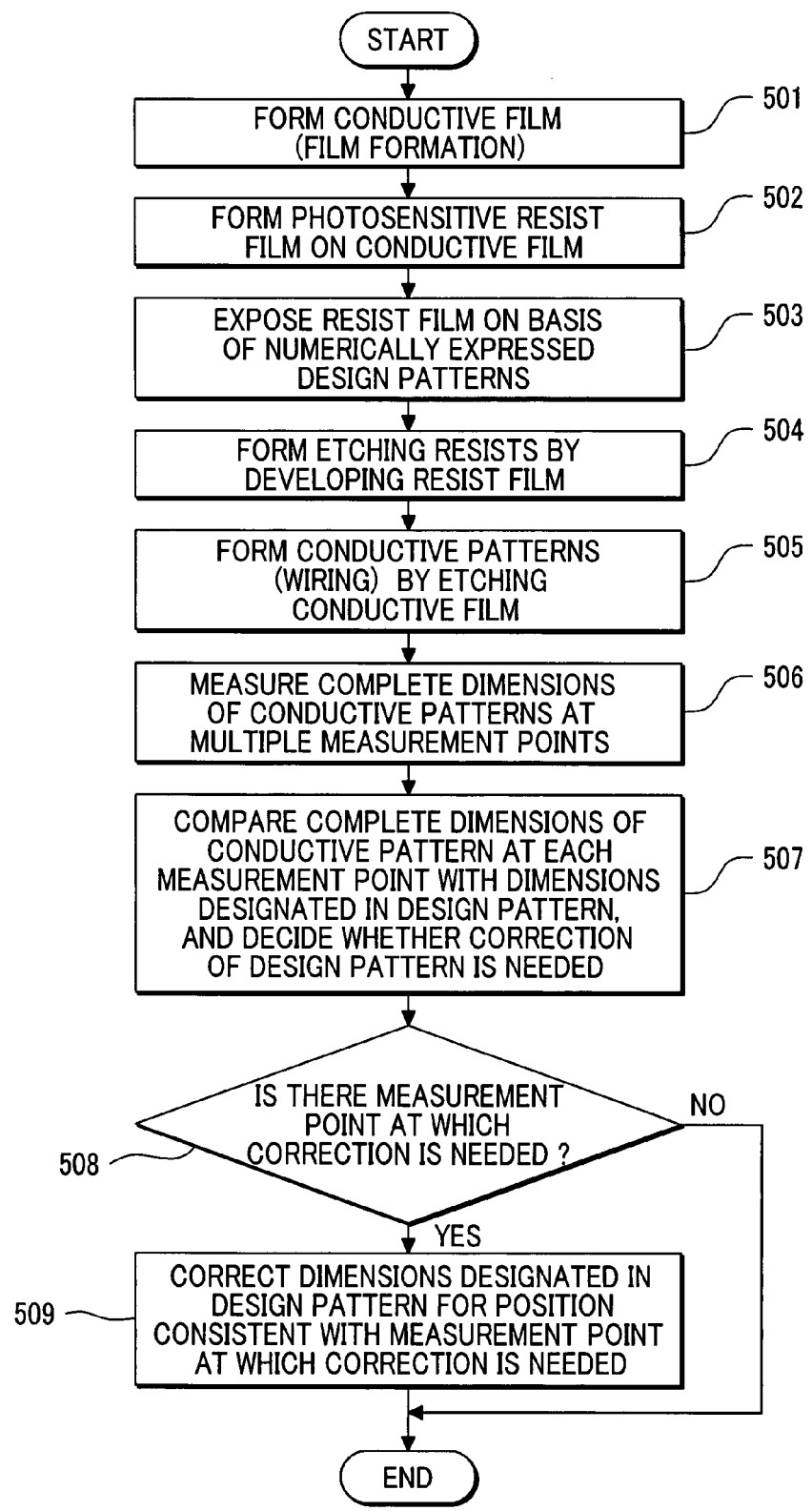
FIG. 7 is a flowchart for use in explaining the outline of a TFT substrate manufacturing method in accordance with an embodiment 1 of the present invention.

FIG. 7 is a flowchart for use in explaining the outline of a TFT substrate manufacturing method in accordance with an embodiment 1 of the present invention.

The method of manufacturing the TFT substrate 1 according to the embodiment 1 is, broadly speaking, such that a step of forming a thin film on the glass substrate 100 and a step of forming thin-film patterns by etching the formed thin film are repeated in order to accumulate layers including a layer of the scanning signal lines 101.

In the embodiment 1, a step of forming conductive patterns that are the scanning signal lines 101 or the like is achieved by following, for example, steps 501 to 509 described in FIG. 7.

At the step of forming conductive patterns on the glass substrate 100, first, a conductive film to be used to form the conductive patterns is formed on the glass substrate 100 (step 501). At step 501, for example, a sputtering method is used to form the conductive film all over the surface of the glass substrate 100 on which the conductive patterns are formed.

Thereafter, a photosensitive resist film is formed on the conductive film formed at step 501 (step 502). At step 502, the resist film formed in the state of film is pasted to the conductive film.

Thereafter, the resist film formed at step 502 is exposed based on numerically expressed design patterns (step 503). At step 503, an exposure apparatus called direct-drawing exposure equipment whose configuration will be described later is used.

Thereafter, the exposed resist film is developed in order to form etching resists (step 504). At step 504, for example, an alkaline developer is used to remove only exposed areas on the resist film or only unexposed areas thereon.

Thereafter, the etching resists formed at step 504 are used as a mask to etch the conductive film formed at step 501. Thus, conductive patterns that are the scanning signal lines 101 or the like are formed (step 505).

Thereafter, the complete dimensions of conductive patterns formed at step 505 are measured (step 506). At step 506, the surface of the substrate on which the conductive patterns and others are formed is divided into multiple subfields. A typical point in each subfield, for example, a center point is regarded as a measurement point, and the dimensions of the conductive pattern located at each measurement point are measured. In the case of the manufacturing method of the embodiment 1, the planar completion dimensions of the conductive pattern are measured at step 506.

Thereafter, the complete dimensions of a conductive pattern measured at step 506 are compared with dimensions designated in the design pattern in order to decide whether correction of the design pattern is needed (step 507). Based on a decision made at step 507, whether correction of a design pattern is needed at any measurement point is decided (step 508). If correction is needed at any measurement point, dimensions (numerical values) designated in the design pattern relevant to a position consistent with the measurement point at which correction is needed are corrected (step 509).

If the dimensions designated in design patterns are corrected at step 509, the resist film is exposed based on the corrected design patterns at step 503.

As mentioned above, in the method of manufacturing the TFT substrate 1 according to the embodiment 1, the etching resists formed by exposing the resist film according to the numerically expressed design patterns are used to etch the conductive film. Thus, the conductive patterns are formed. For example, if the differences between the complete dimensions of a formed conductive pattern and the dimensions designated in the design pattern are large at any measurement point, the dimensions (numerical values) in design patterns relevant to points in the vicinity of the measurement point are corrected. At step 503 of exposing the resist film formed on the conductive film, the exposure is performed based on the dimensions designated in the corrected design patterns. In other words, the method of manufacturing the TFT substrate 1 according to the embodiment 1 can swiftly and readily cope with the variances of the complete dimensions of a conductive pattern derived from a variance in a magnitude of etching by which the conductive film is etched. Consequently, inhomogeneity in image quality in a display field on a liquid crystal display panel can be readily minimized.

Figure 8:
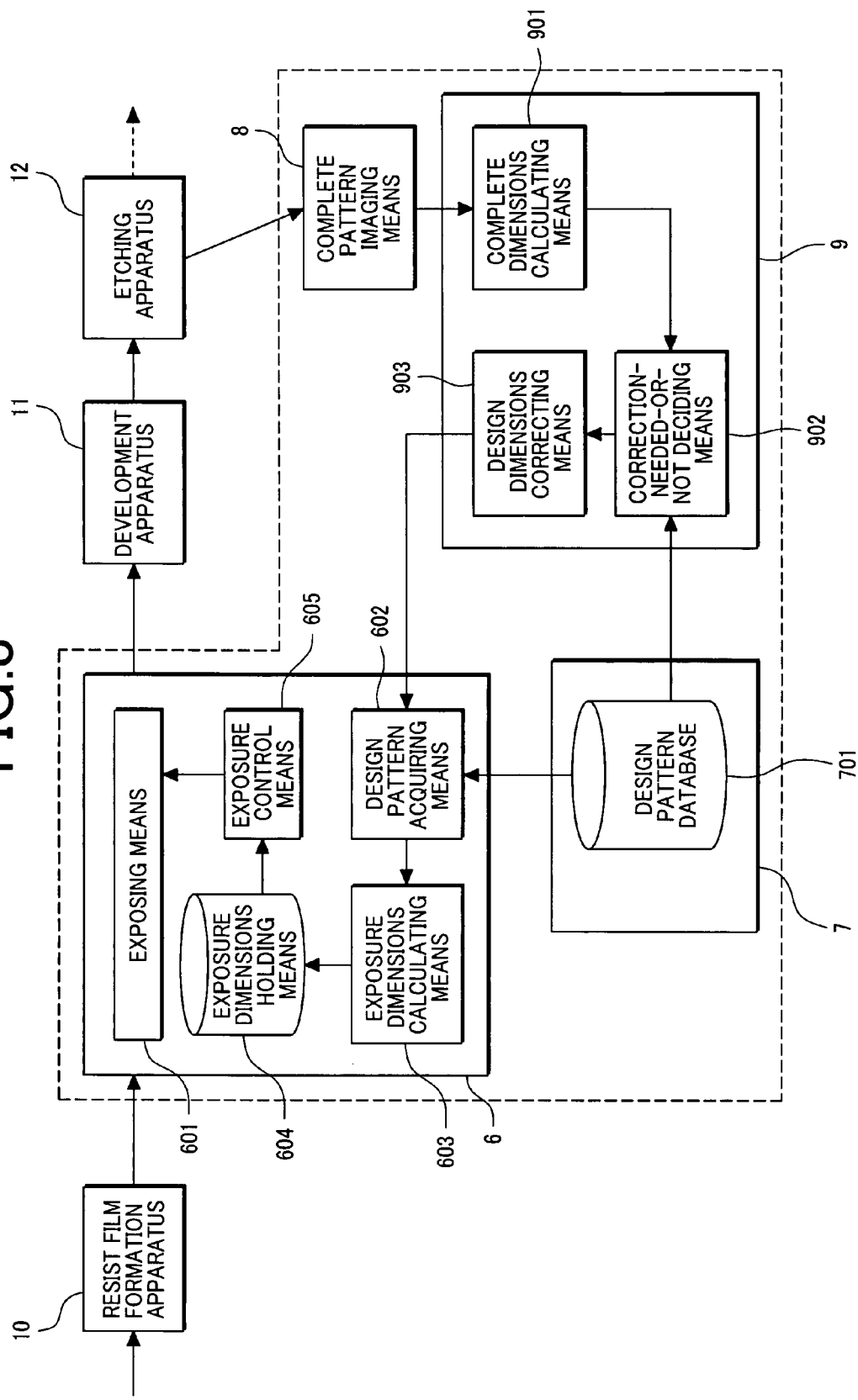
FIG. 8 is an illustrative block diagram showing an example of the configuration of an exposure system employed in the TFT substrate manufacturing method in accordance with the embodiment 1.

FIG. 8 is an illustrative block diagram showing an example of the configuration of an exposure system employed in the TFT substrate manufacturing method of the embodiment 1.

In the method of manufacturing the TFT substrate 1 according to the embodiment 1, when the photosensitive resist film formed on the thin film such as the conductive film is exposed, the exposure is performed based on the numerically expressed design patterns. Specifically, the entire area on the resist film is divided into multiple microscopic areas, and the microscopic areas are classified into microscopic areas to be exposed and microscopic areas not to be exposed on the basis of the dimensions (numerical values) designated in the design patterns. Thereafter, only the microscopic areas to be exposed are sequentially or comprehensively exposed. Moreover, the dimensions (numerical values) in the design patterns are corrected based on the complete dimensions of actually formed conductive patterns, if necessary. FIG. 8 shows an example of the configuration of an exposure system in which the manufacturing method (exposure method) is implemented.

An exposure system to be employed in the process of manufacturing the TFT substrate 1 according to the embodiment 1 includes, for example, as shown in FIG. 8, an exposure apparatus 6 that exposes a photosensitive resist film, a design pattern holding apparatus 7 that holds the design patterns employed by the exposure apparatus 6, a complete pattern imaging means 8 that produces an image of actually formed conductive patterns (thin-film patterns), and a design pattern correction apparatus 9 that decides based on the image produced by the complete pattern imaging means 8 whether correction of design patterns is needed, and that if the correction is needed, corrects dimensions designated in the design patterns concerned.

The exposure apparatus 6 is an apparatus that exposes the photosensitive resist film formed on the conductive film by a resist film formation apparatus 10. In the embodiment 1, an exposure apparatus called direct-drawing exposure equipment is adopted. At this time, the exposure apparatus 6 includes an exposing means 601 for exposing the resist film, a design pattern acquiring means 602 for acquiring predetermined design patterns from a design pattern database 701 included in the design pattern holding apparatus 7, an exposure dimensions calculating means 603 for calculating exposure dimensions using the design patterns acquired by the design pattern acquiring means 602, an exposure dimensions holding means 604 for holding the exposure dimensions calculated by the exposure dimensions calculating means 603, and an exposure control means 605 for controlling exposure, which is performed by the exposing means 601, on the basis of the exposure dimensions held in the exposure dimensions holding means 604.

The design pattern holding apparatus 7 is an apparatus that holds design patterns designating the dimensions of the scanning signal lines 101, gate electrode portions 10G, semiconductor beds 104, video signal lines 102, drain electrode portions 102D, source electrodes 105, pixel electrodes 107, and through holes TH, which are formed in the TFT substrate 1, and the formational positions at which they are formed. The design patterns are held in the design pattern database 701. Moreover, the design pattern holding apparatus 7 is connected to the exposure apparatus 6 over a network, for example, a local area network (LAN).

The complete pattern imaging means 8 is a means for producing an image of thin-film patterns (complete patterns). The thin-film patterns are formed in such a manner that: a development apparatus 11 develops a resist film exposed by the exposure apparatus 6 so as to produce etching resists; and an etching apparatus 12 etches the thin film using the etching resists as a mask.

The design pattern correction apparatus 9 measures the complete dimensions of an actually formed thin-film pattern using an image produced by the complete pattern imaging means 8, compares the complete dimensions with dimensions designated in an associated design pattern, and corrects the dimensions (numerical values) in the design pattern if necessary. At this time, the design pattern correction apparatus 9 includes a complete dimensions calculating means 901 for calculating the complete dimensions of a thin-film pattern, a correction-needed-or-not deciding means 902 for deciding whether correction of a design pattern is needed, and a design dimensions correcting means 903 for, if a decision is made that correction of a design pattern is needed, correcting the dimensions (numerical values) in the design pattern. Moreover, the design pattern correction apparatus 9 is connected to the complete pattern imaging means 8, design pattern holding apparatus 7, and exposure apparatus 6 over a network, for example, a LAN.

Incidentally, the exposure system employed in the process of manufacturing the TFT substrate 1 according to the embodiment 1 is not limited to the configuration shown in FIG. 8. Alternatively, for example, the design pattern correction apparatus 9 and complete pattern imaging means 8, or the design pattern correction apparatus 9 and design pattern holding apparatus 7 may be integrated into one piece of equipment including the capabilities.

Figure 9:
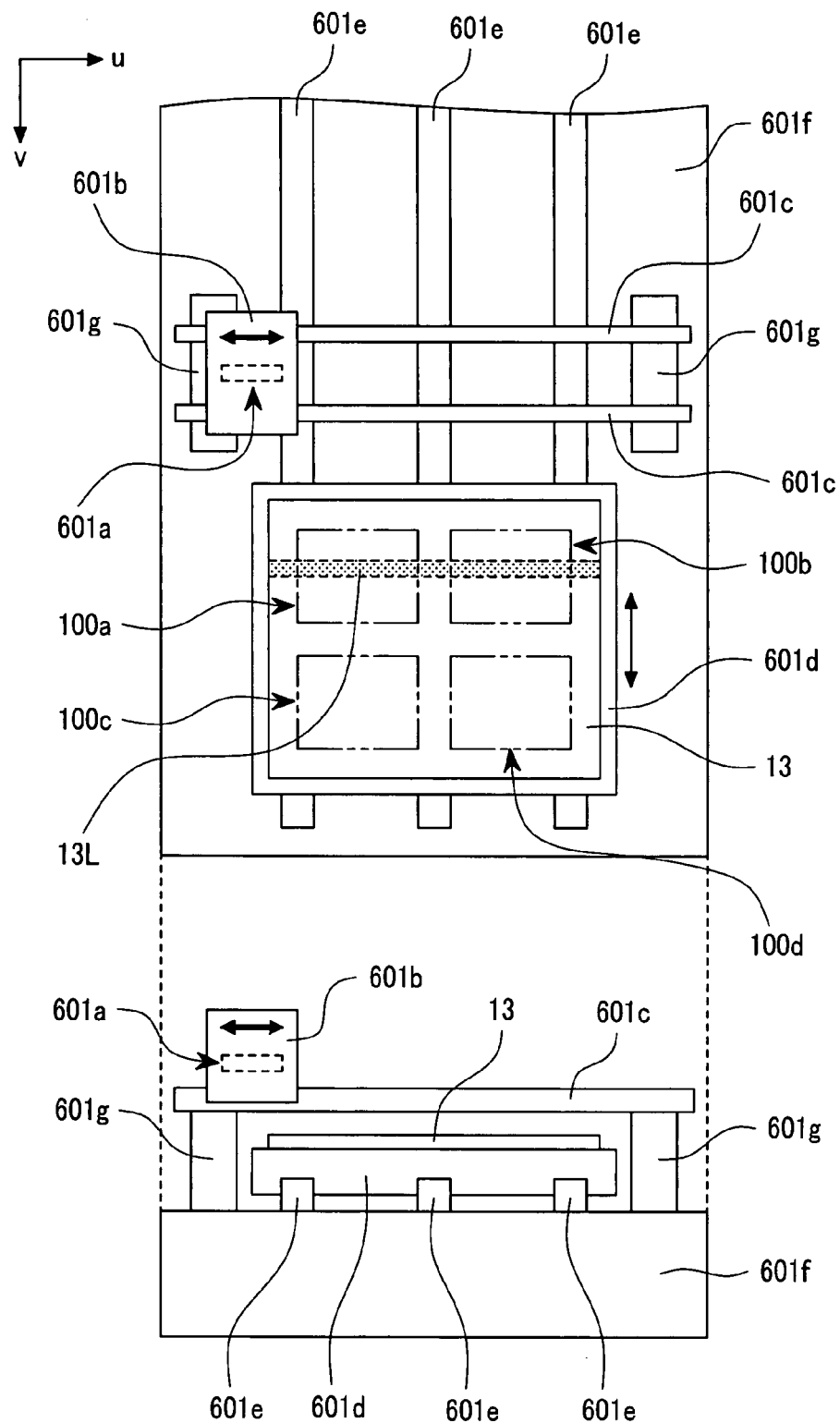
FIG. 9 illustratively shows an example of the structure of an exposing means included in an exposure apparatus employed in the exposure system shown in FIG. 8.
Figure 10:
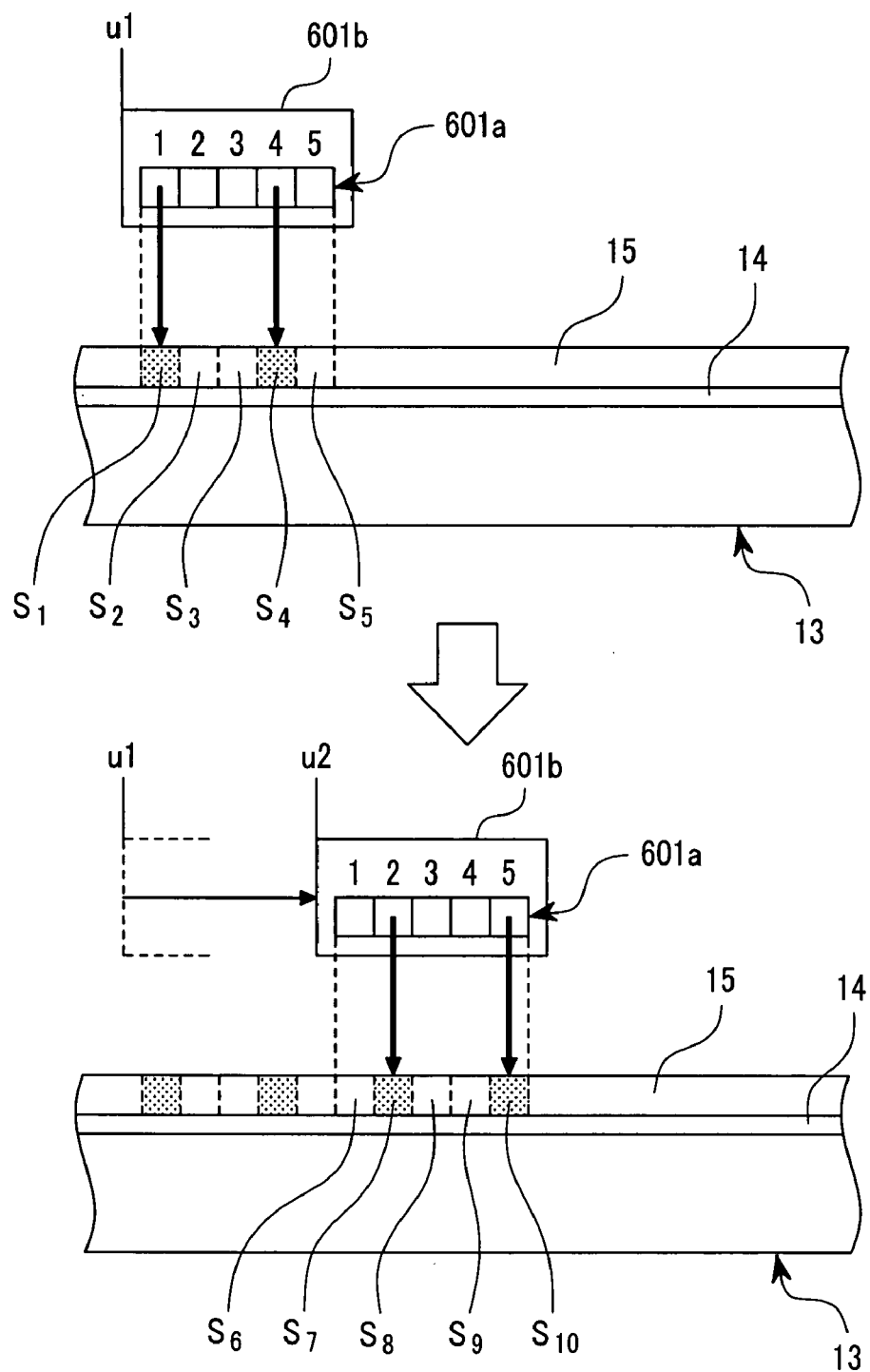
FIG. 10 is an illustrative diagram for use in explaining an exposure procedure to be followed by the exposing means shown in FIG. 9.

FIG. 9 is an illustrative diagram showing an example of the configuration of the exposing means included in the exposure apparatus employed in the exposure system shown in FIG. 8. FIG. 10 is an illustrative diagram for use in explaining an exposure procedure to be followed by the exposing means shown in FIG. 9. FIG. 9 includes a view in which the exposing means is seen from above and a view in which the exposing means is seen from the lower flank thereof.

In the exposure system employed in the process of manufacturing the TFT substrate 1 according to the embodiment 1, an exposure apparatus called direct-drawing exposure equipment is adopted as the exposure apparatus 6. The direct-drawing exposure equipment does not use a photo mask that has exposure patterns formed on a glass substrate using a metal film made of chromium or the like, but controls numerical values on the basis of numerically expressed exposure dimensions, and draws exposure patterns directly on a resist film. In this case, the exposing means 601 includes, for example, as shown in FIG. 9, an exposure head 601b including an exposing member 601a, head guides 601c that bear the exposure head 601b so that the exposure head can freely move in u directions, a table 601d that horizontally holds a mother glass 13 on which a photosensitive resist film is formed, table guides 601e that bear the table 601d so that the table can freely move in v directions, a base 601f on which the table guides 601e are secured, and head guide fixing members 601g with which the head guides 601c are secured on the base 601f.

The mother glass 13 is a glass substrate having four fields 100a, 100b, 100c, and 100d that are cut out as four TFT substrates 1. For manufacture of the TFT substrate 1, the mother glass 13 is used to comprehensively form multiple TFT substrates 1. Thereafter, the fields 100a, 100b, 100c, and 100d are cut out as individual TFT substrates.

Moreover, a first ball screw extending in parallel with the head guides 601c is coupled to the lower part of the exposure head 601b, though it is not shown. A first motor that rotates or drives the first ball screw is connected to one end of the first ball screw. Namely, the first ball screw is driven to rotate by the first motor, whereby the exposure head 601b is moved in the u directions along the head guides 601c.

Likewise, a second ball screw extending in parallel with the table guides 601e is coupled to the lower part of the table 601d, though it is not shown. A second motor that rotates or drives the second ball screw is connected to one end of the second ball screw. Namely, the second ball screw is driven to rotate by the second motor, whereby the table 601d is moved in the v directions.

When the exposing means 601 shown in FIG. 9 is used to expose a resist film formed on the mother glass 13, the exposure head 601b is, for example, moved in the u directions with the table 601d immobilized. After the mother glass 13 is exposed from one end thereof to the other end thereof in the form of a belt, the exposure head 601b is returned to the initial position. The table 601d is then moved in the v direction. This sequence of movements is repeated so that the entire area on the resist film formed on the mother glass 13 can be exposed. Thus, exposure patterns are drawn.

Moreover, for exposure to be achieved by moving the exposure head 601b in the u directions, a belt-like exposure area 13L is, for example, divided into multiple microscopic areas. Based on exposure dimensions held in the exposure dimensions holding means 604, the multiple microscopic areas are classified into microscopic areas to be exposed and microscopic areas not to be exposed. When the exposing member 601a is moved to the microscopic area to be exposed, the exposing member irradiates light to the resist film for exposure. The exposure control means 605 classifies the multiple microscopic areas into the microscopic areas to be exposed and the microscopic areas not to be exposed, and determines irradiation or non-irradiation by the exposing member 601a. An exposure method will be concretely described in conjunction with FIG. 10.

Assume that the exposing member 601a incorporated in the exposure head 601b is, for example, as shown in the upper part of FIG. 10, designed to include five independent irradiating mechanisms whose irradiation or non-irradiation can be controlled. For example, when the exposure head 601b is located at a position u1 in the u direction, five microscopic areas $S_1$ to $S_5$ out of all the microscopic areas on the resist film 15 formed on the conductive film 14 can be exposed. Whichever of the five microscopic areas $S_1$ to $S_5$ on the resist film 15 are exposed is determined with exposure dimensions. When the microscopic areas $S_1$ to $S_4$ out of the five microscopic areas $S_1$ to $S_5$ are determined to be exposed based on the exposure dimensions, the exposure control means 605 transmits a control signal to the exposure head 601b so that the first irradiating mechanism opposed to the microscopic area $S_1$ and the fourth irradiating mechanism opposed to the microscopic area $S_4$ out of all the five irradiating mechanisms included in the exposing member 601a will irradiate light but the second irradiating mechanism opposed to the microscopic area $S_2$, the third irradiating mechanism opposed to the microscopic area $S_3$, and the fifth irradiating mechanism opposed to the microscopic area $S_5$ will not irradiate light. Consequently, as shown in the upper part of FIG. 10, only the microscopic areas $S_1$ and $S_4$ out of the five microscopic areas $S_1$ to $S_5$ on the resist film 15 are exposed to light.

After the five microscopic areas $S_1$ to $S_5$ on the resist film 15 are exposed, the exposure head 601b is, as shown in the lower part of FIG. 10, moved to a position u2 at which five succeeding microscopic areas $S_6$ to $S_{10}$ can be exposed. Whichever of the five microscopic areas $S_6$ to $S_{10}$ are exposed is decided based on exposure dimensions. If the microscopic areas $S_7$ and $S_{10}$ out of the five microscopic areas $S_6$ to $S_{10}$ are decided to be exposed, the exposure control means 605 transmits a control signal to the exposure head 601b so that the second irradiating mechanism opposed to the microscopic areas $S_7$ and the fifth irradiating mechanism opposed to the microscopic area $S_{10}$ out of the five irradiating mechanisms included in the exposing member 601a will irradiate light but the first irradiating mechanism opposed to the microscopic area $S_6$, the third irradiating mechanism opposed to the microscopic area $S_8$, and the fourth irradiating mechanism opposed to the microscopic area $S_9$ will not irradiate light. Consequently, as shown in the lower part of FIG. 10, only the microscopic areas $S_7$ and $S_{10}$ out of the five microscopic areas $S_6$ to $S_{10}$ on the resist film 15 are exposed to light.

Figure 11:
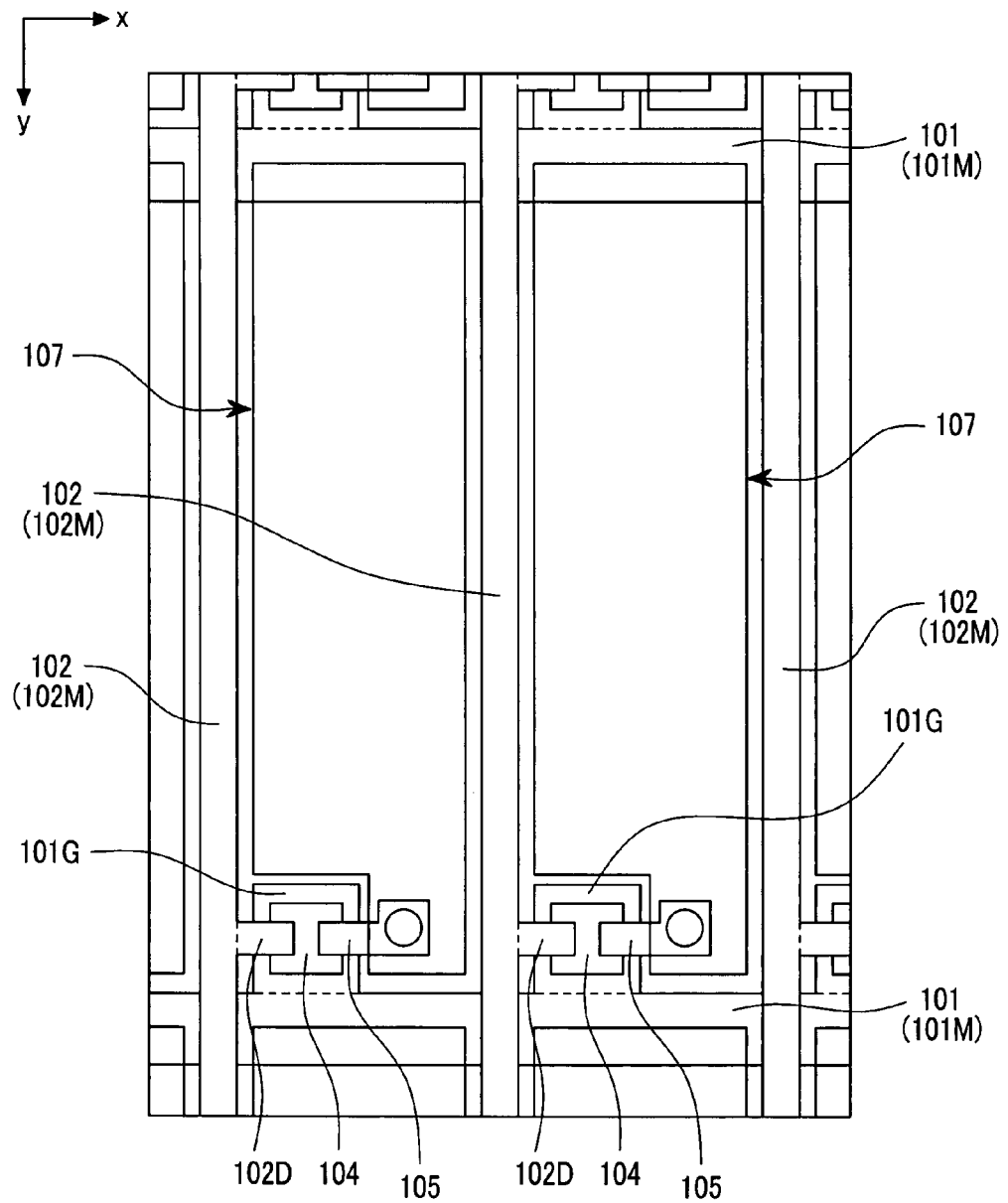
FIG. 11 is an illustrative diagram for use in explaining an example of a method of designating dimensions in a design pattern for the pixel structure shown in FIG. 4.
Figure 12:
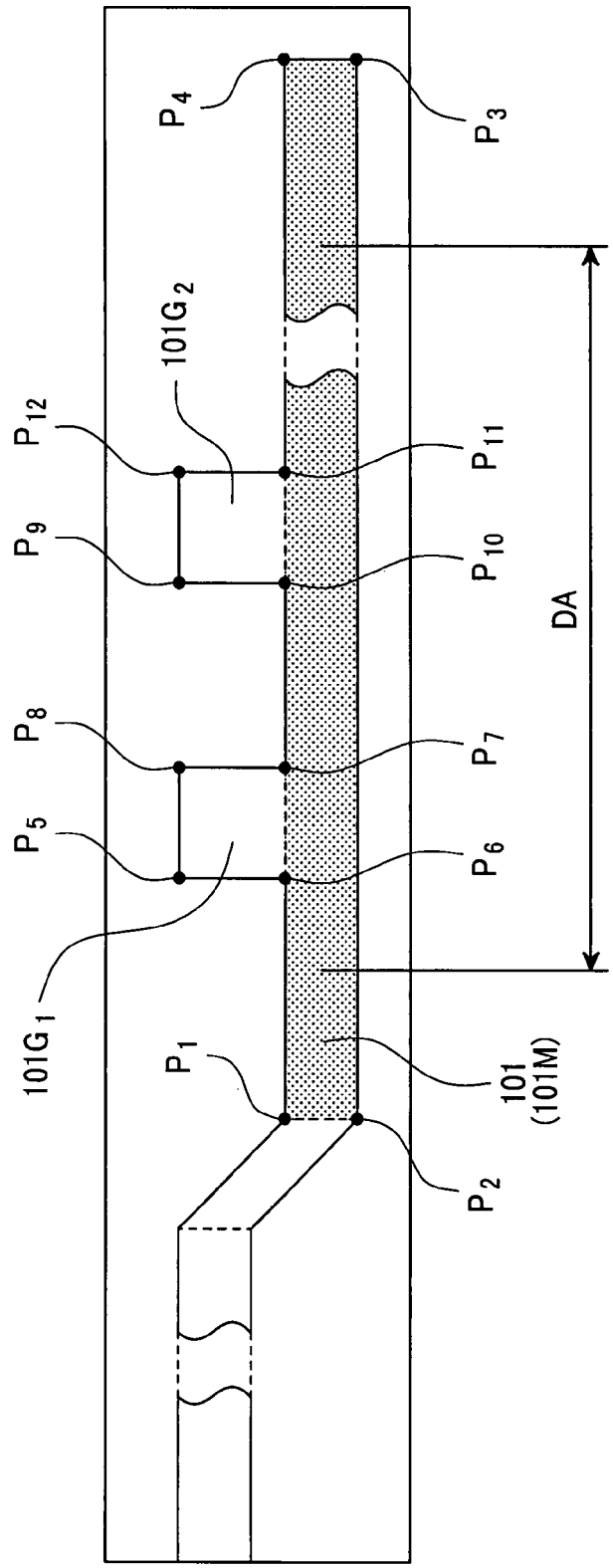
FIG. 12 is an illustrative diagram for use in explaining a concrete example of a method of designating the dimensions of a scanning signal line.
Figure 13:
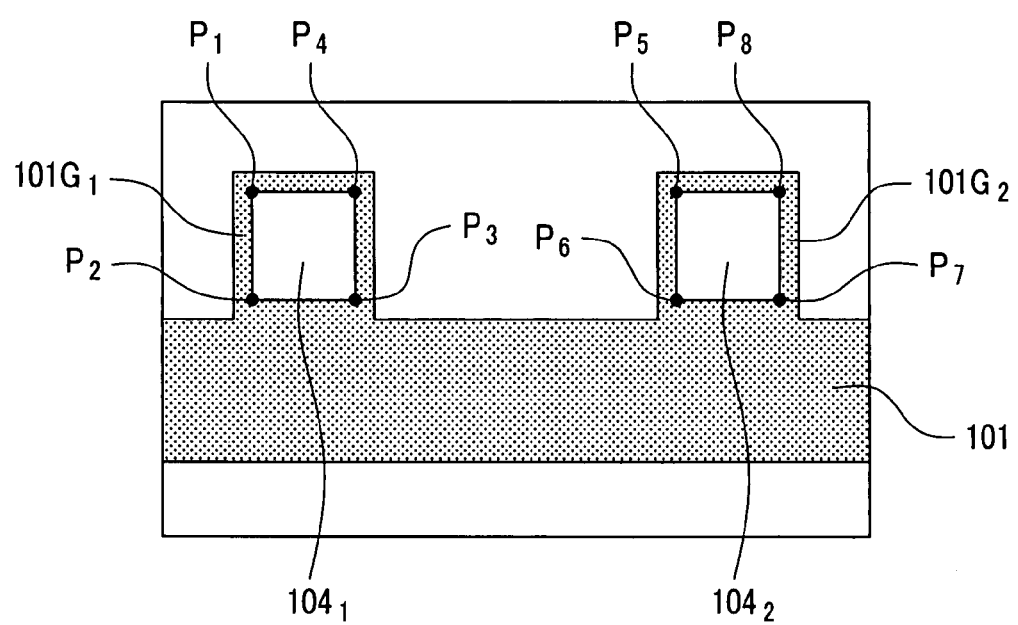
FIG. 13 is an illustrative diagram for use in explaining a concrete example of a method of designating the dimensions of a semiconductor bed.
Figure 14:
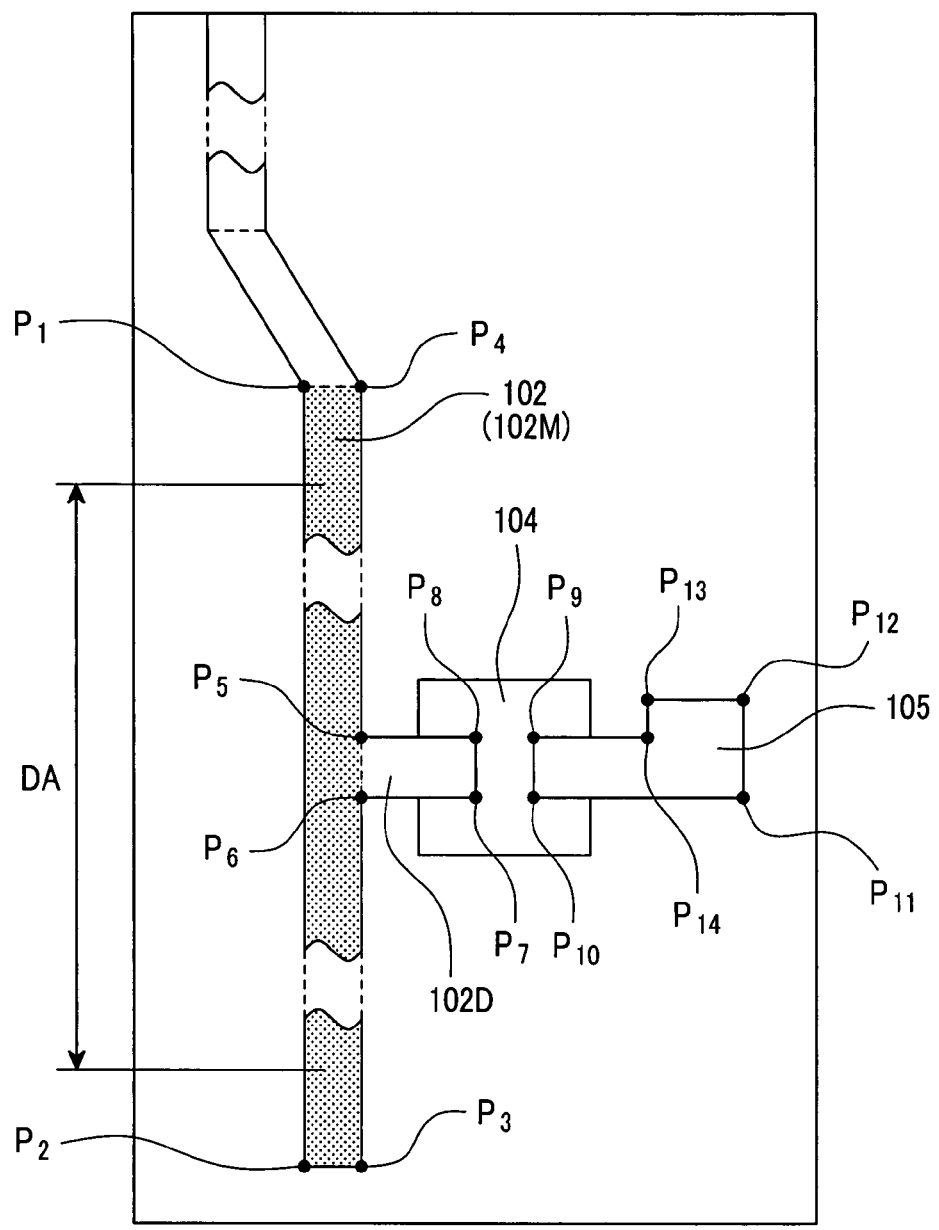
FIG. 14 is an illustrative diagram for use in explaining a concrete example of a method of designating the dimensions of a video signal line and the dimensions of a source electrode.
Figure 15:
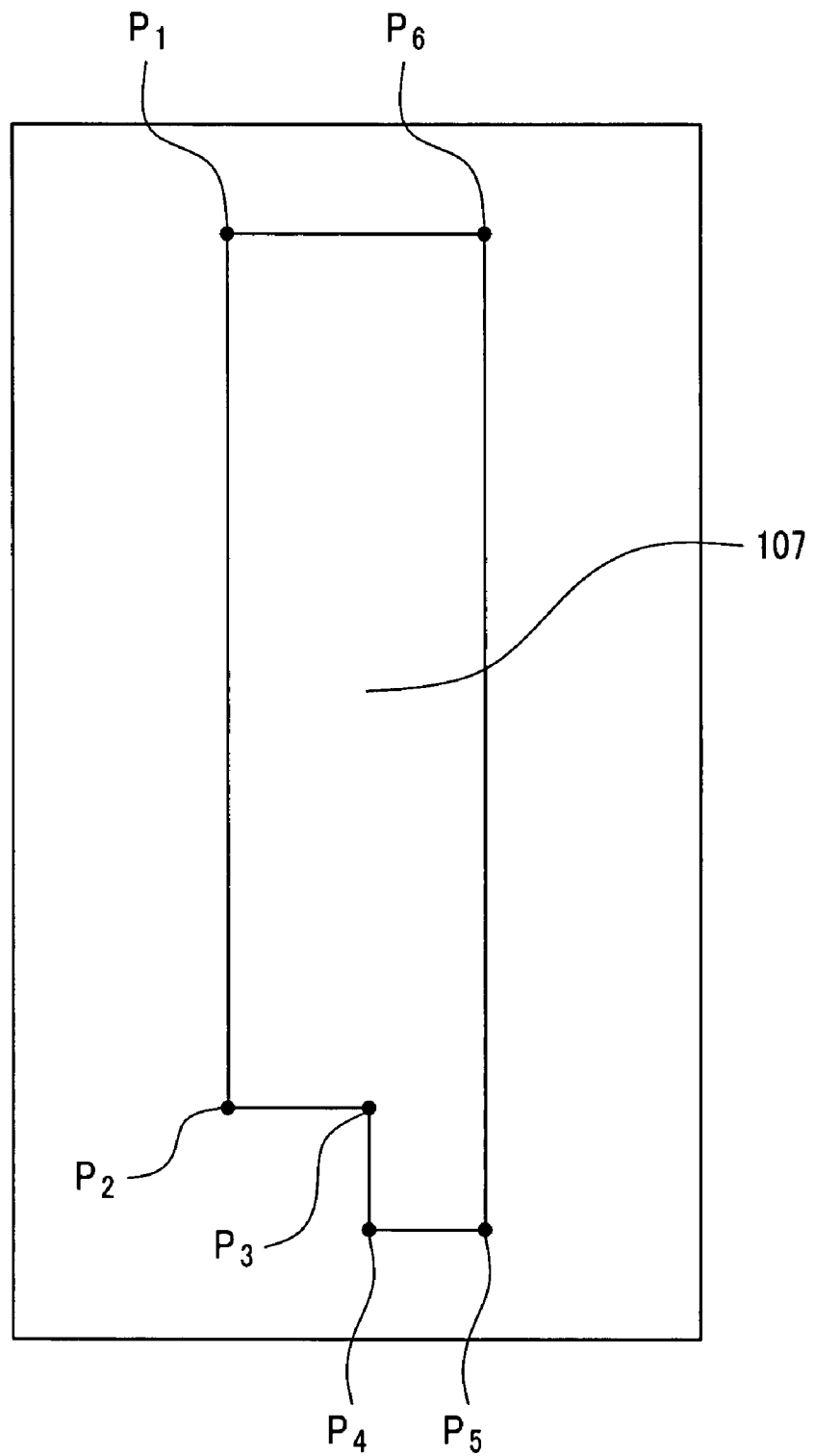
FIG. 15 is an illustrative diagram for use in explaining a concrete example of a method of designating the dimensions of a pixel electrode.

FIG. 11 is an illustrative diagram for use in explaining an example of a method of designating dimensions in a design pattern for the pixel structure shown in FIG. 4. FIG. 12 is an illustrative diagram for use in explaining a concrete example of a method of designating the dimensions of a scanning signal line. FIG. 13 is an illustrative diagram for use in explaining a concrete example of a method of designating the dimensions of a semiconductor bed. FIG. 14 is an illustrative diagram for use in explaining a concrete example of a method of designating the dimensions of a video signal line and a dimension of a source electrode. FIG. 15 is an illustrative diagram for use in explaining a concrete example of a method of designating the dimensions of a pixel electrode.

In the embodiment 1, a case where the TFT substrate 1 in which one pixel has the structure shown in FIG. 4 to FIG. 6 is manufactured is taken for instance. In the design patterns employed by the exposure apparatus 6, the dimensions of the scanning signal lines 101, gate electrode portions 101G, semiconductor beds 104, video signal lines 102, drain electrode portions 102D, source electrodes 105, pixel electrodes 107, and through holes TH, which are formed on the TFT substrate 1, and the formational positions at which they are formed are designated.

The dimensions of a scanning signal line 101 may be designated as the dimensions of a unit including the multiple gate electrode portions 10G. However, in this case, the designating method is complex and it is hard to handle the dimensions. Therefore, when the dimensions of one scanning signal line 101 is designated, the scanning signal line 101 is, for example, as shown in FIG. 11, regarded as a combination of a major linear portion 101 M that is extended in an x direction and substantially rectangular, and multiple gate electrode portions 101G. The dimensions of the major linear portion 101M and the dimensions of each gate electrode portion 101G should preferably be designated.

Specifically, assuming that the dimensions of one scanning signal line 101 and the formational position at which it is formed are designated, as shown in FIG. 12, the major linear portion 101M horizontally traversing the display field DA is expressed with a quadrangle having four vertices $P_1$, $P_2$, $P_3$, and $P_4$. A graphic number Rect1 is assigned to the quadrangle. Planar positional information is designated with coordinates $(x_1,y_1)$ of the vertex $P_1$, coordinates $(x_2,y_2)$ of the vertex $P_2$, coordinates $(x_3,y_3)$ of the vertex $P_3$, and coordinates $(X_4,y_4)$ of the vertex $P_4$.

Moreover, multiple gate electrode portions 101G coupled to the major linear portion 101M of a certain scanning signal line 101 are each expressed with a quadrangle having four vertices. For each gate electrode portion 101G, a graphic number and planar positional information are designated. Moreover, the graphic number assigned to each gate electrode portion 101G shall be incremented sequentially with the first graphic number assigned to the gate electrode portion located at the input end of the scanning signal line 101, that is, the end of the scanning signal line to which a scanning signal is applied.

Specifically, the gate electrode portion $101G_1$ located closest to the input end of the scanning signal line 101 is expressed with a quadrangle having four vertices $P_5$, $P_6$, $P_7$, and $P_8$, and a graphic number Rect2 is assigned to the quadrangle. Planar positional information is designated with coordinates $(X_5,y_5)$ of the vertex $P_5$, coordinates $(x_6, y_6)$ of the vertex $P_6$, coordinates $(X_7, y_7)$ of the vertex $P_7$, and coordinates $(x_8, y_8)$ of the vertex $P_8$. Moreover, the gate electrode portion 101G$_2$ located secondly closest to the input end of the scanning signal line 101 is expressed with a quadrangle having four vertices $P_9$, $P_{10}$, $P_{11}$, and $P_{12}$, and a graphic number Rect3 is assigned to the quadrangle. Planar positional information is designated with coordinates $(x_9, y_9)$ of the vertex $P_9$, coordinates $(x_{10}, y_{10})$ of the vertex $P_{10}$, coordinates $(x_{11}, y_{11})$ of the vertex $P_{11}$, and coordinates $(x_{12}, y_{12})$ of the vertex $P_{12}$. As for the other gate electrode portions, an iterative description will be omitted. Briefly speaking, each of the other gate electrode portions is also expressed as a quadrangle having four vertices, an inherent graphic number is assigned to the quadrangle, and planar positional information is designated with coordinates of the vertices.

Generally, the scanning signal line 101 has an input end-side portion thereof located outside the display field DA. The portion is coupled to the wiring in a flexible printed circuit board or a terminal of a scanning driver (gate driver). As for the dimensions of the portion and the formational position at which the portion is formed, the portion is divided into simple graphics such as quadrangles similar to the one with which the gate electrode portion 101G is expressed, and an inherent graphic number is assigned to each of the graphics. Planar positional information is designated with coordinates of the vertices of each quadrangle.

The dimensions of a semiconductor bed 104, which is formed on a gate electrode portion 101G of a scanning signal line 101 with the first insulating layer 103 between them, and the formational position at which it is formed are designated in the same manner as those of the gate electrode portion 101G are.

Specifically, for example, a semiconductor bed 104, formed on a certain gate electrode portion 101G$_1$ is, as shown in FIG. 13, expressed with a quadrangle having four vertices $P_1$, $P_2$, $P_3$, and $P_4$, and a graphic number Rect1 is assigned to the quadrangle. Planar positional information is designated with coordinates of the vertex $P_1$, coordinates of the vertex $P_2$, coordinates of the vertex $P_3$, and coordinates of the vertex $P_4$. Moreover, a semiconductor bed 104$_2$ formed on another gate electrode portion 101G$_2$ is expressed with a quadrangle having four vertices $P_5$, $P_6$, $P_7$, and $P_8$, and a graphic number Rect2 is assigned to the quadrangle. Planar positional information is designated with coordinates of the vertex $P_5$, coordinates of the vertex $P_6$, coordinates of the vertex $P_7$, and coordinates of the vertex $P_8$. As for the other semiconductor beds, an iterative description will be omitted. Briefly speaking, each of the other semiconductor beds is expressed with a quadrangle having four vertices, an inherent graphic number is assigned to the quadrangle, and planar positional information is designated with coordinates of the vertices.

Among the dimensions and formational positions of a video signal line 102 and a source electrode 105 formed on a semiconductor bed 104, the dimensions and formational position of the video signal line 102 are designated as mentioned below. For example, one video signal line 102 is, as shown in FIG. 11, regarded as a combination of a major linear portion 102M that is extended in a y direction and substantially rectangular, and multiple drain electrode portions 102D. The dimensions of the major linear portion 102M and the dimensions of each drain electrode portion 102D are designated.

Specifically, assuming that the dimensions and formational position of one video signal line 102 are designated, the major linear portion 102M longitudinally traversing the display field DA is, for example, as shown in FIG. 14, expressed with a quadrangle having four vertices $P_1$, $P_2$, $P_3$, and $P_4$, and a graphic number Rect1 is assigned to the quadrangle. Planar positional information is designated with coordinates of the vertex $P_1$, coordinates of the vertex $P_2$, coordinates of the vertex $P_3$, and coordinates of the vertex $P_4$.

For example, the drain electrode portion 102D located closest to the input end of the video signal line 102 is expressed with a quadrangle having four vertices $P_5$, $P_6$, $P_7$, and $P_8$, and a graphic number Rect2 is assigned to the quadrangle. Planar positional information is designated with coordinates of the vertex $P_5$, coordinates of the vertex $P_6$, coordinates of the vertex $P_7$, and coordinates of the vertex $P_8$. As for the other drain electrode portions, an iterative description will be omitted. Briefly speaking, each of the other drain electrode portions is also expressed with a quadrangle having four vertices, an inherent graphic number is assigned to the quadrangle, and planar positional information is designated with coordinates of the vertices.

Generally, the video signal line 102 has an input end-side portion thereof located outside the display field DA. The portion is coupled to the wiring in a flexible printed circuit board or a terminal of a data driver (drain driver). As for the dimensions and formational position of the portion, the portion is divided into simple graphics such as quadrangles similar to a quadrangle with which the drain electrode portion 102D is expressed, an inherent graphic number is assigned to each of the quadrangles, and planar positional information is designated with coordinates of the vertices.

Moreover, for example, the source electrode 105 to be paired with the drain electrode portion 102D located closest to the input end of the video signal line 102 is expressed with a hexagon having six vertices $P_9$, $P_{10}$, $P_{11}$, $P_{12}$, $P_{13}$, and $P_{14}$. A graphic number Rect3 is assigned to the hexagon. Planar positional information is designated with coordinates of the vertex $P_9$, coordinates of the vertex $P_{10}$, coordinates of the vertex $P_{11}$, coordinates of the vertex $P_{12}$, coordinates of the vertex $P_{13}$, and coordinates of the vertex $P_{14}$. As for the other source electrodes, an iterative description will be omitted. Briefly speaking, each of the other source electrodes is also expressed with a hexagon having six vertices, an inherent graphic number is assigned to the hexagon, and planar positional information is designated with coordinates of the vertices.

The dimensions and formational position of a pixel electrode 107 formed on the video signal line 102 and source electrode 105 are designated in the same manner as those of the source electrode 105 are. Specifically, the pixel electrode is, as shown in FIG. 15, expressed with a hexagon having six vertices $P_1$, $P_2$, $P_3$, $P_4$, $P_5$, and $P_6$. A graphic number Rect1 is assigned to the hexagon. Planar positional information is designated with coordinates of the vertex $P_1$, coordinates of the vertex $P_2$, coordinates of the vertex $P_3$, coordinates of the vertex $P_4$, coordinates of the vertex $P_5$, and coordinates of the vertex $P_6$. As for the other pixel electrodes, an iterative description will be omitted. Briefly speaking, each of the other pixel electrodes is also expressed with a hexagon having six vertices, an inherent graphic number is assigned to the hexagon, and planar positional information is designated with coordinates of the vertices.

Assuming that one TFT substrate 1 is manufactured, exposure of a photosensitive resist film to be performed during each of a process of forming the scanning signal lines 101, a process of forming the semiconductor beds 104, a process of forming the video signal lines 102 and source electrodes 105, and a process of forming the pixel electrodes 107 is generally achieved by the same exposure apparatus 6. Namely, the design pattern holding apparatus 7 holds as one pattern data the dimensions and formational positions of components including the scanning signal lines 101. Therefore, a design pattern for each component includes, in addition to the planar dimensions and formational position, information designating a three-dimensional position. Table 1 schematically shows the data structure of such a design pattern.

TABLE 1

Table 1: example of definition of a design pattern

| Component | Planar shape | Planar positional information | Three-dimensional positional information |
|---|---|---|---|
| Scanning signal line | Quadrangle | Coordinates representing positions of vertices | Lowermost 0 layer |
| Gate electrode portion | " | Coordinates representing positions of vertices | Lowermost 0 layer |
| Semiconductor bed | " | Coordinates representing positions of vertices | On a gate electrode portion |
| Video signal line | " | Coordinates representing positions of vertices | Same layer as a drain electrode portion |
| Drain electrode portion | " | Coordinates representing positions of vertices | On a semiconductor bed |
| Source electrode | Hexagon | Coordinates representing positions of vertices | On a semiconductor bed |
| Pixel electrode | " | Coordinates representing positions of vertices | On a source electrode |

Figure 16:
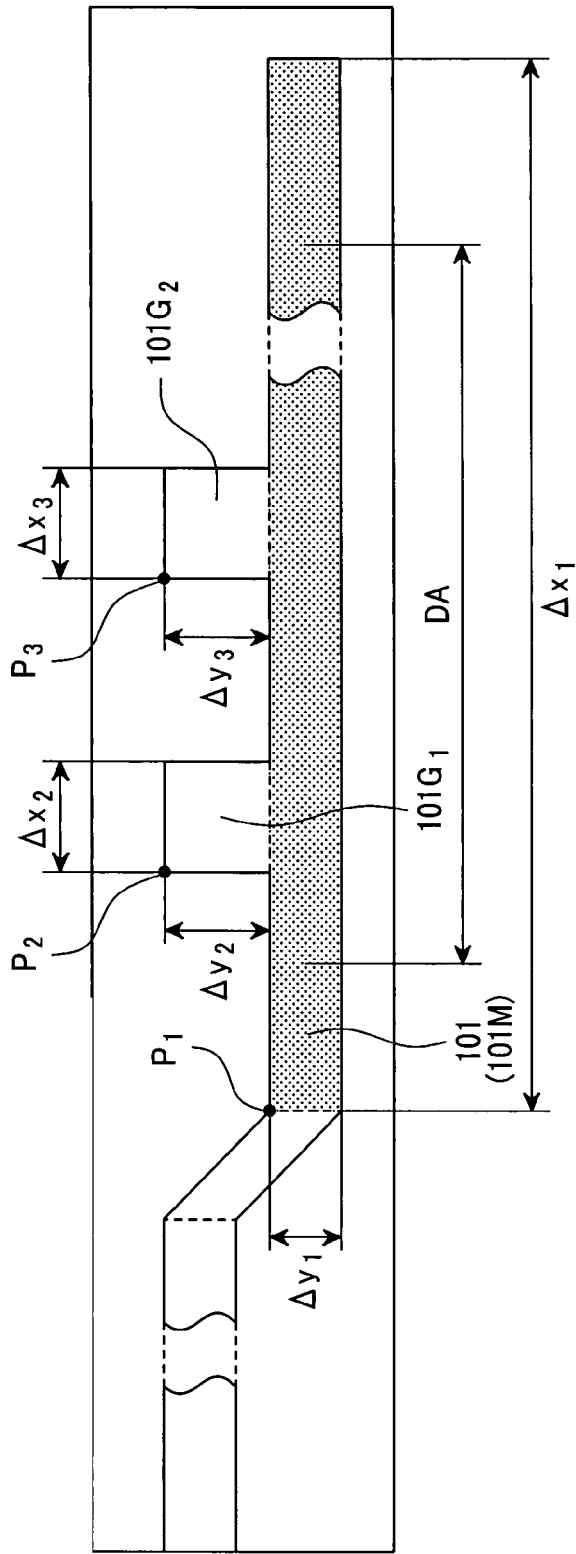
FIG. 16 is an illustrative diagram for use in explaining the first variant of the method of designating the dimensions of a scanning signal line.
Figure 17:
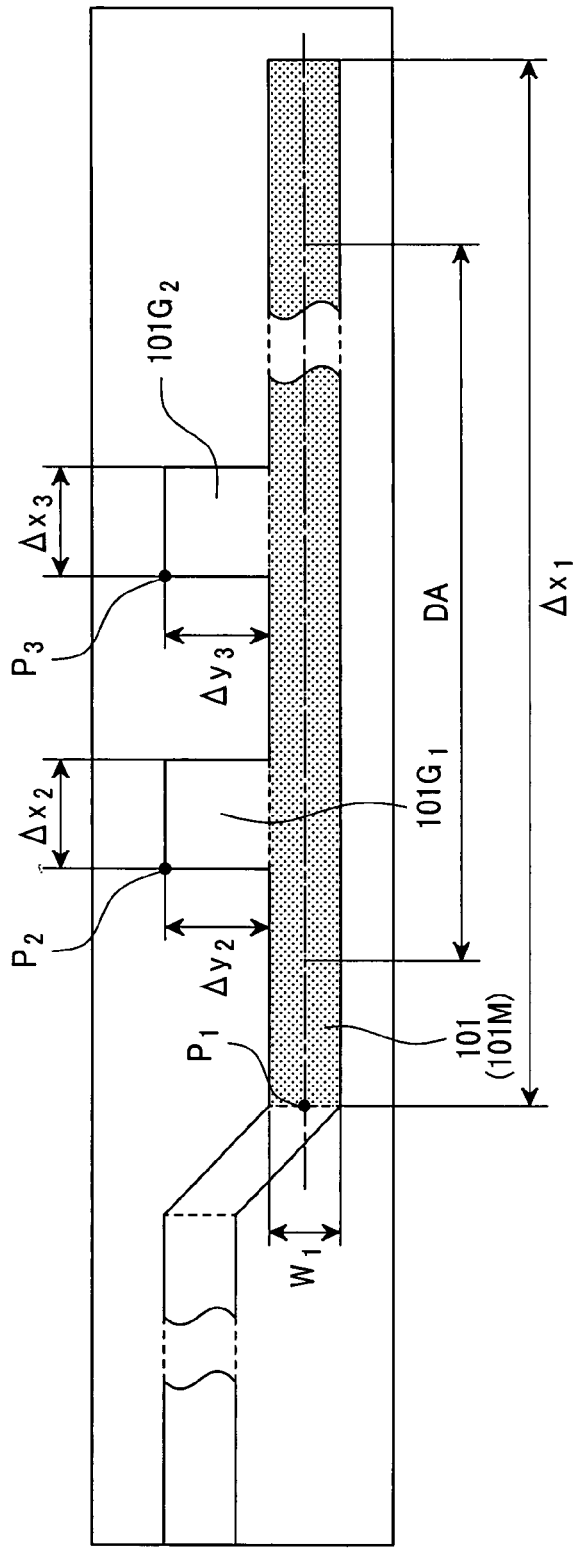
FIG. 17 is an illustrative diagram for use in explaining the second variant of the method of designating the dimensions of a scanning signal line.
Figure 18:
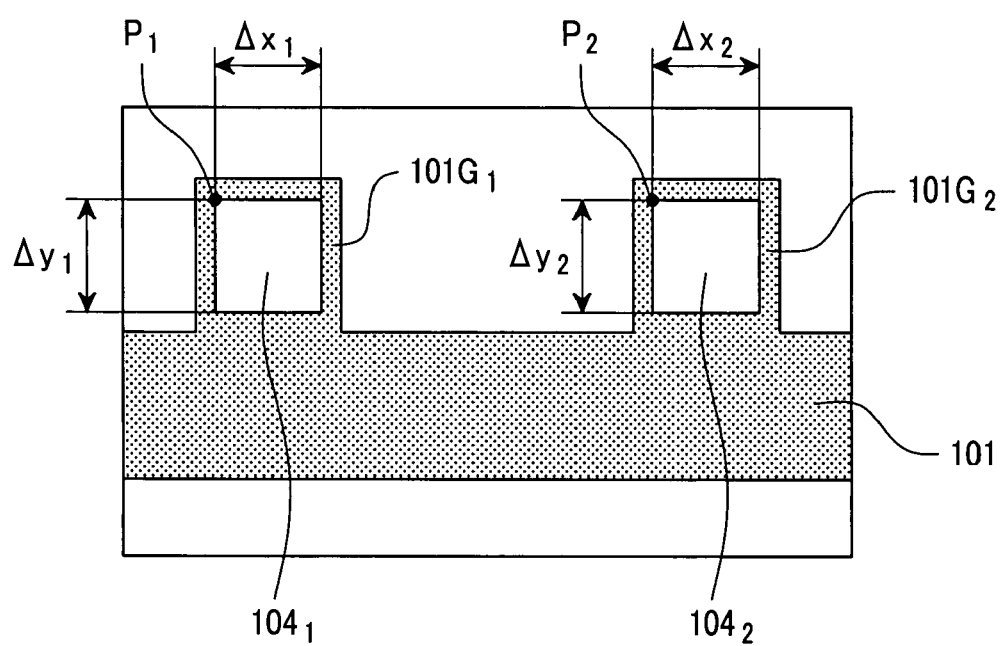
FIG. 18 is an illustrative diagram for use in explaining a variant of the method of designating the dimensions of a semiconductor bed.
Figure 19:
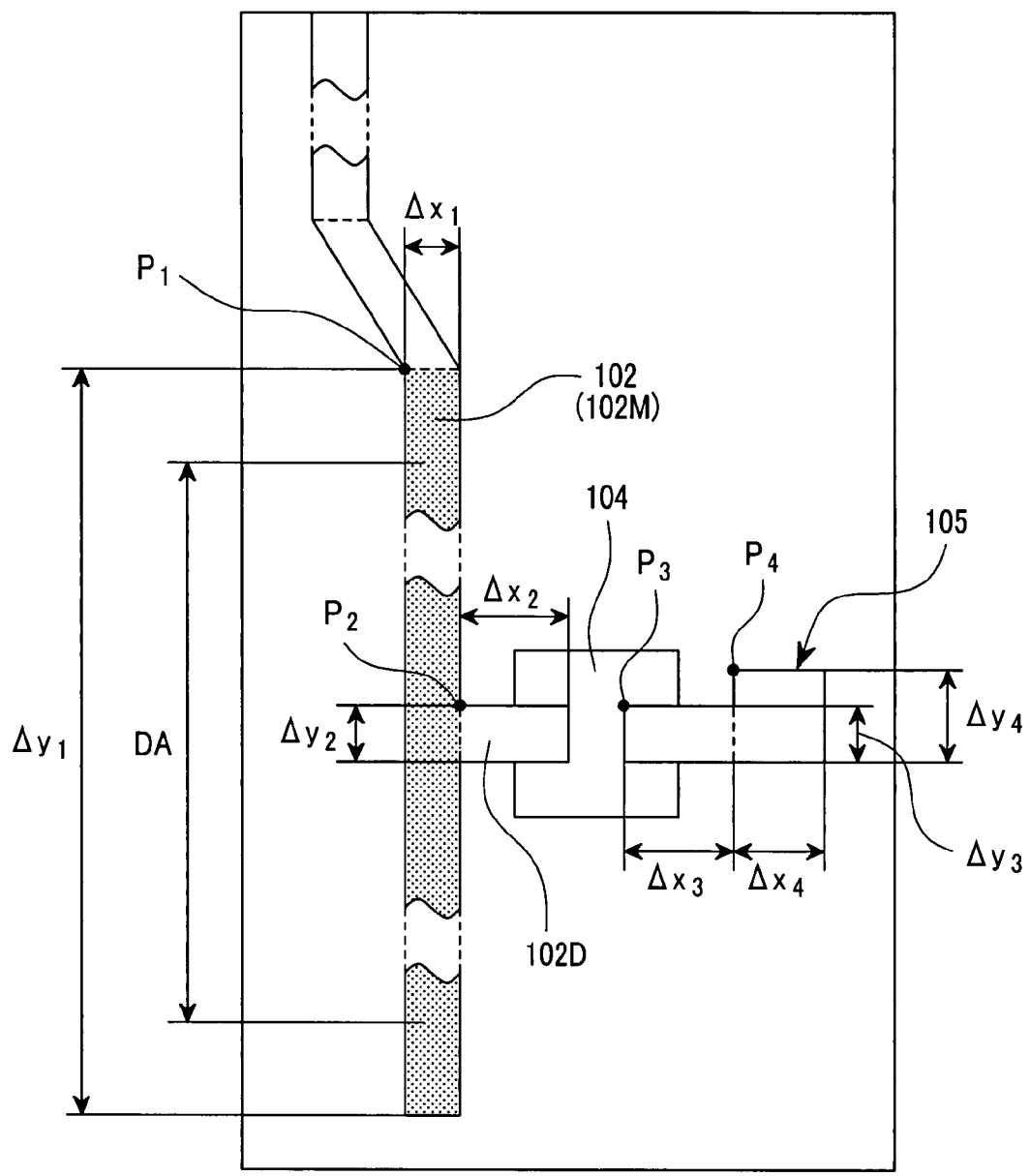
FIG. 19 is an illustrative diagram for use in explaining a variant of the method of designating the dimensions of a video signal line and the dimensions of a source electrode.
Figure 20:
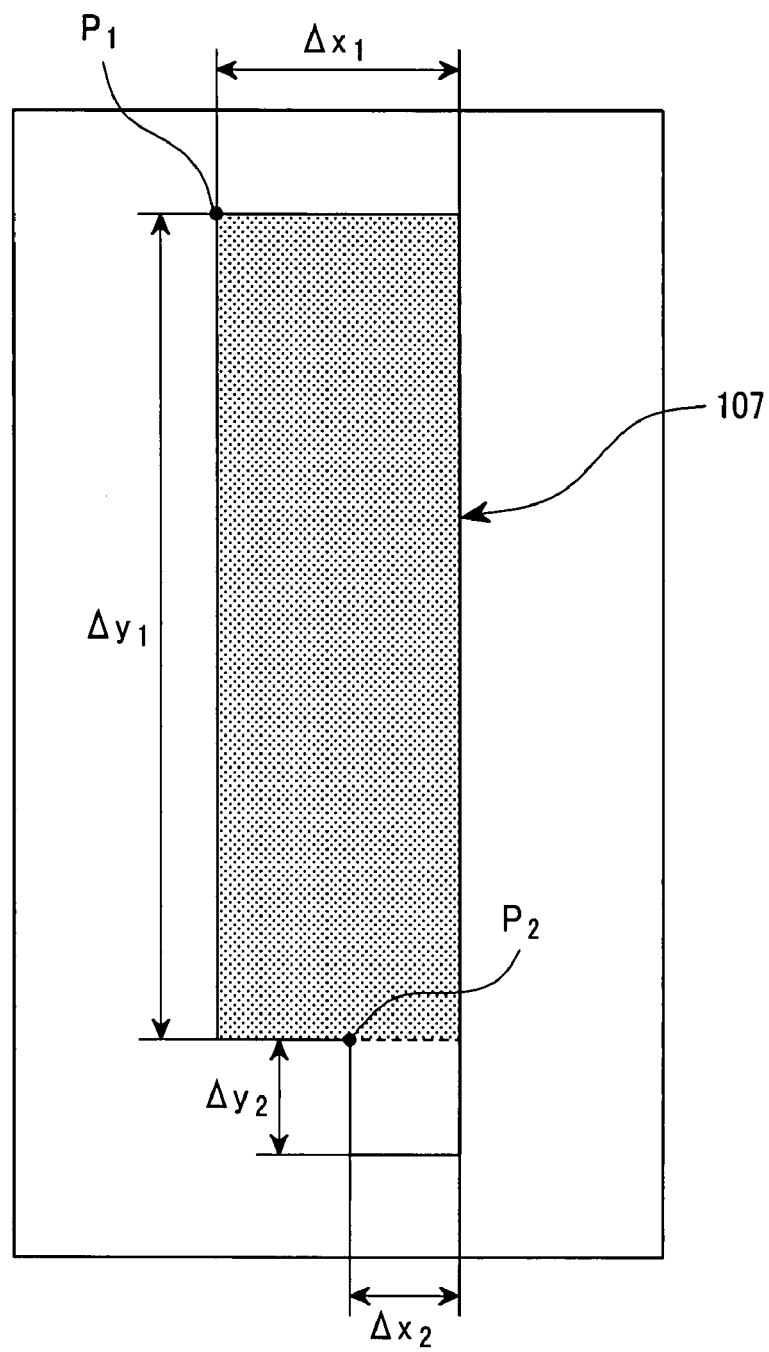
FIG. 20 is an illustrative diagram for use in explaining a variant of the method of designating the dimensions of a pixel electrode.

FIG. 16 is an illustrative diagram for use in explaining the first variant of the method of designating the dimensions of a scanning signal line. FIG. 17 is an illustrative diagram for use in explaining the second variant of the method of designating the dimensions of a scanning signal line. FIG. 18 is an illustrative diagram for use in explaining a variant of the method of designating the dimensions of a semiconductor bed. FIG. 19 is an illustrative diagram for use in explaining a variant of the method of designating the dimensions of a video signal line and the dimensions of a source electrode. FIG. 20 is an illustrative diagram for use in explaining a variant of the method of designating the dimensions of a pixel electrode.

Assuming that the dimensions and formational position of the major linear portion 101M of each scanning signal line 101 or each of the gate electrode portions 101G thereof are, for example, as shown in FIG. 12, designated in a design pattern with coordinates of four vertices of a quadrangle, eight data items (numerical values) are needed to specify the dimensions and formational position of one component. Therefore, for example, for manufacture of the TFT substrate 1 of a liquid crystal display panel for televisions or the like which offers a high resolution (includes a large number of pixels), the number of data items of design patterns becomes enormous and hard to handle. Namely, the number of data items required to be designated in a design pattern as the dimensions of one scanning signal line 101 (major linear portion 101M) or the dimensions of one gate electrode portion 101G is preferably as small as possible.

As a method of decreasing the number of data items to be designated in a design pattern, there is a method of designating coordinates, which represent the position of one of four vertices of a quadrangle, as the position of the quadrangle, and designating the length of a side extending from the vertex in an x direction, and the length of a side extending therefrom in a y direction as the dimensions of the quadrangle. In the case of a scanning signal line 101, the position of the major linear portion 101M of the scanning signal line 101 is, for example, as shown in FIG. 16, designated with coordinates $(x_1, y_1)$ representing the position of one vertex $P_1$ of four vertices of a quadrangle. The dimensions of the major linear portion 101M are designated with the length $\Delta x_1$ of a side extending from the vertex $P_1$ in the x direction and the length $\Delta y_1$ of a side extending therefrom in the y direction. In this way, the dimensions and formational position of the major linear portion 101M of one scanning signal line 101 can be designated with four data items (numerical values).

Likewise, the formational position at which the gate electrode portion 101G$_1$ is formed is designated with the coordinates $(x_2, y_2)$ of one vertex $P_2$ out of the four vertices, and the dimensions of the gate electrode portion 101G$_1$ are designated with the length $\Delta x_2$ of a side extending from the vertex $P_2$ in an x direction and the length $\Delta y_2$ of a side extending therefrom in a y direction. Moreover, the formational position of another gate electrode portion 101G$_2$ is designated with the coordinates $(X_3, y_3)$ of one vertex $P_3$ out of the four vertices, and the dimensions thereof are designated with the length $\Delta x_3$ of a side extending from the vertex $P_3$ in the x direction and the length $\Delta y_3$ of a side extending therefrom in the y direction. In this way, the dimensions and formational position of each gate electrode portion 101G can be designated with four data items (numerical values).

Further, for example, the major linear portion 101M of a scanning signal line 101 is a line that horizontally traverses the display field DA on the TFT substrate 1 in the x direction. The length of the major linear portion in the extending direction (x direction) is much larger than the length thereof in a direction (y direction) orthogonal to the extending direction. Therefore, the dimensions and formational position of the major linear portion 101M may be, for example, as shown in FIG. 17, defined with the coordinates of a point $P_1$ at which the center line intersects one end of the major linear portion 101M and the width $W_1$ of the major linear portion.

Moreover, as for designation of the dimensions and formational positions of the semiconductor beds 104, for example, as shown in FIG. 18, the formational position of a semiconductor bed 104, to be formed on a certain gate electrode portion 101G$_1$ may be designated with the coordinates representing the position of one vertex $P_1$ out of the four vertices, and the dimensions thereof may be designated with the length $\Delta x_1$ of a side extending from the vertex $P_1$ in an x direction and the length $\Delta y_1$ of a side extending therefrom in a y direction. Moreover, the formational position of a semiconductor bed 104$_2$ to be formed on another gate electrode portion 101G$_2$ is designated with the coordinates representing the position of one vertex $P_2$ out of the four vertices, and the dimensions thereof are designated with the length $\Delta x_2$ of a side extending from the vertex $P_2$ in the x direction and the length $\Delta y_2$ of a side extending therefrom in the y direction. In this way, the dimensions and formational position of one semiconductor bed 104 can be designated with four data items (numerical values).

Moreover, for designation of the dimensions of the major linear portion 102M of one video signal line 102, for example, as shown in FIG. 19, the formational position of the major linear portion may be designated with the coordinates of one vertex $P_1$ out of the four vertices of a quadrangle, and the dimensions thereof may be designated with the length $\Delta x_1$ of a side extending from the vertex $P_1$ in an x direction and the length $\Delta y_1$ of a side extending therefrom in a y direction. In this way, the dimensions and formational position of the major linear portion 102M of one video signal line 102 can be defined with four data items (numerical values).

As for each drain electrode portion 102D, the formational position of the drain electrode portion is designated with the coordinates of one vertex $P_2$ out of the four vertices, and the dimensions thereof are designated with the length $\Delta x_2$ of a side extending from the vertex $P_2$ in an x direction and the length $\Delta y_2$ of a side extending therefrom in a y direction. As for the other drain electrode portions 102D, the dimensions of each of the other drain electrode portions are designated in the same manner, though an iterative description will be omitted. In this way, the dimensions and formational position of each drain electrode portion 102D can be defined with four data items (numerical values).

Moreover, the dimensions and formational position of each source electrode 105 may be designated in such a manner that: for example, one hexagonal source electrode 105 is divided into two quadrangles; the dimensions and formational position of each quadrangle are designated with the two-dimensional coordinates of one vertex, the length of a side extending from the vertex in an x direction, and the length of a side extending therefrom in a y direction. Namely, one source electrode 105 is, as shown in FIG. 19, divided into two quadrangles. For one of the quadrangles, the formational position thereof is designated with the coordinates of a vertex $P_3$, and the dimensions thereof are designated with the length $\Delta x_3$ of a side extending from the vertex $P_3$ in the x direction and the length $\Delta y_3$ of a side extending therefrom in the y direction. For the other quadrangle, the formational position thereof is designated with the coordinates of a vertex $P_4$, and the dimensions thereof are designated with the length $\Delta x_4$ of a side extending from the vertex $P_4$ in the x direction and the length $\Delta y_4$ of a side extending therefrom in the y direction. In this way, the dimensions and formational position of each quadrangle can be defined with four data items (numerical values). Consequently, the dimensions and formational position of one source electrode 105 can be defined with eight data items (numerical values).

Further, for example, the major linear position 102M of each video signal line 102 is a line that longitudinally traverses the display field DA on the TFT substrate 1 in a y direction. The length of the major linear portion in an extending direction (y direction) is much larger than the length thereof in a direction (x direction) orthogonal to the extending direction. Consequently, the dimensions and formational position of the major linear portion 102M may be defined with the position of the center line and the width of the major linear portion.

Moreover, for designation of the dimensions and formational position of each pixel electrode 107, a hexagonal pixel electrode 107 to be formed in a certain pixel area may be, for example, divided into two quadrangles. The dimensions and formational position of each of the quadrangles may be designated with the two-dimensional coordinates of one vertex, the length of a side extending from the vertex in an x direction, and the length of a side extending therefrom in a y direction. Specifically, one pixel electrode 107 is, as shown in FIG. 20, divided into two quadrangles. For one of the quadrangles, the formational position thereof is designated with the coordinates of a vertex $P_1$, and the dimensions thereof are designated with the length $\Delta x_1$ of a side extending from the vertex $P_1$ in the x direction and the length $\Delta y_1$ of a side extending therefrom in the y direction. For the other quadrangle, the formational position thereof is designated with the coordinates of a vertex $P_2$, and the dimensions thereof are designated with the length $\Delta x_2$ of a side extending from the vertex $P_2$ in the x direction and the length $\Delta y_2$ of a side extending therefrom in the y direction. In this way, the dimensions and formational position of each quadrangle can be defined with four data items (numerical values). Consequently, the dimensions and formational position of one pixel electrode 107 can be defined with eight data items (numerical values).

Figure 21A:
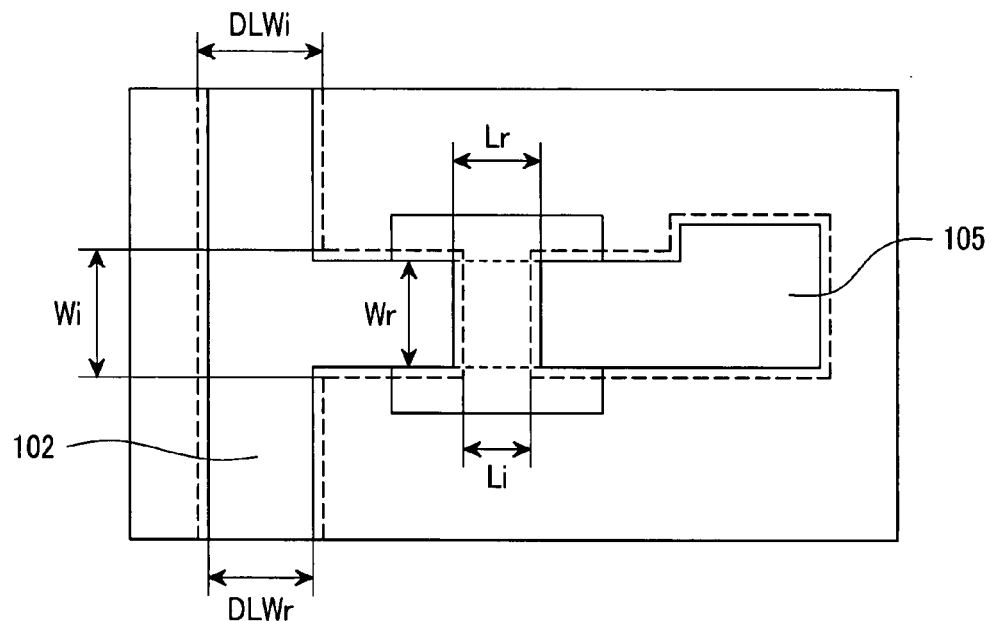
FIG. 21(A) and FIG. 21(B) are illustrative plan views for use in explaining a method of deciding whether correction is needed which is included in the manufacturing method in accordance with the embodiment 1.
Figure 21B:
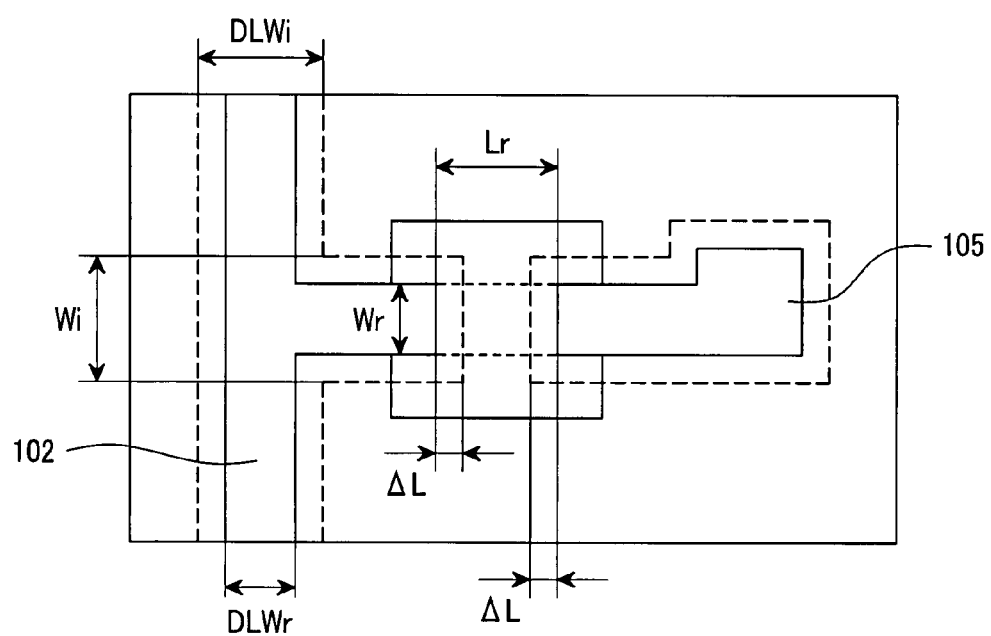
Figure 22:
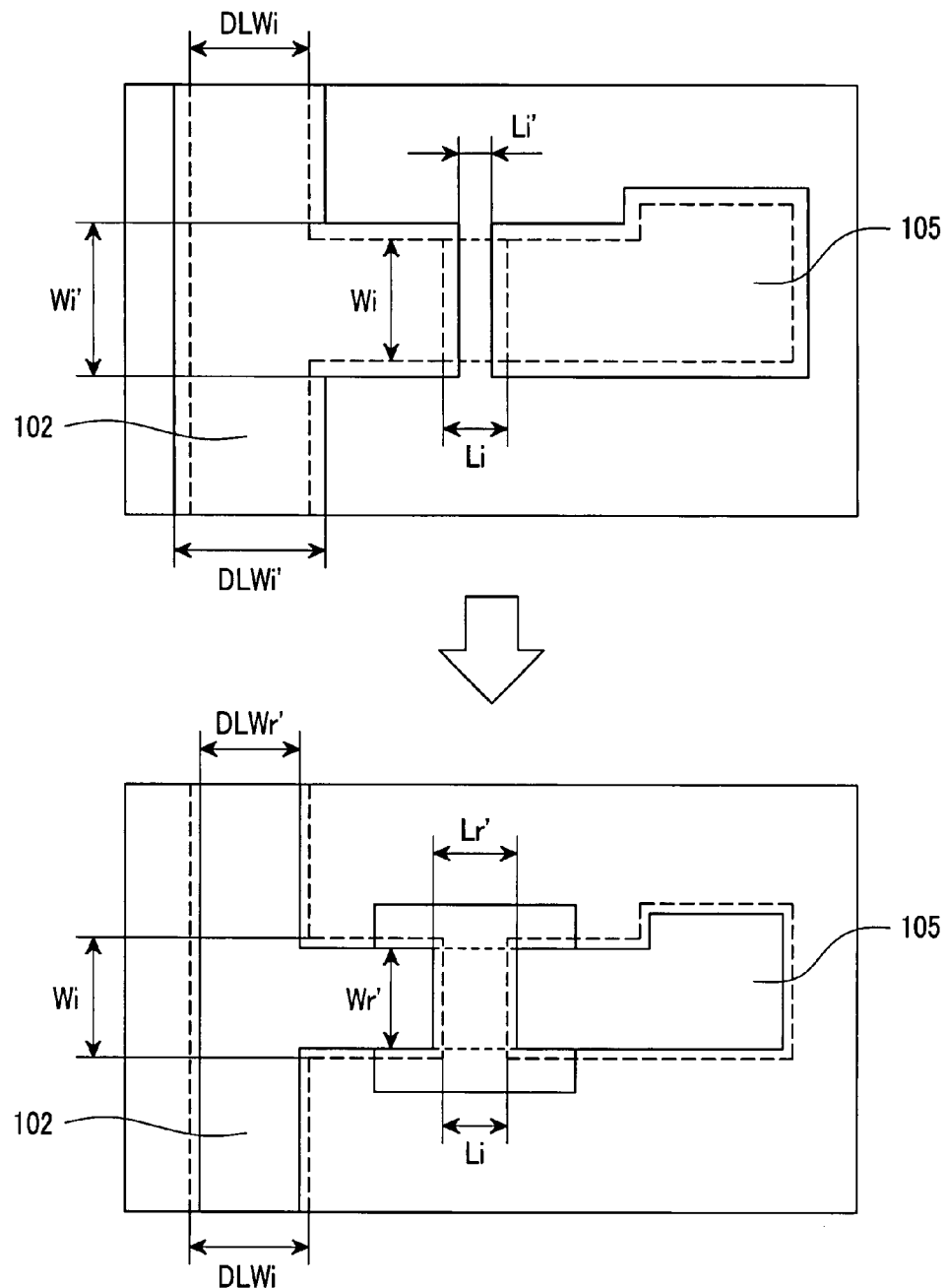
FIG. 22 is an illustrative plan view for use in explaining an example of a method of correcting a design pattern which is included in the manufacturing method in accordance with the embodiment 1.

FIG. 21(A), FIG. 21(B), and FIG. 22 are illustrative diagrams for use in explaining the principles of a correcting method employed in the method of manufacturing the TFT substrate 1 according to the embodiment 1.

FIG. 21(A) and FIG. 21(B) are illustrative plan views for use in explaining a method of deciding whether correction is needed which is employed in the manufacturing method of the embodiment 1. FIG. 22 is an illustrative plan view for use in explaining a method of correcting a design pattern which is employed in the manufacturing method of the embodiment 1.

Incidentally, FIG. 21(A), FIG. 21(B), and FIG. 22 show a drain electrode portion 102D and a source electrode 105, which are included in a TFT element, as an example of components specified in design patterns that can be corrected according to the manufacturing method of the embodiment 1. Moreover, FIG. 21(A) shows a case where correction is not needed and FIG. 21(B) shows a case where correction is needed, in tandem respectively.

In the method of manufacturing the TFT substrate 1 according to the embodiment 1, for example, the exposing means 601 (direct-drawing exposure equipment) shown in FIG. 9 and FIG. 10 is used to draw exposure patterns on a photosensitive resist film. Thereafter, the development apparatus 11 develops the resist film to produce etching resists. The etching apparatus 12 etches a thin film formed under the etching resists so as to produce thin-film patterns that reflect respective design patterns.

In the method of manufacturing the TFT substrate 1 according to the embodiment 1, for example, when the video signal lines 102, drain electrode portions 102D, and source electrodes 105 are formed, a photosensitive resist film is exposed based on respective design patterns in which the dimensions and formational positions of the video signal lines 102, drain electrode portions 102D, and source electrodes 105 are designated according to a method shown in FIG. 14 or FIG. 19. At this time, the dimensions of an actually formed video signal line 102, drain electrode portion 102D, and source electrode 105 are, for example, as shown in FIG. 21(A). In FIG. 21(A), actually formed patterns are indicated with solid lines, and the design patterns are indicated with dashed lines. The width DLWr of the major linear portion 102M of the actually formed video signal line 102 is nearly equal to the width DLWi of the major linear portion 102M designated in the design pattern.

Moreover, the dimensions of the actually formed drain electrode portion 102D and those of the actually formed source electrode 105 are nearly equal to the dimensions designated in the respective design patterns. Consequently, the channel width Wr of an actually formed TFT element and the channel length Lr thereof are nearly equal to the channel width Wi and channel length Li of the TFT element designated in the design pattern.

However, when the video signal lines 102, drain electrode portions 102D, and source electrodes 105 are formed by performing etching, the width DLWr of the major linear portion 102M of an actually formed video signal line 102 may be, as shown in FIG. 21(B), smaller than the width DLWi of the major linear portion 102M designated in the design pattern. In FIG. 21(B), actually formed patterns are indicated with solid lines, and design patterns are indicated with dashed lines. In this case, the dimensions of an actually formed drain electrode portion 102D and those of an actually formed source electrode 105 may be smaller (thinner) than the dimensions designated in the respective design patterns. This phenomenon is referred to as source-drain (SD) thinning. The channel width Wr of an actually formed TFT element is smaller than the channel width Wi of the TFT element designated in the design pattern. The channel length Lr is longer than the channel length Li of the TFT element designated in the design pattern. Consequently, a current value to be written in the TFT element gets smaller. Eventually, insufficient writing of gray-level data takes place.

Moreover, as for the numerous pixel areas formed in one TFT substrate, when the dimensions of actually formed video signal lines 102, drain electrode portions 102D, and source electrodes 105 are measured, pixel areas in which dimensions are, as shown in FIG. 21(A), nearly equal to the dimensions designated in design patterns, and pixel areas in which dimensions are, as shown in FIG. 21(B), smaller than the dimensions designated in design patterns are found to coexist. In this case, when a pixel area like the one shown in FIG. 21(A) and a pixel area like the one shown in FIG. 21(B) exist side by side, inhomogeneity in luminance occurs near the border between the areas.

Further, when one TFT substrate is manufactured, pixel areas in which the SD thinning like the one shown in FIG. 21(B) occurs are not always located at the same positions. Therefore, according to a conventional exposing method using a photo mask, it is very hard to prevent the SD thinning.

On the other hand, the method of manufacturing the TFT substrate 1 according to the embodiment 1 employs exposure dimensions, which are expressed numerically based on design patterns, at the time of exposing a photosensitive resist film. Consequently, once the position on a substrate plane of a pixel area in which SD thinning has occurred and the differences in dimensions are given, data items (numerical values) designated in the design patterns can be readily corrected so that the dimensions of a video signal line 102, drain electrode portion 102D, and source electrode 105 actually formed in the pixel area will be squared with the dimensions designated in the design patterns.

To be more specific, the dimensions of a video signal line 102, drain electrode portion 102D, and source electrode 105, which are formed in a pixel area in which SD thinning has occurred, designated in respective design patterns are, as shown in the upper part of FIG. 22, increased based on the differences between the dimensions of an actually formed video signal line 102, drain electrode portion 102D, and source electrode 105 and the dimensions of the video signal line 102, drain electrode portion 102D, and source electrode 105 designated in the respective design patterns. Incidentally, in the upper part of FIG. 22, uncorrected design patterns are indicated with dashed lines, and corrected design patterns are indicated with solid lines.

In a pixel area in which SD thinning has occurred, the width of the major linear portion 102M designated in the design pattern is corrected to be a width DLWi' on the basis of the difference between the width DLWr of the major linear portion 102M of an actually formed video signal line 102 and the width DLWi of the major linear portion 102M designated in the design pattern. Moreover, based on the channel width Wr and channel length Lr of an actually formed TFT element, and the channel width Wi and channel length Li of a TFT element designated in the design pattern, the dimensions of a drain electrode portion 102D and those of a source electrode 105 are corrected so that the channel width and channel length of the TFT element designated in the design pattern will be squared with the width Wi' and length Li' respectively.

For correction of dimensions designated in a design pattern, for example, data items (numerical values) representing the dimensions and formational position may be rewritten, or data items representing correction values may be appended to the data items (numerical values) representing the dimensions and formational position.

Exposure dimensions numerically expressed based on the design patterns corrected as mentioned above are used to expose the resist film in the pixel area in which SD thinning has occurred. Consequently, the width DLWr' of the major linear portion 102M of an actually formed video signal line 102 is, as shown in the lower part of FIG. 22, nearly equal to the width DLWi of the major linear portion 102M designated in the uncorrected design pattern. In the lower part of FIG. 22, actually formed patterns are indicated with solid lines, and uncorrected design patterns are indicated with dashed lines. Likewise, the dimensions of an actually formed drain electrode portion 102D and those of an actually formed source electrode 105 are nearly equal to those designated in the respective design patterns. Consequently, the channel width Wr' and channel length Lr' of an actually formed TFT element are nearly equal to the channel width Wi and channel length Li of a TFT element designated in the uncorrected design pattern.

Figure 23:
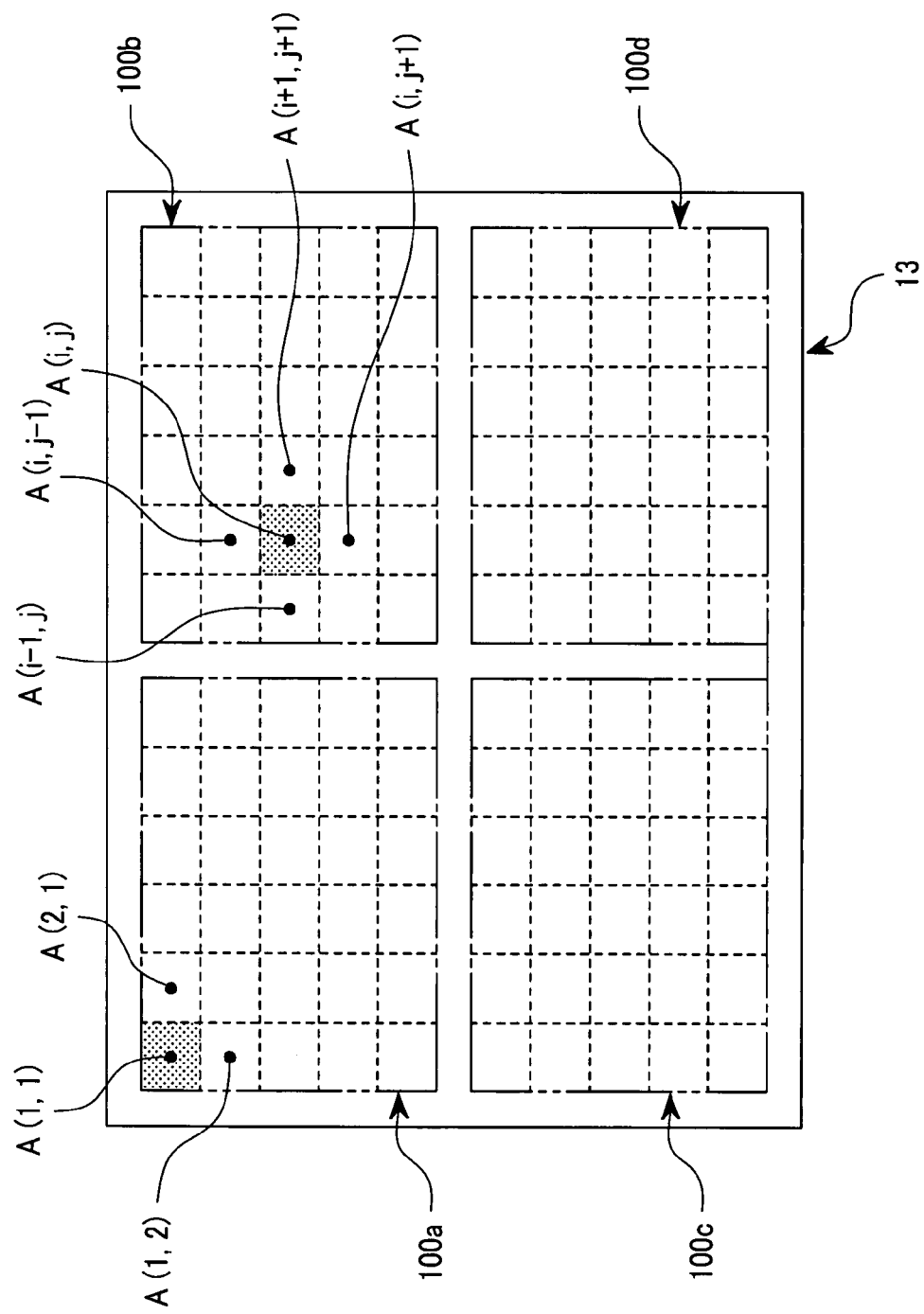
FIG. 23 is an illustrative diagram for use in explaining a concrete example of a method of measuring the dimensions of an actually formed thin-film pattern.

FIG. 23 is an illustrative diagram for use in explaining a concrete example of a method of measuring the dimensions of an actually formed thin-film pattern.

In the method of manufacturing the TFT substrate 1 according to the embodiment 1, in which of pixel areas a phenomenon such as SD thinning occurs is unknown. When the dimensions of an actually formed thin-film pattern are measured, the measurement should preferably be performed in all pixel areas on one TFT substrate 1.

However, since quite a few pixel areas exist in one TFT substrate 1, it takes much time to measure dimensions in all the pixel areas. Moreover, it is rare that a phenomenon such as SD thinning occurs locally in one pixel area. Normally, the phenomenon occurs in multiple pixel areas included in a certain field in the TFT substrate 1. Therefore, when the dimensions of an actually formed thin-film pattern are measured, a thin-film formation surface of one TFT substrate 1 is, for example, divided into multiple subfields. The dimensions of a thin-film pattern measured at a typical point (measurement point) such as in the center of each subfield are regarded as the dimensions commonly measured in the entire subfield containing the measurement point. Thus, the time required for measurement is shortened.

Specifically, assuming that four TFT substrates 1 are cut out of one large-area mother glass 13, each of fields 100a, 100b, 100c, and 100d to be cut out as four TFT substrates is, as shown in FIG. 23, divided into multiple subfields. The dimensions of thin-film patterns formed in the subfield at the left upper corner among the subfields of the left upper field 100a to be cut out as a TFT substrate are regarded to be equal to the dimensions of a thin-film pattern measured at a measurement point A(1,1). When the differences between the dimensions of the thin-film pattern measured at the measurement point A(1,1) and the dimensions designated in the design pattern fall within a permissible range, the dimensions of thin-film patterns in respective pixel areas contained in the subfield at the left upper corner are not corrected. On the other hand, when the differences between the dimensions of the thin-film pattern measured at the measurement point A(1,1)

and the dimensions designated in the design pattern exceed the permissible range, the dimensions of the thin-film patterns in the respective pixel areas contained in the subfield at the left upper corner are comprehensively corrected along with the correction of the dimensions measured at the measurement point A(1,1).

Likewise, the dimensions of thin-film patterns formed in a rightward adjacent subfield are regarded to be equal to the dimensions of a thin-film pattern measured at a measurement point A(2,1). For example, when correction of the dimensions measured at the measurement point A(2,1) is needed, the dimensions of thin-film patterns in respective pixel areas in the subfield containing the measurement point A(2,1) are comprehensively corrected. Moreover, the dimensions of thin-film patterns formed in a downward subfield are regarded to be equal to the dimensions of a thin-film pattern measured at a measurement point A(1,2). For example, when correction of the dimensions measured at the measurement point A(2,1) is needed, the dimensions of thin-film patterns in respective pixel areas in the subfield containing the measurement point A(2,1) are comprehensively corrected.

What counts relative to display panels including a liquid crystal display panel is that inhomogeneity in image quality such as inhomogeneity in luminance should not occur in one display panel. Therefore, when the dimensions of a thin-film pattern are measured in order to decide whether correction is needed, the dimensions of a thin-film pattern actually formed at each measurement point are compared with the dimensions designated in the design pattern. In addition, the dimensions of the actually formed thin-film pattern should preferably be compared with the dimensions of a thin-film pattern actually formed at an adjacent measurement point.

Specifically, whether correction is needed is decided based on the complete dimensions of a thin-film pattern measured at a measurement point A(i,j) in the field 100b that is, as shown in FIG. 23, the right upper part of the mother glass to be cut out as a TFT substrate. In this case, first, the complete dimensions are compared with the dimensions designated in the design pattern. Thereafter, the complete dimensions are compared with the dimensions measured at measurement points A(i,j−1), A(i,j+1), A(i−1,j), and A(i+1,j) in upper, lower, left, and right subfields adjoining the subfield containing the measurement point A(i,j). When the results of the comparison with the dimensions measured at one of the measurement points exceed a permissible range, the dimensions of thin-film patterns in the subfield containing the measurement point A(i,j), which are designated in the design patterns, are comprehensively corrected based on the results of comparison exceeding the permissible range.

The design pattern correction apparatus 9 included in the exposure system shown in FIG. 8 performs measurement of the dimensions (complete dimensions) of an actually formed thin-film pattern, decision on whether correction is needed, and correction of a design pattern whose correction is needed. A procedure of correction to be followed by the design pattern correction apparatus 9 will be described in conjunction with FIG. 24.

Figure 24:
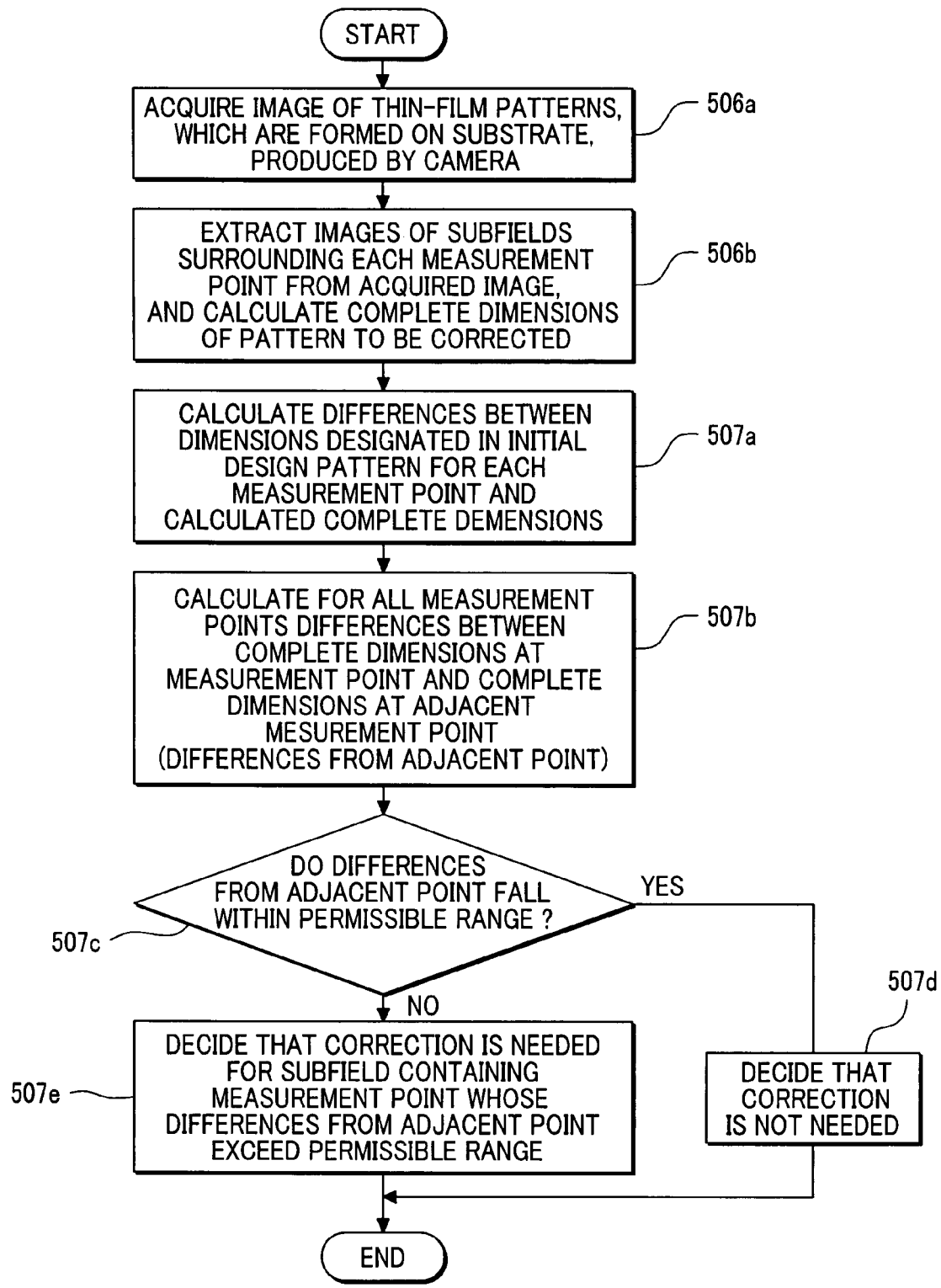
FIG. 24 is a flowchart for use in explaining a procedure of correction to be followed by a design pattern correction apparatus.

FIG. 24 is a flowchart describing a procedure of correction to be followed by the design pattern correction apparatus. Incidentally, the procedure described in FIG. 24 corresponds to the processing of steps 506 and 507 included in the procedure described in FIG. 7.

In the method of manufacturing the TFT substrate 1 according to the embodiment 1, for example, after the etching apparatus 12 etches a thin film to produce thin-film patterns, the complete pattern imaging means 8 included in the exposure system produces an image of the thin-film patterns formed on the glass substrate 100. At this time, as described in FIG. 24, the complete dimensions calculating means 901 included in the design pattern correction apparatus 9 acquires the image produced by the complete pattern imaging means 8 (step 506a).

Thereafter, the complete dimensions calculating means 901 extracts partial images of subfields, which surround each measurement point in a field to be cut out as one TFT substrate 1, from the acquired image, and calculates the complete dimensions of a thin-film pattern to be corrected (step 506b). At step 506b, the calculation may be performed according to any method. However, the method should preferably correspond to the method of designating dimensions and a formational position in a design pattern. Specifically, when the dimensions and formational position in a design pattern are, as shown in FIG. 12 to FIG. 15, designated with two-dimensional coordinates representing the positions of the vertices of a polygon, the two-dimensional coordinates representing the vertices of a formed thin-film pattern are calculated at step 506b. Otherwise, when the dimensions and formational position in a design pattern are, as shown in FIG. 16 to FIG. 20, designated with the two-dimensional coordinates representing the position of one vertex of a polygon, the length of a side extending in an x direction, and the length of a side extending in a y direction, the two-dimensional coordinates representing the position of one vertex of a formed thin-film pattern, the length of a side extending in the x direction, and the length of a side extending in the y direction are calculated at step 506b.

Thereafter, the correction-needed-or-not deciding means 902 calculates the differences between the dimensions designated in an initial design pattern and the complete dimensions calculated at each measurement point at step 506b (step 507a). At step 507a, the initial design pattern is acquired from the design pattern database 701', and the differences from the complete dimensions are calculated.

Thereafter, the correction-needed-or-not deciding means 902 uses the complete dimensions calculated at all measurement points at step 506b to calculate the differences from complete dimensions calculated at an adjacent measurement point (differences from an adjacent measurement point) (step 507b). At step 507b, the differences between the complete dimensions calculated at the measurement point A(i,j) and the complete dimensions calculated at each of measurement points upward, downward, leftward, and rightward adjacent to the measurement point A(i,j) are calculated, and the maximum differences are regarded as the differences from an adjacent measurement point.

Thereafter, the correction-needed-or-not deciding means 902 decides whether the differences of each measurement point from an adjacent measurement point fall within a permissible range (step 507c). If the differences of each measurement point from an adjacent measurement point fall within the permissible range, a decision is made that correction is not needed (step 507d). Moreover, if the differences of any measurement point from an adjacent measurement point exceed the permissible range, a decision is made that correction of a subfield containing the measurement point is needed (step 507e).

After a decision is made at step 507d that correction is not needed, or after a decision is made at step 507e that correction is needed, a decision is, as described in FIG. 7, made on whether correction is needed at any measurement point (step 508). If correction is needed at any measurement point, the design dimensions correcting means 903 corrects the dimensions designated in an initial design pattern on the basis of the differences between the complete dimensions calculated at step 507a and the dimensions designated in the initial design pattern (step 509). If the dimensions designated in design patterns are corrected at step 509, the design dimensions correcting means 903 transmits the corrected design patterns to the design pattern acquiring means 602 included in the exposure apparatus 6.

The exposure apparatus 6 having acquired the corrected design patterns from the design dimensions correcting means 903 calculates new exposure dimensions on the basis of the corrected design patterns, and holds them. Thereafter, when the exposure apparatus 6 exposes a resist film, the exposure apparatus uses the exposure dimensions that are numerically expressed based on the corrected design patterns. In this way, a phenomenon, for example, SD thinning can be readily prevented.

At step 509, correction may be performed to, for example, add halves of the differences of each measurement point from an adjacent measurement point to the dimensions designated in a design pattern. Moreover, for correction, the numerical values designated in an initial design pattern may be rewritten or numerical values representing magnitudes of correction may be added to the numerical values designated in the initial design pattern.

As described above, according to the method of manufacturing the TFT substrate 1 according to the embodiment 1, the exposure apparatus that exposes a resist film according to numerically expressed exposure dimensions is used to compare the dimensions of each actually formed thin-film pattern with the dimensions designated in an associated design pattern. The dimensions (numerical values) in a design pattern relevant to an area in which correction is needed are corrected. Consequently, the variances of the dimensions of a thin-film pattern formed in each pixel area on one TFT substrate 1 can be readily minimized. Eventually, inhomogeneity in image quality in a display field on one liquid crystal display panel can be readily minimized.

In the embodiment 1, every time a thin-film pattern is formed, the complete dimensions are measured. A decision is made on whether correction of the dimensions (numerical values) in an associated design pattern is needed. The present invention is not limited to this mode. Alternatively, after thin-film patterns on some layers are successively formed, the complete dimensions of each of the thin-film patterns on the respective layers may be measured. A decision may then be made on whether correction of the dimensions (numerical values) in a design pattern associated with each of the thin-film patterns is needed.

In the embodiment 1, a decision is made on whether correction of the dimensions of each thin-film pattern is needed. The present invention is not limited to this mode. Alternatively, the positional relationship between two thin-film patterns representing different capabilities may be measured. If a positional deviation exceeds a permissible range, a position at which one of the thin-film patterns is formed may be corrected.

Further, in the embodiment 1, the TFT substrate 1 in which each pixel area has the structure shown in FIG. 4 to FIG. 6 is taken for instance. The present invention is not limited to the structure. The pixel area may have any other structure.

Embodiment 2

FIG. 25 to FIG. 32 are illustrative diagrams for use in explaining the principles of a TFT substrate manufacturing method in accordance with the embodiment 2 of the present invention.

Figure 25:
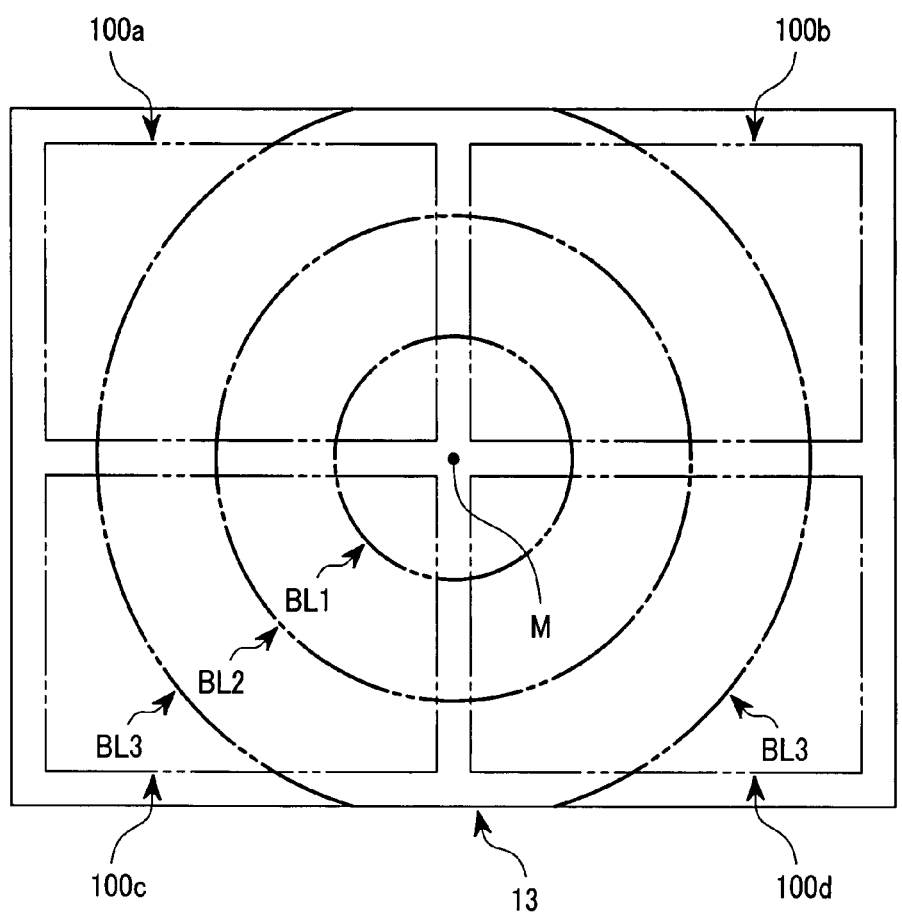
FIG. 25 is an illustrative plan view showing an example of a film thickness distribution observed when a conductive film is formed on a mother glass.
Figure 26:
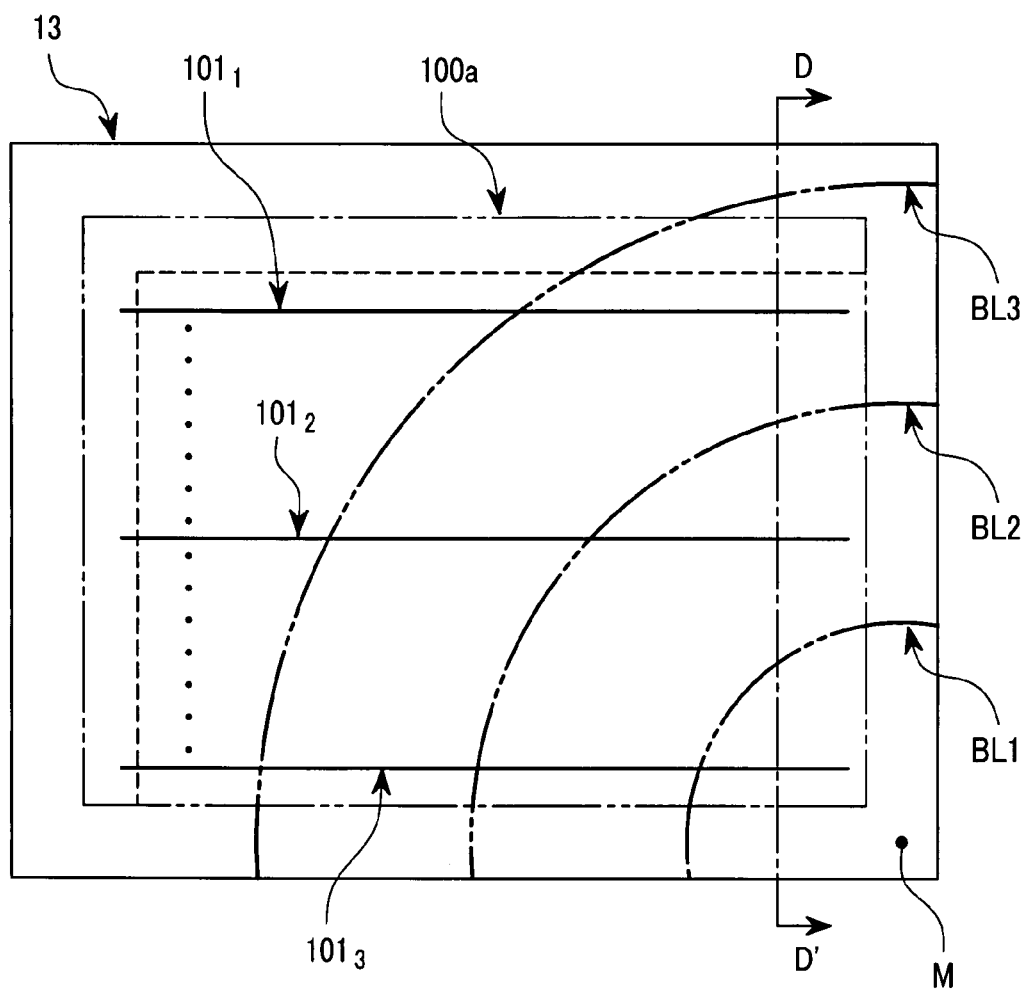
FIG. 26 is an enlarged plan view of a TFT substrate formation field shown in the left upper part of FIG. 25.
Figure 27:
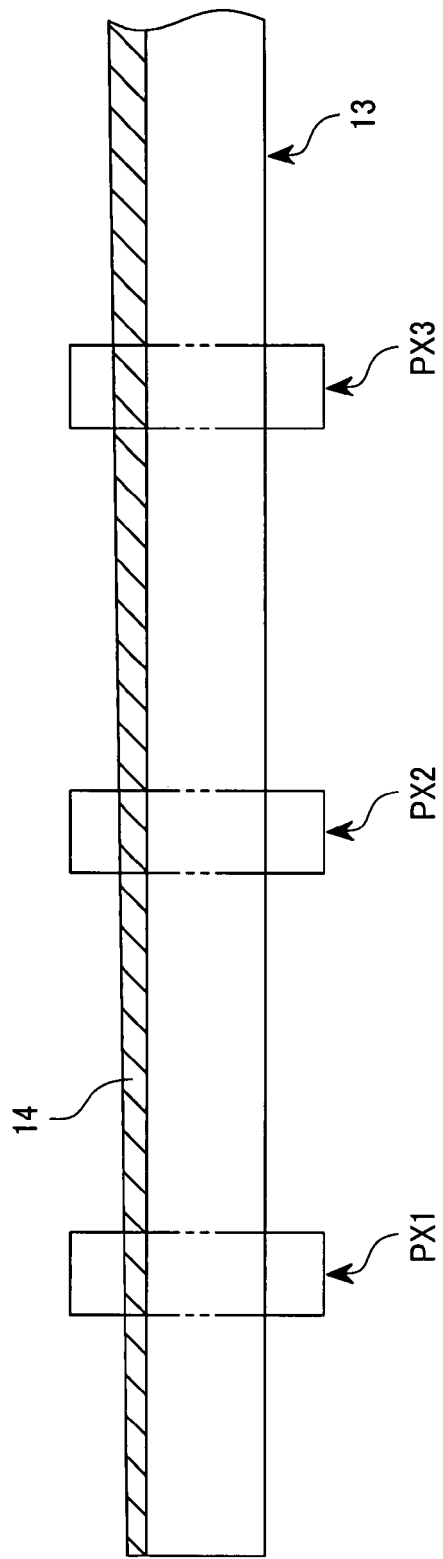
FIG. 27 is an illustrative sectional view of a plane indicated with a D-D' cutting-plane line shown in FIG. 26.
Figure 28:
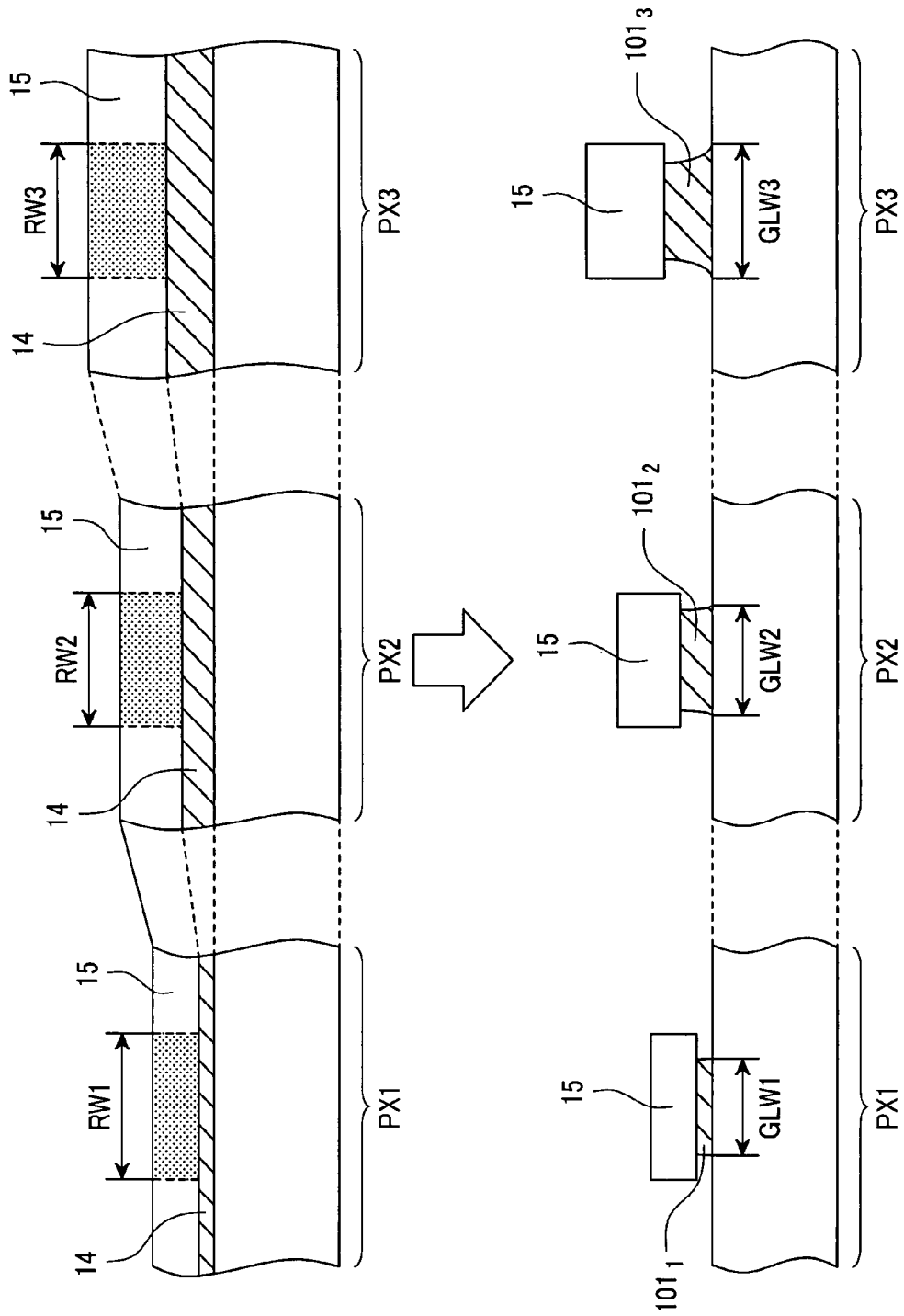
FIG. 28 is an illustrative sectional view showing a scene where areas PX1, PX2, and PX3 shown in FIG. 27 are cut out and a conductive film is etched according to a conventional method.
Figure 29:
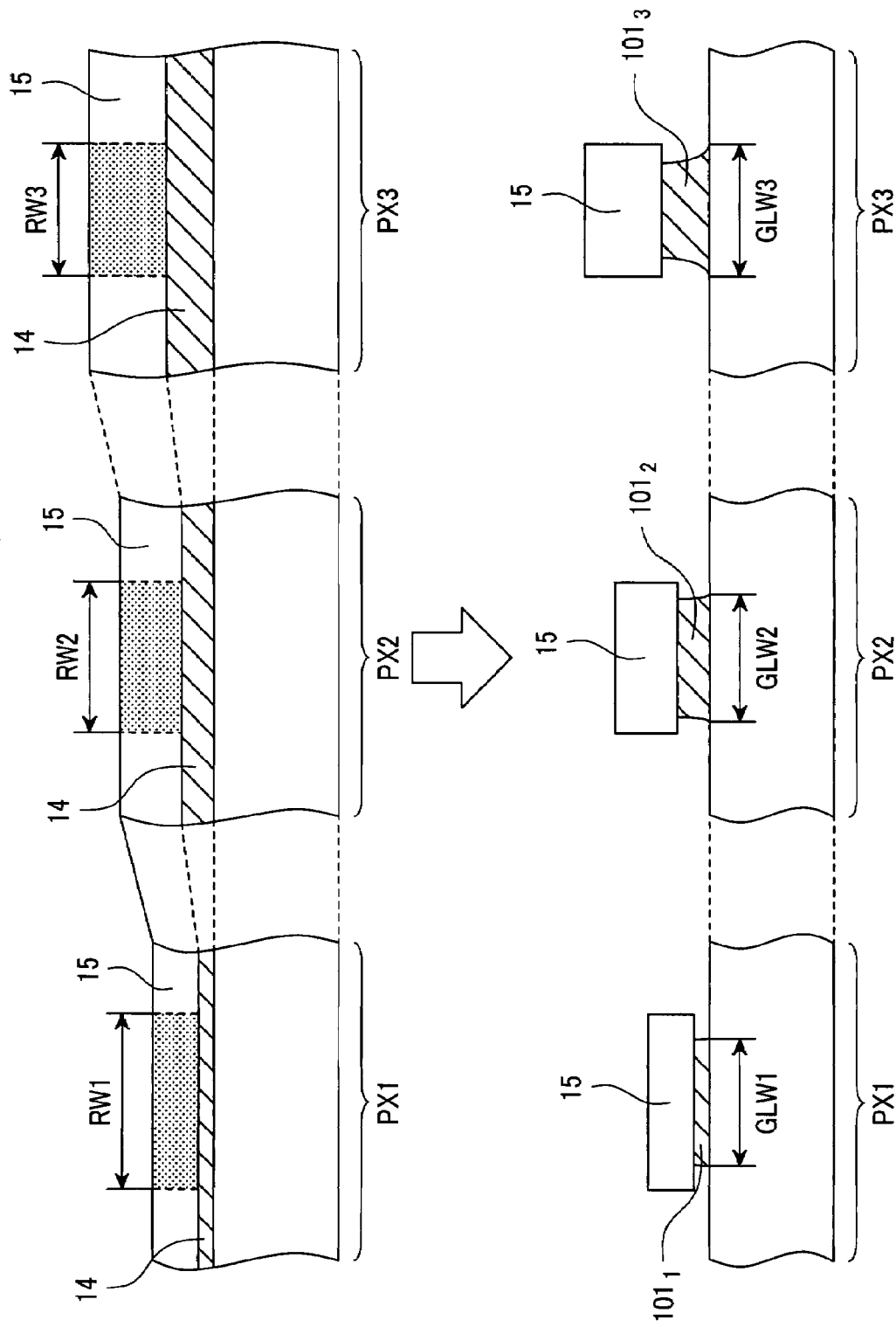
FIG. 29 is an illustrative sectional view showing a scene where the areas PX1, PX2, and PX3 shown in FIG. 27 are cut out and the conductive film is etched according to the manufacturing method of the embodiment 1.
Figure 30:
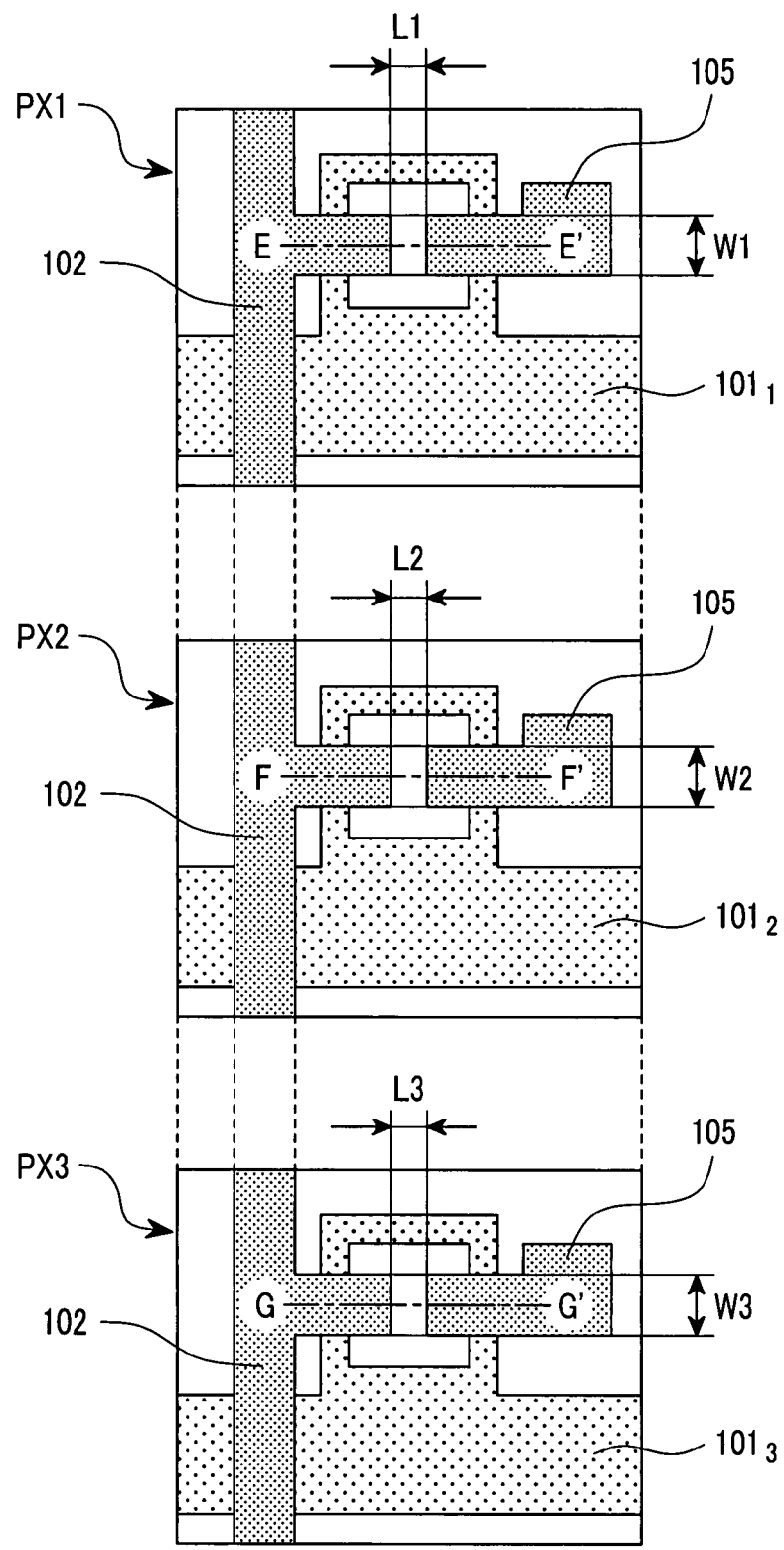
FIG. 30 is an illustrative plan view showing the dimensions of TFT elements in the respective areas PX1, PX2, and PX3 shown in FIG. 27 which are obtained by employing the manufacturing method of the embodiment 1.
Figure 31:
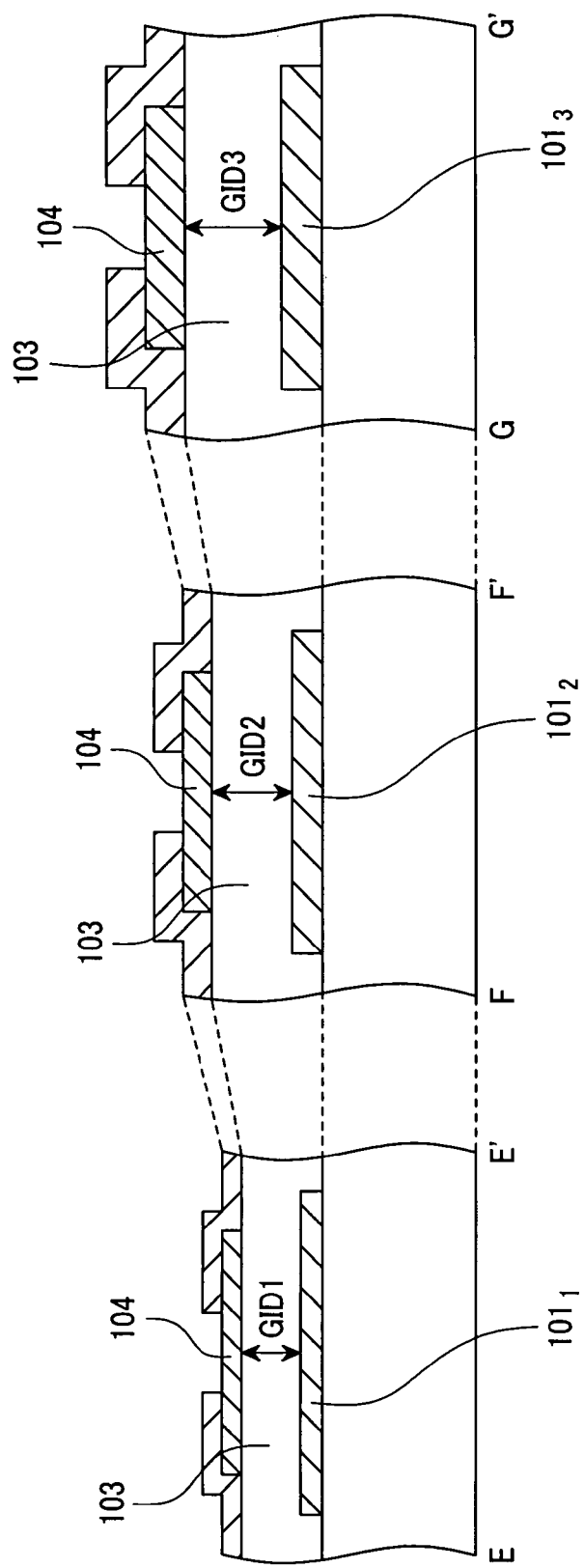
FIG. 31 is an illustrative sectional view having sectional views, which show planes indicated with E-E', F-F', and G-G' cutting-plane lines shown in FIG. 30, juxtaposed sideways.
Figure 32:
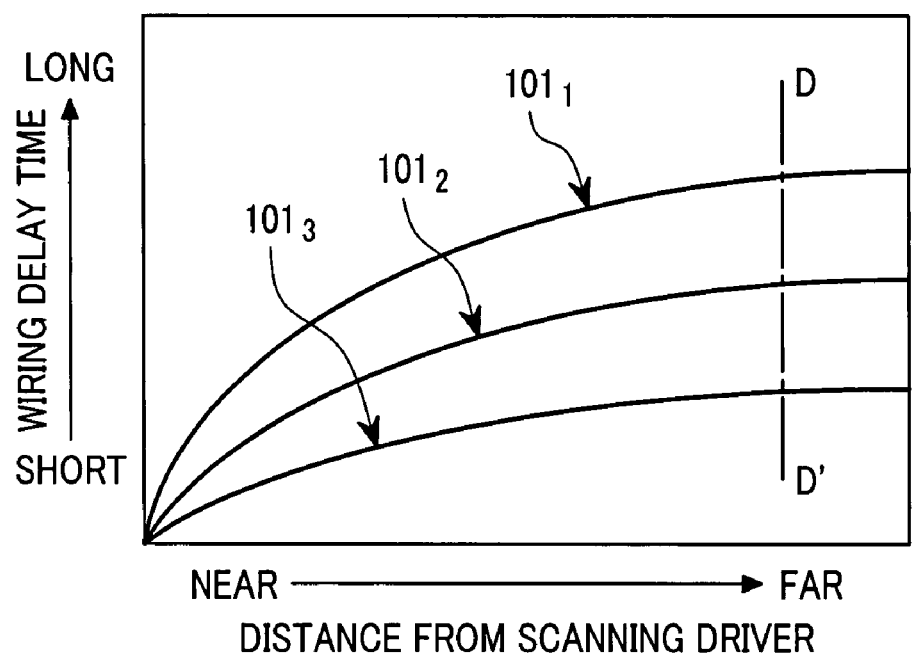
FIG. 32 is an illustrative diagram for use in explaining a variance in a wiring delay time occurring in the TFT substrate formation field shown in the left upper part of FIG. 25.

FIG. 25 is an illustrative plan view showing an example of a film thickness distribution observed when a conductive film is formed on a mother glass. FIG. 26 is an enlarged plan view of a TFT substrate formation field shown in the left upper part of FIG. 25. FIG. 27 is an illustrative sectional view of a plane indicated with a D-D' cutting-plane line shown in FIG. 26. FIG. 28 is an illustrative sectional view showing a scene where areas PX1, PX2, and PX3 shown in FIG. 27 are extracted and the conductive film is etched according to a conventional method. FIG. 29 is an illustrative sectional view showing a scene where the areas PX1, PX2, and PX3 shown in FIG. 27 are extracted and the conductive film is etched according to the manufacturing method in accordance with the embodiment 1. FIG. 30 is an illustrative plan view showing the dimensions of TFT elements in a case where the areas PX1, PX2, and PX3 shown in FIG. 27 are extracted and the manufacturing method in accordance with the embodiment 1 is applied. FIG. 31 is an illustrative sectional view in which the sectional views of planes indicated with E-E', F-F', and G-G' cutting-plane lines shown in FIG. 30 are juxtaposed sideways. FIG. 32 is an illustrative view for use in explaining a variance in a wiring delay time occurring in a TFT substrate formation field shown in the left upper part of FIG. 25.

In the method of manufacturing the TFT substrate 1 according to the embodiment 1, for example, after a conductive film (thin film) formed on the glass substrate 100 is etched to form the scanning signal lines 101, the dimensions (complete dimensions) of the major linear portion 101M of each scanning signal line 101 and the dimensions of each gate electrode portion 101G thereof are measured, and the dimensions (numerical values) designated in associated design patterns are corrected if necessary.

However, in the embodiment 1, the planar dimensions of the major linear portion 101M of each actually formed scanning signal line 101 and the planar dimensions of each gate electrode portion 101G thereof are measured, and corrected if necessary. In the method of manufacturing the TFT substrate 1 according to the embodiment 1, a design pattern is corrected in order to minimize variances of planar dimensions.

However, when the TFT substrate 1 is manufactured, the TFT substrate 1 is formed in multiple portions of a large glass substrate called a mother glass 13. The TFT substrate 1 formation fields are last cut out of the mother glass 13.

Specifically, for example, when four TFT substrates 1 are cut out of one mother glass 13, that is, for so-called four-planes formation, the mother glass 13 has, as shown in FIG. 25, fields 100a, 100b, 100c, and 100d that are cut out as four TFT substrates. Four TFT substrates 1 are manufactured at a time. For example, assuming that a conductive film for producing the scanning signal lines 101 is formed on the mother glass 13, the thickness of the conductive film is expressed using concentric circles BL1, BL2, and BL3 that share the center P of the mother glass 13 as their centers. At this time, the thickness of the conductive film gets smaller stepwise from a zone inside the concentric circle BL1 including the center P through a zone outside the concentric circle BL1 and inside the concentric circle BL2 and a zone outside the concentric circle BL2 and inside the concentric circle BL3 to a zone outside the concentric circle BL3. Even within each zone, the thickness of the conductive film gets smaller along with an increase in a distance from the center P. This is because the conductive film is formed according to, for example, the sputtering method.

Now, when it comes to the field 100a that is the left upper part of the mother glass 13 and cut out as a TFT substrate, the film thickness distribution of the conductive film 14 is, for example, as shown in FIG. 26 and FIG. 27. Assuming that conductive patterns to be formed by etching the conductive film 14 are scanning signal lines 101 which extend in an x direction, what shapes the scanning signal lines 101 formed in three areas PX1, PX2, and PX3 shown in FIG. 27 assume will be described in conjunction with FIG. 28 and FIG. 29.

In the case of a conventional manufacturing method, when the photosensitive resist film 15 formed on the conductive film 14 is exposed, a photo mask is employed. The widths RW1, RW2, and RW3 of exposed portions of the resist film 15 in the areas PX1, PX2, and PX3 respectively are nearly identical to one another, as shown in the upper part of FIG. 28. When the conductive film 14 is etched by forming etching resists, whose widths are nearly identical to one another, irrespective of the thickness of the conductive film 14, a smaller film thickness provides a larger magnitude of contraction. Consequently, assuming that GLW1, GLW2, and GLW3 denote the respective widths of the scanning signal lines $101_1$, $101_2$, and $101_3$ formed in the areas PX1, PX2, and PX3 respectively, the relationship of GLW1<GLW2<GLW3 is, as shown in the lower part of FIG. 28, established.

In the manufacturing method according to the embodiment 1, when the widths GLW1, GLW2, and GLW3 of the scanning signal lines $101_1$, $101_2$, and $101_3$ respectively formed in the areas PX1, PX2, and PX3 respectively have, as shown in the lower part of FIG. 28, the relationship of GLW1<GLW2<GLW3, a decision is made that correction of the widths of the scanning signal line 101 in the area PX1 and the scanning signal line $101_2$ in the area PX2 is needed. Correction is performed in order to increase the dimensions (widths) of the scanning signal lines 101 in the areas PX1 and PX2 designated in respective design patterns. Thereafter, when the photosensitive resist film formed on the conductive layer 14 is exposed, the widths RW1, RW2, and RW3 of the exposed portions of the resist film 15 in the areas PX1, PX2, and PX3 respectively have the relationship of RW1>RW2<RW3, as shown in the upper part of FIG. 29. Etching resists are thus formed in order to etch the conductive film 14. Consequently, the widths GLW1, GLW2, and GLW3 of the scanning signal lines $101_1$, $101_2$, and $101_3$ respectively formed in the areas PX1, PX2, and PX3 respectively have, as shown in the lower part of FIG. 29, the relationship that the widths GLW1, GLW2, and GLW3 are approximately equal to one another.

However, in the case of the manufacturing method of the embodiment 1, as shown in the lower part of FIG. 29, design patterns are corrected so that the widths of associated scanning signal lines will be nearly equal to one another irrespective of the thickness of the conductive film 14. Consequently, the sectional areas (wiring resistances) of the scanning signal lines $101_1$, $101_2$, and $101_3$ respectively formed in the areas PX1, PX2, and PX3 respectively undergo variances. This may lead to occurrence of inhomogeneity in image quality.

Moreover, in the case of the manufacturing method of the embodiment 1, when TFT elements formed in the areas PX1, PX2, and PX3 respectively are observed on a planar basis, as shown in FIG. 30, channel widths W1, W2, and W3 in the areas PX1, PX2, and PX3 respectively, and channel lengths L1, L2, and L3 in the areas PX1, PX2, and PX3 respectively are nearly equal to one another.

However, when the first insulating film 103 having the capability of the gate insulating film of each TFT element is formed on the mother glass 13, a film thickness distribution similar to that of the conductive film 14 is produced. Assuming that GID1, GID2, and GID3 denote the thicknesses of the portions of the first insulating film 103 formed in the areas PX1, PX2, and PX3 respectively, the relationship of GID1<GID2<GID3 is, as shown in FIG. 31, established. At this time, when the thicknesses GID1, GID2, and GID3 of the first insulating film 103 in the areas PX1, PX2, and PX3 respectively each undergo a large variance, a variance occurs in current values to be written in the TFT elements in the respective areas. This may bring about inhomogeneity in image quality.

Moreover, assuming that the dimensions of thin-film patterns formed in the areas PX1, PX2, and PX3 respectively are, as shown in FIG. 30 and FIG. 31, nearly identical to one another, when the wiring delay times caused by the scanning signal lines $101_1$, $101_2$, and $101_3$ formed in the areas PX1, PX2, and PX3 respectively are calculated, the results shown in FIG. 32 are obtained. Specifically, when the TFT substrate 1 is manufactured according to the manufacturing method of the embodiment 1, as far as the wiring delay times of the scanning signal lines in pixel areas whose distances from a scanning driver are identical to one another are concerned, the wiring delay time in an area in which the thicknesses of the conductive film and insulating film are thinner is longer. Incidentally, a D-D' dot-dash line in FIG. 32 indicates a distance from the scanning driver similarly to a D-D' dot-dash line shown in FIG. 26.

As mentioned above, the method of manufacturing the TFT substrate 1 according to the embodiment 1 is a method for minimizing the variances of two-dimensional dimensions of a thin-film pattern formed in each pixel area which are observed through planar vision of the TFT substrate 1. When a variance in the thickness of a conductive film formed on one TFT substrate 1 gets larger, the electric characteristic of each pixel undergoes a variance. This may bring about inhomogeneity in image quality.

When the TFT substrate 1 is a small-area TFT substrate like the one to be adapted to portable cellular phones or displays of personal digital assistants (PDA), a variance of the electric characteristic of each pixel derived from a variance in a film thickness is limited. Even when the TFT substrate is manufactured according to the manufacturing method of the embodiment 1, a possibility that inhomogeneity in image quality may occur is low. However, when the TFT substrate 1 is a large-area TFT substrate to be adapted to televisions, the variance in the film thickness increases, and the variance of the electric characteristic of each pixel is liable to occur. Consequently, in the case of the large-area TFT substrate 1 to be adapted to televisions, not only the two-dimensional dimensions of an actually formed thin-film pattern but also the film thickness thereof have to be taken into consideration. An associated design pattern should preferably be corrected so that the electric characteristic of each pixel will be consistent with those of the others.

The embodiment 2 will be described by taking for instance a method of manufacturing the TFT substrate 1 in which a design pattern will be corrected so that the electric characteristic of each pixel will be consistent with those of the others. Even in the embodiment 2, the TFT substrate 1 in which each pixel has the structure shown in FIG. 4 to FIG. 6 will be taken as an example of the TFT substrate 1 to be manufactured.

Figure 33:
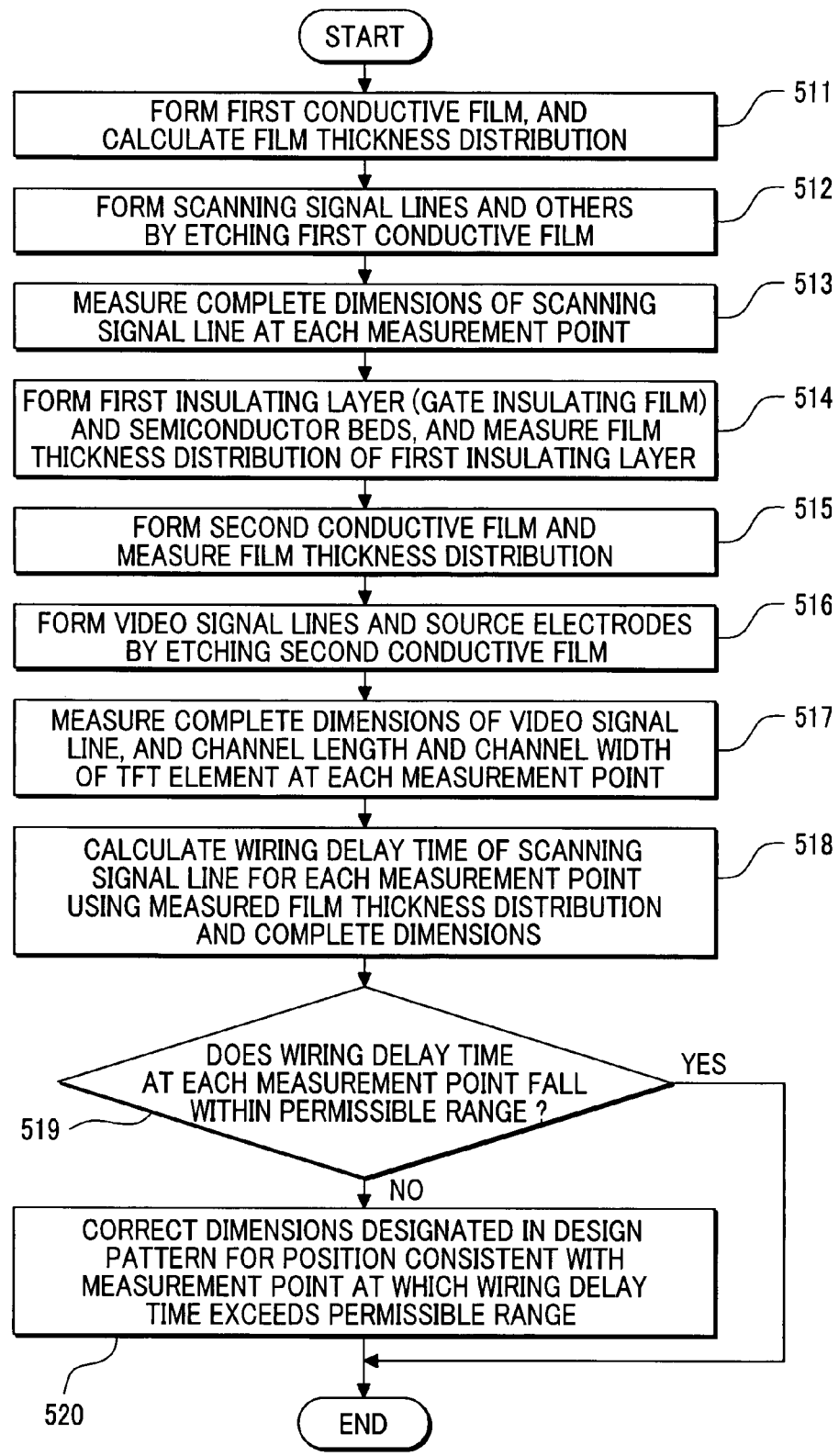
FIG. 33 is a flowchart for use in explaining the outline of a TFT substrate manufacturing method in accordance with an embodiment 2 of the present invention.
Figure 34:
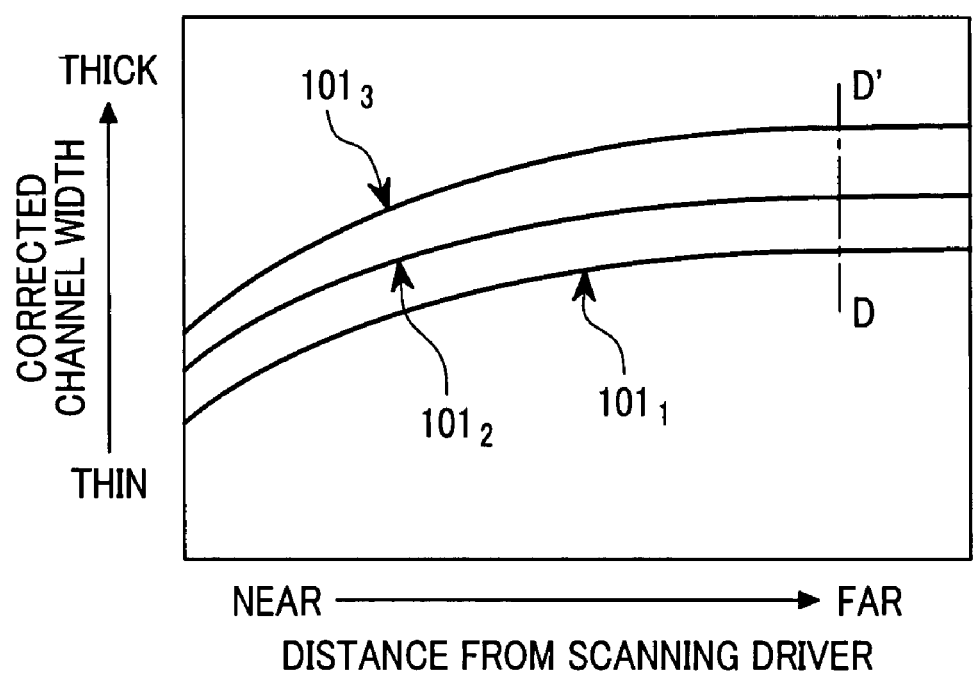
FIG. 34 is an illustrative diagram for use in explaining an example of a correction method for minimizing a variance of a wiring delay time of a scanning signal line.

FIG. 33 is a flowchart describing the outline of the TFT substrate manufacturing method in accordance with the embodiment 2 of the present invention. FIG. 34 is an illustrative diagram for use in explaining an example of a correcting method for minimizing a variance of a wiring delay time of a scanning signal line.

The method of manufacturing the TFT substrate 1 according to the embodiment 2 is, broadly speaking, such that a step of forming a thin film on the glass substrate 100 and a step of etching the formed thin film to form thin-film patterns are repeated in order to layer the scanning signal lines 101 and others.

However, in the embodiment 2, the step of forming conductive patterns such as the scanning signal lines 101 is achieved by, for example, following steps 511 to 520 described in FIG. 33.

At the step of forming thin-film patterns on the glass substrate 100, a first conductive film is first formed on the glass substrate 100 and a film thickness distribution is measured (step 511). At step 511, for example, the sputtering method is adopted in order to form the conductive film all over the surface of the glass substrate 100 on which the conductive patterns are formed. Moreover, the film thickness distribution is measured using, for example, an ellipsometer. The measured film thickness distribution is held in the design pattern correction apparatus 9 included in the exposure system shown in FIG. 8.

Thereafter, the first conductive film formed at step 511 is etched in order to form the scanning signal lines 101 and gate electrode portions 101G (step 512). At step 512, a photosensitive resist film is formed on the first conductive film. The exposure apparatus 6 described in relation to the embodiment 1 is used to expose the resist film. Etching resists resulting from development are used to etch the first conductive film.

Thereafter, the complete dimensions of the major linear portion 101M and gate electrode portion 101G of each scanning signal line 101 are measured at multiple measurement points shown in FIG. 23 (step 513). At step 513, a planar image of the TFT substrate 1 is produced, and subfields surrounding each measurement point are extracted from the image in order to calculate the two-dimensional dimensions in the subfields. The calculated complete dimensions are held in the design pattern correction apparatus 9 included in the exposure system shown in FIG. 8.

Thereafter, the first insulating layer 103 (gate insulating film) and semiconductor beds 104 are formed, and the film thickness distribution of the first insulating layer 103 is measured (step 514). At step 514, after the first insulating layer 103 and semiconductor beds 104 are formed comprehensively, the film thickness distribution of the first insulating layer 103 is measured. The measured film thickness distribution is held in the design pattern correction apparatus 9 includes in the exposure system shown in FIG. 8.

Thereafter, the second conductive film is formed, and the film thickness distribution thereof is measured (step 515). At step 515, the film thickness distribution is measured using, for example, an ellipsometer. The measured film thickness distribution is held in the design pattern correction apparatus 9 included in the exposure system shown in FIG. 8.

Thereafter, the second conductive film is etched in order to form the video signal lines 102 and source electrodes 105 (step 516). At step 516, etching resists are formed in the same manner as those are at step 512, and the second conductive film is etched.

Thereafter, the complete dimensions of the major linear portion 102M and drain electrode portion 102D of each video signal line 102 and the complete dimensions of each source electrode 105 are measured at multiple measurement points shown in FIG. 23, and a channel width and a channel length in each TFT element are measured at the multiple measurement points (step 517). At step 517, a planar image of the TFT substrate 1 is produced, and subfields surrounding each measurement point are extracted from the image in order to calculate the two-dimensional dimensions in the subfields. The calculated complete dimensions are held in the design pattern correction apparatus 9 included in the exposure system shown in FIG. 8.

Thereafter, the film thickness distributions of respective thin films measured at steps 511, 514, and 515 and the complete dimensions of thin-film patterns measured at steps 513 and 517 are used to calculate the wiring delay times of respective scanning signal lines at respective measurement points (step 518).

Thereafter, a decision is made on whether the wiring delay time of a scanning signal line 101 at each measurement point, that is calculated at step 518, falls within a permissible range (step 519). If the wiring delay time exceeds the permissible range at any measurement point, the dimensions designated in a design pattern relevant to an area corresponding to a subfield containing the measurement point are corrected (step 520). At step 520, the channel width of a TFT element at a measurement point at which the gate insulating film (first insulating film 103) is thin is decreased or corrected so that a current value to be written will get smaller. In other words, assuming that the wiring delay times of three scanning signal lines $101_1$, $101_2$, and $101_3$ calculated at step 518 are plotted, for example, as shown in FIG. 32, at step 520, the dimensions (numerical values) designated in design patterns are corrected so that the channel widths of TFT elements disposed along the scanning signal line $101_1$ whose wiring delay time is long will be decreased and the channel widths of TFT elements disposed along the scanning signal line $101_3$ whose wiring delay time is short will be increased, as shown in FIG. 34. Incidentally, a D-D' dot-dash line in FIG. 34 indicates the same distance from a scanning driver as the D-D' dot-dash line in FIG. 26 does.

Incidentally, for correction of the channel width of a TFT element, the width of a drain electrode portion 102D of a video signal line 102 is corrected.

Figure 35:
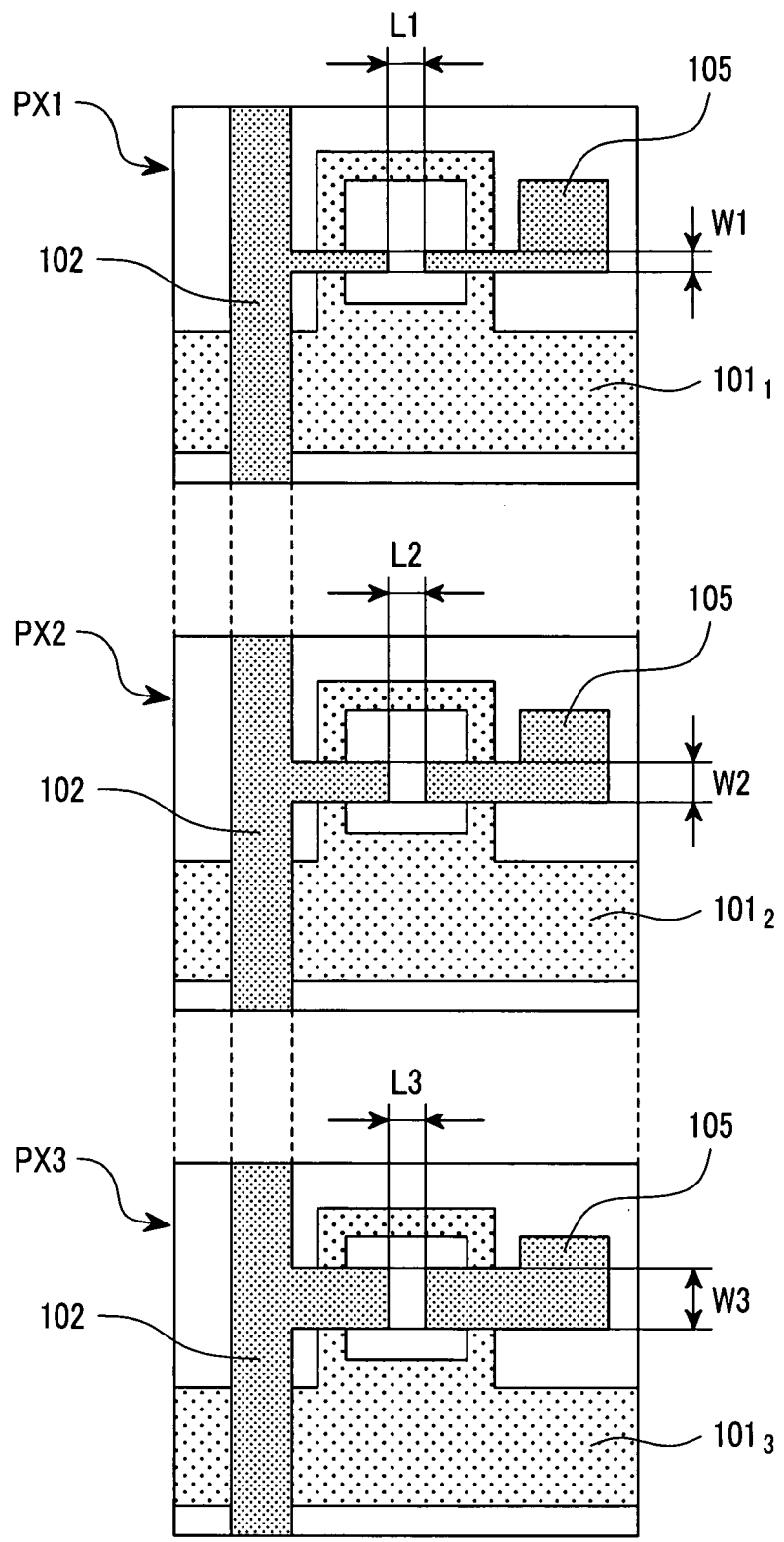
FIG. 35 is illustrative diagram showing on a planar basis TFT elements formed in areas PX1, PX2, and PX3 respectively after design patterns are corrected according to the procedure described in FIG. 33.

FIG. 35 is an illustrative diagram showing TFT elements formed in the areas PX1, PX2, and PX3 respectively after their design patterns are corrected according to the procedure described in FIG. 33.

When the manufacturing method of the embodiment 2 is adopted, if the dimensions of TFT elements formed in the areas PX1, PX2, and PX3 respectively are as shown in FIG. 30 and FIG. 31, the dimensions in the design patterns designating the channel widths of the TFT elements are corrected. When the dimensions in the design patterns designating the channel widths of the TFT elements are corrected, the exposure apparatus 6 exposes a resist film using exposure dimensions numerically expressed based on the corrected design patterns. Consequently, the channel widths and channel lengths of the TFT elements formed in the areas PX1, PX2, and PX3 respectively come to be, for example, as shown in FIG. 35. Specifically, the channel width W1 of the TFT element in the area PX1 in which the gate insulating film is thin is decreased in order to increase a current value to be written. The channel width W3 of the TFT element in the area PX3 in which the gate insulating film is thick is increased in order to increase a current value to be written. Thus, a variance of a current value to be written in a TFT element in each area can be minimized, and insufficient writing of gray-level data can be prevented. Inhomogeneity in image quality (inhomogeneity in luminance) in a display field on one liquid crystal display panel can be readily minimized.

Figure 36:
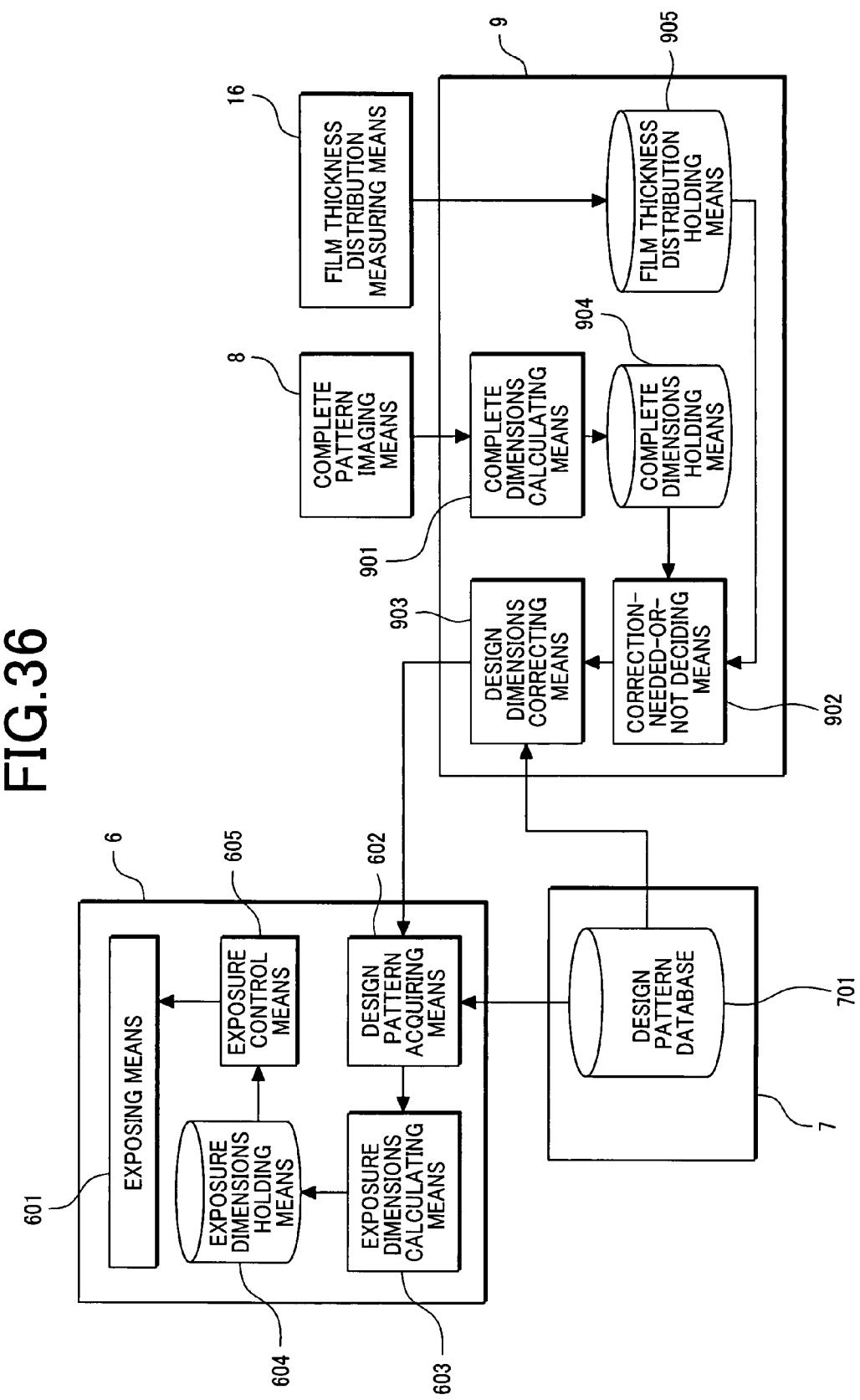
FIG. 36 is an illustrative block diagram showing an example of the configuration of an exposure system employed in the TFT substrate manufacturing method in accordance with the embodiment 2.

FIG. 36 is an illustrative block diagram showing an example of the configuration of an exposure system employed in the TFT substrate manufacturing method in accordance with the embodiment 2.

The fundamental configuration of the exposure system employed in the TFT substrate manufacturing method in accordance with the embodiment 2 is nearly identical to that of the exposure system described in relation to the embodiment 1. The embodiment 2 requires a means (apparatus) for measuring the film thickness of a thin-film pattern. The exposure system relevant to the embodiment 2 has, for example, the configuration shown in FIG. 36.

Specifically, the exposure system relevant to the embodiment 2 includes an exposure apparatus 6, a design pattern holding apparatus 7, a complete pattern imaging means 8, a design pattern correction apparatus 9, and a film thickness distribution measuring means 16. Among the components, the exposure apparatus 6, design pattern holding apparatus 7, and complete pattern imaging means 8 are identical to those described in relation to the embodiment 1. An iterative description will be omitted.

Moreover, the film thickness distribution measuring means 16 is a measurement apparatus, for example, an ellipsometer.

Moreover, the design pattern correction apparatus 9 includes, in addition to the complete dimensions calculating means 901, correction-needed-or-not deciding means 902, and design dimensions correcting means 903 described in relation to the embodiment 1, for example, a complete dimensions holding means 904 for temporarily holding calculated complete dimensions, and a film thickness distribution holding means 905 for temporarily holding a measured film thickness distribution.

In the exposure system shown in FIG. 36, the complete pattern imaging means 8 and film thickness distribution measuring means 16 are shown to be apparatuses independent of the design pattern correction apparatus 9. The present invention is not limited to this configuration. Alternatively, the complete pattern imaging means 8 and film thickness distribution measuring means 16 may be incorporated in the design pattern correction apparatus 9.

Figure 37:
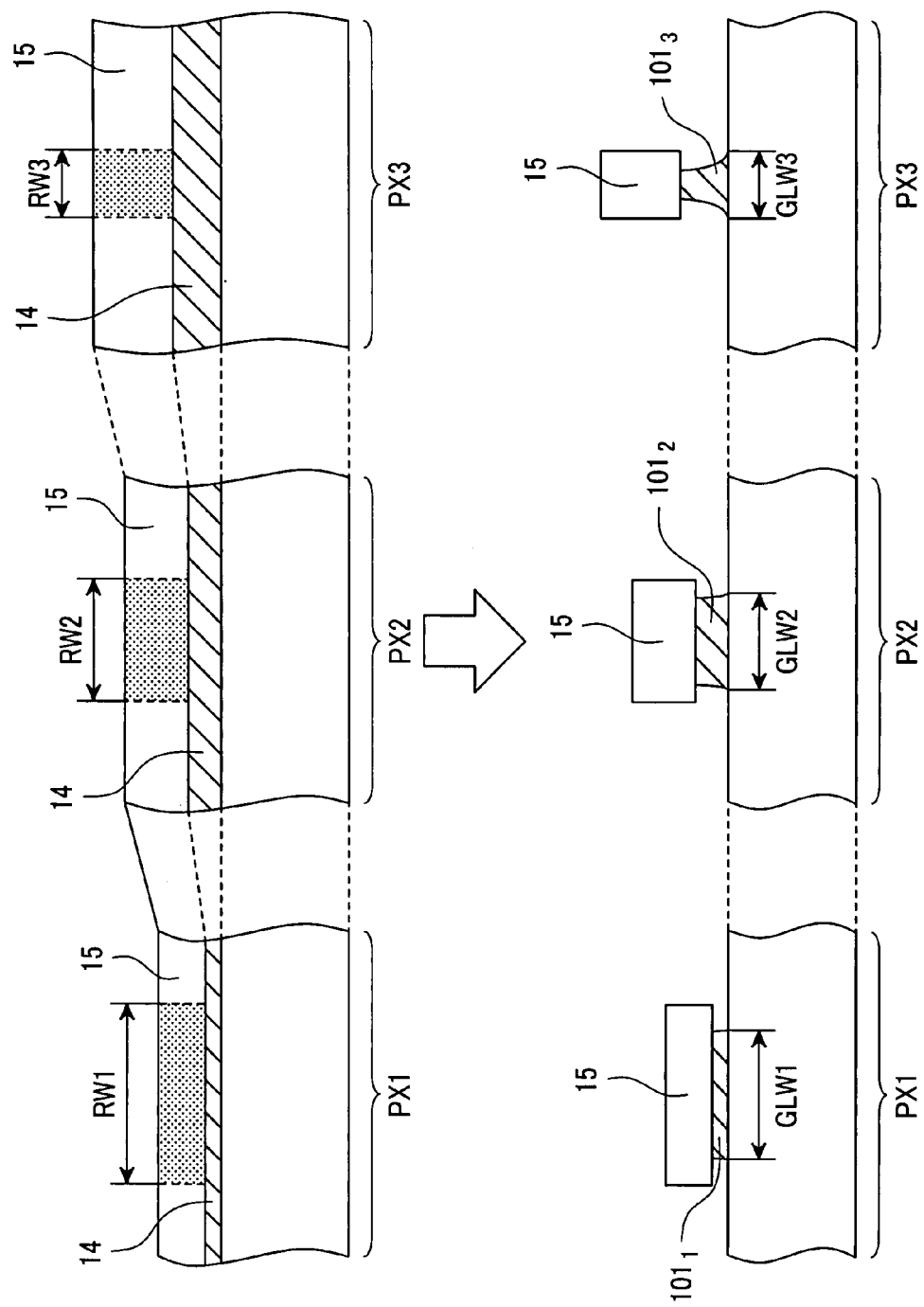
FIG. 37 is an illustrative sectional view for use in explaining an applied example of the method of manufacturing a TFT substrate 1 in accordance with the embodiment 2.

FIG. 37 is an illustrative sectional view for use in explaining an applied example of the method of manufacturing the TFT substrate 1 according to the embodiment 2.

As an example of the method of manufacturing the TFT substrate 1 according to the embodiment 2, a method has been described that design patterns are corrected according to the procedure described in FIG. 33 in order to correct, for example, the channel widths of TFT elements so that a variance of the wiring delay time of a scanning signal line can be minimized. However, what counts in the embodiment 2 lies in a point that: not only planar two-dimensional dimensions but also a film thickness is measured; and a variance in an electric characteristic calculated based on the dimensions and film thickness is minimized in order to minimize inhomogeneity in image quality. For minimizing a variance of the wiring delay time of a scanning signal line, the channel widths of TFT elements are corrected. In addition, the width of the scanning signal line 101₁ in the area PX1 in which the conductive film 14 is thin may be increased as shown in FIG. 37. Moreover, the width of the scanning signal line 101₃ in the area PX3 in which the conductive film 14 is thick may be decreased. In other words, even when design patterns are corrected so that the sectional area of a scanning signal line or the product of the width of a scanning signal line by the thickness thereof will be the same among areas, a variance of the wiring delay time of the scanning signal line can be minimized.

As described above, according to the method of manufacturing the TFT substrate 1 of the embodiment 2, the dimensions (numerical value) designated in a design pattern can be corrected based on planar complete dimensions and a film thickness in order to minimize a variance of an electric characteristic of a pixel at each measurement point. Even for manufacture of the TFT substrate 1 to be adapted to large-screen display panels such as displays for televisions or personal computers, a variance in an electric characteristic derived from a film thickness distribution can be readily minimized. Eventually, inhomogeneity in image quality in a display field on one display panel can be readily minimized.

The present invention has been concretely described based on the embodiments. The present invention is not limited to the embodiments but can be modified in various manners without a departure from the gist.

For example, in the embodiments 1 and 2, manufacture of the TFT substrate 1 in which each pixel has the structure shown in FIG. 4 to FIG. 6 is taken for instance. The present invention is not limited to the structure but can be applied to a method of manufacturing a TFT substrate in which each pixel has any other diverse structures.

In the embodiments 1 and 2, the method of manufacturing a TFT substrate to be adapted to a liquid crystal display panel is taken for instance. The present invention is not limited to the TFT substrate but can be applied to a method of manufacturing any of diverse substrates having the same structure as the TFT substrate to be employed in the liquid crystal display panel. An example of the substrate for display panels to which the present invention can be adapted is a TFT substrate for self-luminous display panels employing organic electroluminescence.

What is claimed is:

1. A display panel manufacturing method in which a step of forming a thin film on a substrate and a step of etching the thin film are repeated a plurality of times in order to form on the substrate a plurality of scanning signal lines, a plurality of video signal lines that three-dimensionally intersects the plurality of scanning signal lines with an insulating layer between them, and TFT elements and pixel electrodes each disposed in a pixel area enclosed with two adjacent scanning signal lines and two adjacent video signal lines, the display panel manufacturing method comprising the steps of:

(1) forming a photosensitive resist film on the thin film formed on the substrate;
(2) exposing the resist film using exposure dimensions numerically expressed based on design patterns prepared in advance;
(3) developing the resist film, which is exposed at the second step, so as to form etching resists;
(4) etching the thin film using the etching resists formed at the third step so as to form thin-film patterns that reflect the respective design patterns;
(5) measuring the complete dimensions of the thin-film patterns formed at the fourth step; and
(6) correcting the design patterns on the basis of the complete dimensions of the thin-film patterns measured at the fifth step, wherein after the design patterns are corrected at the sixth step, the resist film is exposed at the second step using exposure dimensions numerically expressed based on the corrected design patterns.

2. The display panel manufacturing method according to claim 1, wherein:
at the second step, the entire area of the resist film is divided into a plurality of microscopic areas;
the plurality of microscopic areas is classified into microscopic areas to be exposed and microscopic areas not to be exposed according to the exposure dimensions; and
among the plurality of microscopic areas, the microscopic areas to be exposed are sequentially or comprehensively exposed.

3. The display panel manufacturing method according to claim 1, wherein the exposure dimensions employed at the second step refer to the dimensions and position of one graphic or each of graphics, which specify an area to be exposed, on the assumption that an area on the resist film to be exposed is represented by one graphic or a combination of graphics.

4. The display panel manufacturing method according to claim 1, wherein:
the complete dimensions of thin-film patterns measured at the fifth step refer to the planar complete dimensions of thin-film patterns formed at a plurality of measurement points on the substrate; and
at the sixth step, the planar dimensions designated in a design pattern are corrected so that the differences between the planar complete dimensions of a thin-film pattern measured at each measurement point and the planar design dimensions designated in the design pattern will be smaller than predetermined values.

5. The display panel manufacturing method according to claim 1, wherein:
the complete dimensions of thin-film patterns measured at the fifth step refer to the planar complete dimensions of thin-film patterns formed at a plurality of measurement points on the substrate; and
at the sixth step, the planar dimensions designated in a design pattern are corrected so that the variances of the planar complete dimensions of a thin-film pattern measured at each measurement point will be smaller than predetermined values.

6. The display panel manufacturing method according to claim 4, wherein the complete dimensions of thin-film patterns measured at the fifth step and the design patterns corrected at the sixth step refer to the planar dimensions of the plurality of scanning signal lines.

7. The display panel manufacturing method according to claim 4, wherein the complete dimensions of thin-film patterns measured at the fifth step and the design patterns corrected at the sixth step refer to the planar dimensions of the plurality of video signal lines.

8. The display panel manufacturing method according to claim 4, wherein the complete dimensions of thin-film patterns measured at the fifth step and the design patterns corrected at the sixth step refer to either or both of the channel widths and channel lengths of the TFT elements.

9. The display panel manufacturing method according to claim 4, wherein the complete dimensions of thin-film patterns measured at the fifth step and the design patterns corrected at the sixth step refer to the planar dimensions of the pixel electrodes.

10. The display panel manufacturing method according to claim 1, wherein:
the complete dimensions of thin-film patterns measured at the fifth step refer to the planar dimensions and film thicknesses of thin-film patterns formed at a plurality of measurement points on the substrate; and
at the sixth step, the planar dimensions designated in a design pattern are corrected so that the difference between an electric characteristic calculated based on the planar complete dimensions and film thickness of a thin-film pattern measured at each measurement point and an electric characteristic obtained from the design pattern will be smaller than a predetermined value.

11. The display panel manufacturing method according to claim 1, wherein:
the complete dimensions of thin-film patterns measured at the fifth step refer to the planar complete dimensions and film thicknesses of thin-film patterns formed at a plurality of measurement points on the substrate; and
at the sixth step, the planar dimensions designated in a design pattern are corrected so that the variance of an electric characteristic calculated based on the planar complete dimensions and film thickness of a thin-film pattern measured at each measurement point will be smaller than a predetermined value.

12. The display panel manufacturing method according to claim 10, wherein:
the planar complete dimensions and film thicknesses of thin-film patterns measured at the fifth step refer to the planar complete dimensions and film thicknesses of the plurality of scanning signal lines; and
at the sixth step, the width of a scanning signal line designated in a design pattern relevant to a measurement point at which the film thickness of the scanning signal line is small is increased, and the width of the scanning signal line designated in a design pattern relevant to a measurement point at which the film thickness of a scanning signal line is large is decreased.

13. The display panel manufacturing method according to claim 10, wherein:
the planar complete dimensions and film thicknesses of thin-film patterns measured at the fifth step refer to the thicknesses of a gate insulating film in the respective TFT elements, and the widths and lengths of channels formed between the drain electrodes of the TFT elements and the source electrodes thereof; and
the sixth step includes: a step of calculating a current value to be written in a TFT element formed at each measurement point on the basis of the film thickness of the gate insulating film in the TFT element, and the width and length of the channel of the TFT element; and a step of correcting either or both of the width and length of the channel of the TFT element, which are designated in the design pattern, according to the calculated current value to be written.

14. The display panel manufacturing method according to claim 10, wherein: the planar complete dimensions and film thicknesses of thin-film patterns measured at the fifth step refer to the planar complete dimensions and film thicknesses of the plurality of scanning signal lines, the planar complete dimensions of the plurality of video signal lines, the film thicknesses of the gate insulating film in the TFT elements, and the channel widths and channel lengths of the TFT elements; and
the sixth step includes: a step of calculating a wiring delay time at each measurement point on the basis of the planar complete dimensions and film thickness of each of the plurality of scanning signal lines, the planar complete dimensions of each of the plurality of video signal lines, the film thickness of the gate insulating film in each TFT element, and the channel width and channel length of the TFT element; and a step of correcting either or both of the channel width and channel length of each TFT element, which are designated in the design pattern, on the basis of the calculated wiring delay time.

15. The display panel manufacturing method according to claim 13, wherein correction of the channel width and channel length of each TFT element designated in the design pattern is achieved by correcting the dimensions of the drain electrode of the TFT element and the dimensions of the source electrode of the TFT element.

16. The display panel manufacturing method according to claim 10, wherein:

the planar complete dimensions and film thicknesses of thin-film patterns measured at the fifth step refer to the dimensions of areas in each of which a scanning signal line or a sustaining capacitance line juxtaposed to the scanning signal line and a pixel electrode overlap on a planar basis, and the film thicknesses of the insulating layer interposed between the plurality of scanning signal lines or sustaining capacitance lines and pixel electrodes; and the sixth step includes: a step of calculating a sustaining capacitance exhibited in each area, in which the scanning signal line or a sustaining capacitance line and the pixel electrode overlap on a planar basis, on the basis of the dimensions of the area, in which the scanning signal line or sustaining capacitance line and the pixel electrode overlap on a planar basis, and the film thickness of the insulating layer interposed between the scanning signal line or sustaining capacitance line and the pixel electrode; and a step of correcting the dimensions of each area, in which the pixel electrode overlaps the scanning signal line or sustaining capacitance line on a planar basis, designated in the design pattern on the basis of the calculated sustaining capacitance.

17. A display panel manufacturing method in which a step of forming a thin film on a substrate of a liquid crystal display panel, in which a liquid crystal is sandwiched between the substrate and an opposite substrate, and a step of etching the thin film are repeated a plurality of times in order to form on the substrate a plurality of scanning signal lines, a plurality of video signal lines that three-dimensionally intersects the plurality of scanning signal lines with an insulating layer between them, and TFT elements and pixel elements each disposed in a pixel area enclosed with two adjacent scanning signal lines and two adjacent video signal lines, the display panel manufacturing method comprising the steps of:

(1) forming a photosensitive resist film on the thin film formed on the substrate;

(2) exposing the resist film using exposure dimensions numerically expressed based on design patterns prepared in advance;

(3) developing the resist film, which is exposed at the second step, so as to form etching resists;

(4) etching the thin film using the etching resists formed at the third step so as to form thin-film patterns that reflect the respective design patterns;

(5) measuring the complete dimensions of the thin-film patterns formed at the fourth step; and (6) correcting the design patterns on the basis of the complete dimensions of the thin-film patterns measured at the fifth step, wherein: after the design patterns are corrected at the sixth step, the resist film is exposed at the second step using exposure dimensions numerically expressed based on the corrected design patterns.

18. The display panel manufacturing method according to claim 17, wherein: at the second step, the entire area on the resist film is divided into a plurality of microscopic areas; the plurality of microscopic areas is classified into microscopic areas to be exposed and microscopic areas not to be exposed on the basis of the exposure dimensions; and among the plurality of microscopic areas, the microscopic areas to be exposed are sequentially or comprehensively exposed.

19. The display panel manufacturing method according to claim 17, wherein the exposure dimensions employed at the second step refer to the dimensions and position of one graphic or each of graphics, which specify the area to be exposed, on the assumption that an area on the resist film to be exposed is expressed with one graphic or a combination of graphics.

20. The display panel manufacturing method according to claim 17, wherein:

the complete dimensions of thin-film patterns measured at the fifth step refer to the planar complete dimensions of thin-film patterns formed at a plurality of measurement points on the substrate; and at the sixth step, the planar dimensions designated in a design pattern are corrected so that the differences between the planar complete dimensions of a thin-film pattern measured at each measurement point and the planar design dimensions designated in the design pattern will be smaller than predetermined values.

21. The display panel manufacturing method according to claim 17, wherein:

the complete dimensions of thin-film patterns measured at the fifth step refer to the planar dimensions and film thicknesses of thin-film patterns formed at a plurality of measurement points on the substrate; and at the sixth step, the planar dimensions designated in a design pattern are corrected so that the difference between an electric characteristic calculated based on the planar complete dimensions and film thickness of a thin-film pattern measured at each measurement point and an electric characteristic obtained from the design pattern will be smaller than a predetermined value.

22. The display panel manufacturing method according to claim 17, wherein:

the complete dimensions of thin-film patterns measured at the fifth step refer to the planar complete dimensions and film thicknesses of thin-film patterns formed at a plurality of measurement points on the substrate; and at the sixth step, the planar dimensions designated in a design pattern are corrected so that the variance of an electric characteristic calculated based on the planar complete dimensions and film thickness of a thin-film pattern measured at each measurement point will be smaller than a predetermined value.

* * * * *